United States Patent
Yeon et al.

(10) Patent No.: US 10,770,436 B2
(45) Date of Patent: *Sep. 8, 2020

(54) LIGHT-EMITTING DIODE (LED) DEVICE

(71) Applicant: Samsung Electronics Co., Ltd., Suwon-si, Gyeonggi-do (KR)

(72) Inventors: Ji-hye Yeon, Cheongju-si (KR); Wan-tae Lim, Suwon-si (KR); Young-soo Park, Yongin-si (KR); Jung-sub Kim, Hwaseong-si (KR); Jin-sub Lee, Suwon-si (KR); Ha-nul Yoo, Goyang-si (KR); Hye-seok Noh, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/662,714

(22) Filed: Oct. 24, 2019

(65) Prior Publication Data

US 2020/0066689 A1 Feb. 27, 2020

Related U.S. Application Data

(63) Continuation of application No. 16/178,025, filed on Nov. 1, 2018, now Pat. No. 10,497,683, which is a
(Continued)

(30) Foreign Application Priority Data

Feb. 26, 2016 (KR) .................. 10-2016-0023628

(51) Int. Cl.
*H01L 33/50* (2010.01)
*H01L 25/075* (2006.01)
*H01L 33/60* (2010.01)

(52) U.S. Cl.
CPC .......... *H01L 25/0753* (2013.01); *H01L 33/50* (2013.01); *H01L 33/504* (2013.01); *H01L 33/60* (2013.01)

(58) Field of Classification Search
CPC ..... H01L 25/0753; H01L 33/38; H01L 33/46; H01L 33/50; H01L 33/502; H01L 33/504; H01L 33/60
See application file for complete search history.

(56) References Cited

U.S. PATENT DOCUMENTS 6,372,608 B1  4/2002  Shimoda et al.
6,645,830 B2  11/2003  Shimoda et al.
(Continued)

FOREIGN PATENT DOCUMENTS

CN  102709451 A  10/2012
CN  102723410 A  10/2012
(Continued)

OTHER PUBLICATIONS

Chinese Office Action dated Jan. 19, 2020 for corresponding Chinese Application No. 201710126385.
(Continued)

*Primary Examiner* — Stephen W Smoot
(74) *Attorney, Agent, or Firm* — Harness, Dickey & Pierce, P.L.C.

(57) ABSTRACT

A light-emitting diode (LED) device configured to provide a multi-color display includes a plurality of light-emitting cells at least partially defined by a partition layer. The LED device may be configured to reduce optical interferences between the light-emitting cells. The LED device includes a plurality of light-emitting structures spaced apart from one another; a plurality of electrode layers on respective first surfaces of the light-emitting structures, a separation layer configured to electrically insulate the light-emitting struc-
(Continued)

tures from each other; phosphor layers on respective second surfaces of the light-emitting structures and associated with different colors, and a partition layer between the phosphor layers to separate the phosphor layers from one another. Each light-emitting cell may include a separate light-emitting structure, a separate set of one or more electrodes, and a separate phosphor layer.

20 Claims, 41 Drawing Sheets

Related U.S. Application Data continuation of application No. 15/878,720, filed on Jan. 24, 2018, now Pat. No. 10,153,260, which is a continuation of application No. 15/292,332, filed on Oct. 13, 2016, now Pat. No. 9,905,543.

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,251,528 B2 | 8/2012 | Kim et al. |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,648,380 B2 | 2/2014 | Kim et al. |
| 8,680,557 B2 | 3/2014 | Shinbori et al. |
| 8,704,260 B2 | 4/2014 | Kim |
| 8,735,931 B2 | 5/2014 | Han et al. |
| 8,766,295 B2 | 7/2014 | Kim |
| 8,809,900 B2 | 8/2014 | Sato et al. |
| 8,829,540 B2 | 9/2014 | Kim et al. |
| 9,112,121 B2 | 8/2015 | Jung et al. |
| 9,123,623 B2 | 9/2015 | Jo et al. |
| 9,182,631 B2 | 11/2015 | Iwata et al. |
| 9,905,543 B2 * | 2/2018 | Yeon ............... H01L 25/0753 |
| 10,153,260 B2 * | 12/2018 | Yeon ............... H01L 25/0753 |
| 10,497,683 B2 * | 12/2019 | Yeon ............... H01L 25/0753 |
| 2009/0108743 A1 | 4/2009 | Kobayashi |
| 2009/0315045 A1 | 12/2009 | Horie |
| 2010/0084629 A1 | 4/2010 | Park et al. |
| 2011/0156575 A1 | 6/2011 | Yu et al. |
| 2013/0029445 A1 | 1/2013 | Kim et al. |
| 2013/0320369 A1 | 12/2013 | Gartner et al. |
| 2014/0225136 A1 | 8/2014 | Kim et al. |
| 2015/0090991 A1 | 4/2015 | Ishii et al. |
| 2015/0203747 A1 | 7/2015 | Haley et al. |
| 2015/0255505 A1 | 9/2015 | Jeoung et al. |
| 2016/0027971 A1 | 1/2016 | Anc |
| 2016/0190105 A1 | 6/2016 | Rhee et al. |
| 2016/0313848 A1 | 10/2016 | Rhee |

FOREIGN PATENT DOCUMENTS

| | | |
|---|---|---|
| CN | 103733243 A | 4/2014 |
| JP | 2013-229559 A | 11/2013 |
| KR | 101039974 B1 | 6/2011 |
| KR | 20150021235 A | 3/2015 |

OTHER PUBLICATIONS

Korean Office Action dated Mar. 13, 2020 for corresponding Korean Application No. 10-2016-0023628.

* cited by examiner

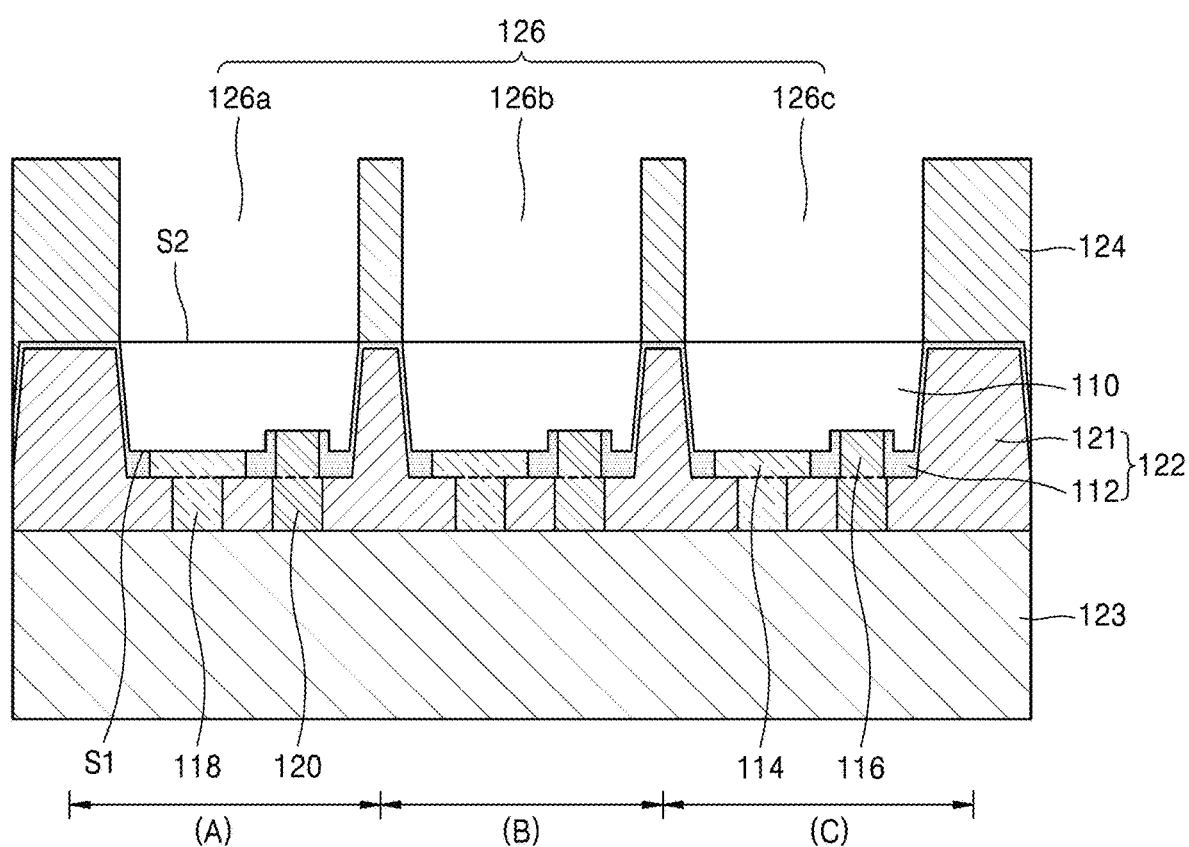

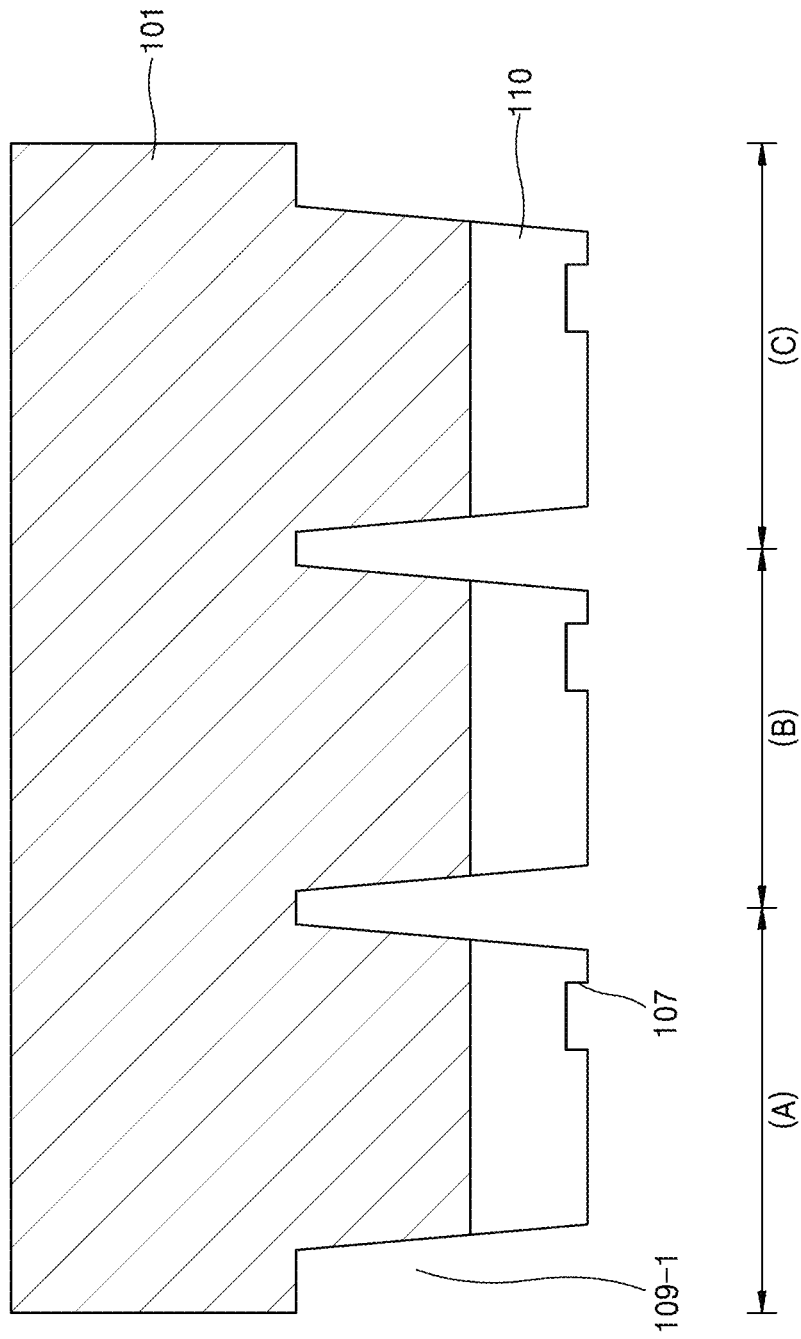

US 10,770,436 B2

LIGHT-EMITTING DIODE (LED) DEVICE

CROSS-REFERENCE TO RELATED APPLICATION

This application is a continuation of U.S. application Ser. No. 16/178,025, filed on Nov. 1, 2018 and which was issued as U.S. Pat. No. 10,497,683 on Dec. 3, 2019, which is a continuation application of U.S. application Ser. No. 15/878,720 filed on Jan. 24, 2018 and which was issued as U.S. Pat. No. 10,153,260 on Dec. 11, 2018, which is a continuation application of U.S. application Ser. No. 15/292,332, which was filed on Oct. 13, 2016 and which was issued as U.S. Pat. No. 9,905,543 on Feb. 27, 2018, which claims priority to and the benefit of, under 35 U.S.C. § 119, Korean Patent Application No. 10-2016-0023628, filed on Feb. 26, 2016, in the Korean Intellectual Property Office, the disclosure of each of which is incorporated herein in its entirety by reference.

BACKGROUND

The inventive concepts relate to a light-emitting diode (LED) device, and more particularly, to a LED device for generating a multi-color display.

If and/or when a plurality of light-emitting diode (LED) devices are mounted on a board substrate, a plurality of colors, that is, multi-colors, may be generated. If and/or when a display device includes pixels comprising LED devices mounted on a board, there is a limit in reducing a size of the display device for improving a resolution thereof. In some cases, it may also be difficult to suppress optical interferences between pixels.

SUMMARY

The inventive concepts provide a light-emitting diode (LED) device that includes a plurality of light-emitting cells configured to generate a multi-color display and reduce optical interferences between the light-emitting cells included in the LED device.

According to some example embodiments of the inventive concepts, a light-emitting diode (LED) device may include a plurality of light-emitting structures spaced apart from each other, each light-emitting structure including a first surface and a second surface; a plurality of electrode layers on first surfaces of separate, respective light-emitting structures of the plurality of light-emitting structures; a separation layer configured to electrically insulate the light-emitting structures from each other; a plurality of phosphor layers on second surfaces separate, respective light-emitting structures of the plurality of light-emitting structure, each phosphor layer configured to filter a different color of light from light emitted by the light-emitting structures; and a partition layer between the phosphor layers, such that the partition layer separates the phosphor layers from each other, the partition layer including at least one of a substrate structure, an insulation structure, and a light reflecting structure.

According some example embodiments of the inventive concepts, an LED device may include a plurality of light-emitting cells spaced apart from each other; a separation layer configured to electrically insulate the light-emitting cells from each other; a plurality of phosphor layers associated with separate, respective light-emitting cells of the plurality of light-emitting cells, the plurality of phosphor layers further associated with different colors, respectively; and a partition layer between the phosphor layers, such that the partition layer separates the phosphor layers from each other, the partition layer including at least one of a substrate structure, an insulation structure, and a light reflecting structure.

According some example embodiments of the inventive concepts, an apparatus may include a plurality of light-emitting cells spaced apart from each other; and a partition layer between separate, respective phosphor layers of the plurality of light-emitting cells, such that the partition layer at least partially defines the plurality of light-emitting cells. Each light-emitting cell may include a light-emitting structure that includes a first surface and a second surface, a set of one or more electrode layers on the first surface of the light-emitting structure, and a phosphor layer on the second surface of the light-emitting structure, the phosphor layer associated with a particular color of light.

BRIEF DESCRIPTION OF THE DRAWINGS

Embodiments of the inventive concepts will be more clearly understood from the following detailed description taken in conjunction with the accompanying drawings in which:

FIGS. 12A-I are sectional views for describing a method of fabricating a LED device according to some example embodiments;

FIGS. 16A-C are sectional views for describing a method of fabricating a LED device according to some example embodiments;

DETAILED DESCRIPTION OF THE EMBODIMENTS

Figure 1:
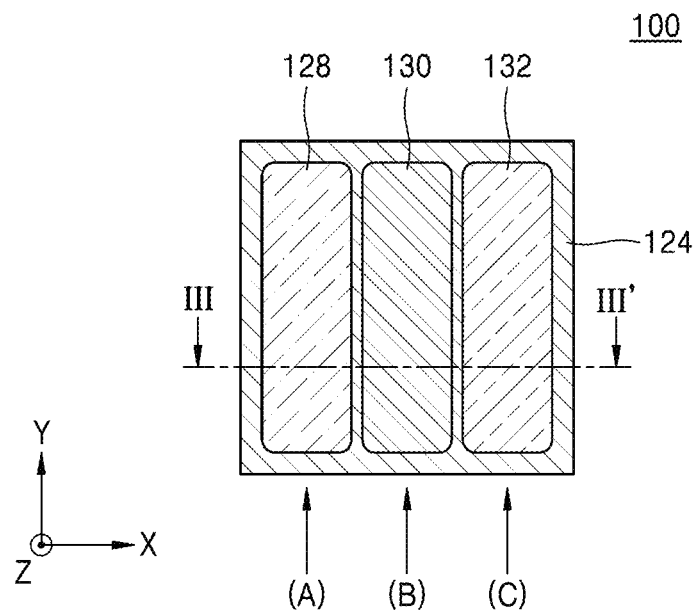
FIGS. 1 and 2 are plan views of a light-emitting diode (LED) device according to some example embodiments.
Figure 2:
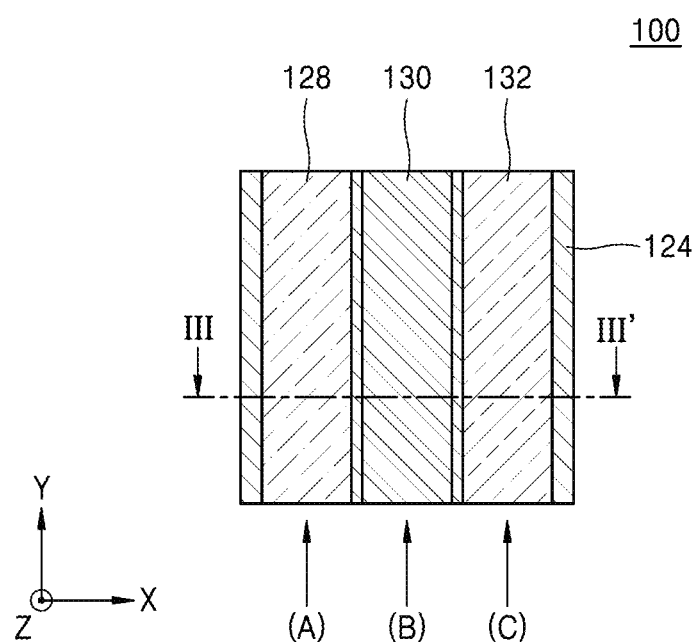
Figure 3:
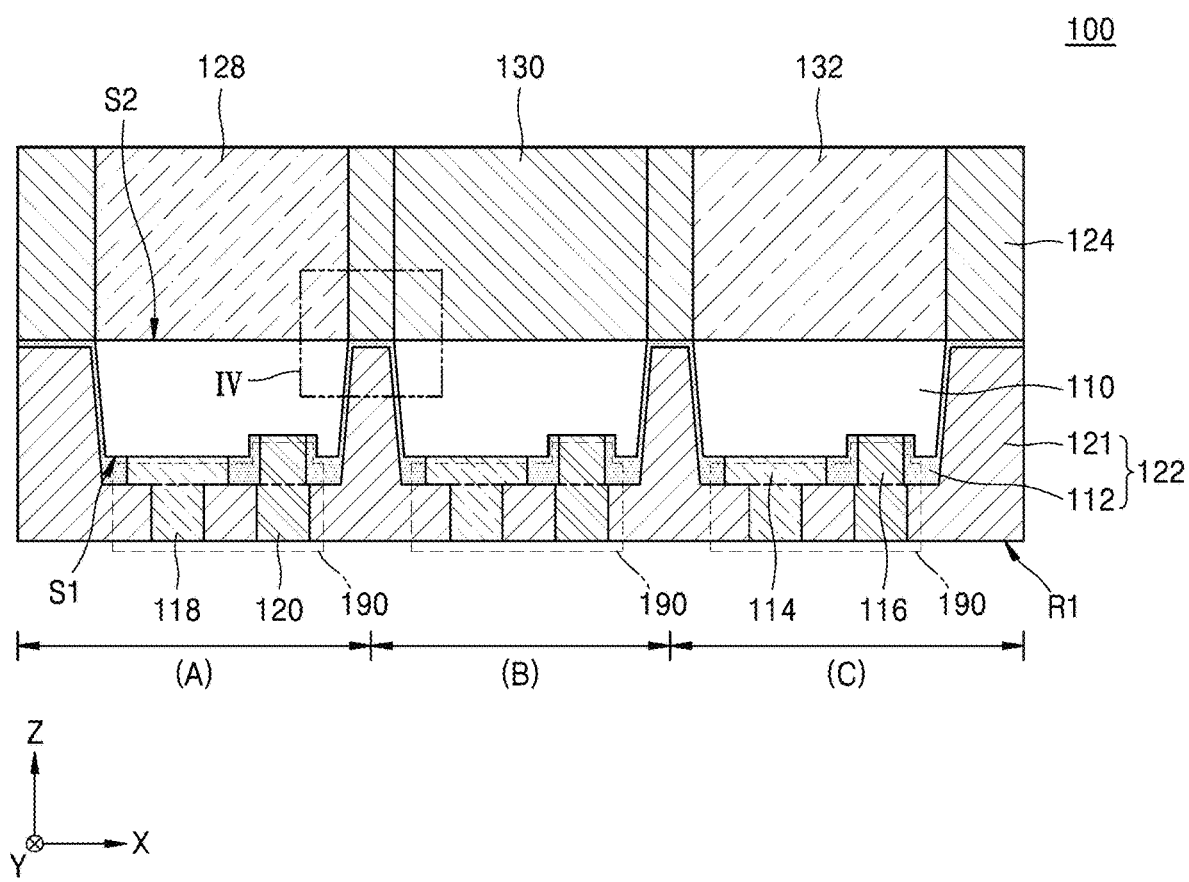
FIG. 3 is a cross-sectional view of portions of the LED device, obtained along a line III-III' of FIGS. 1 and 2.
Figure 4:
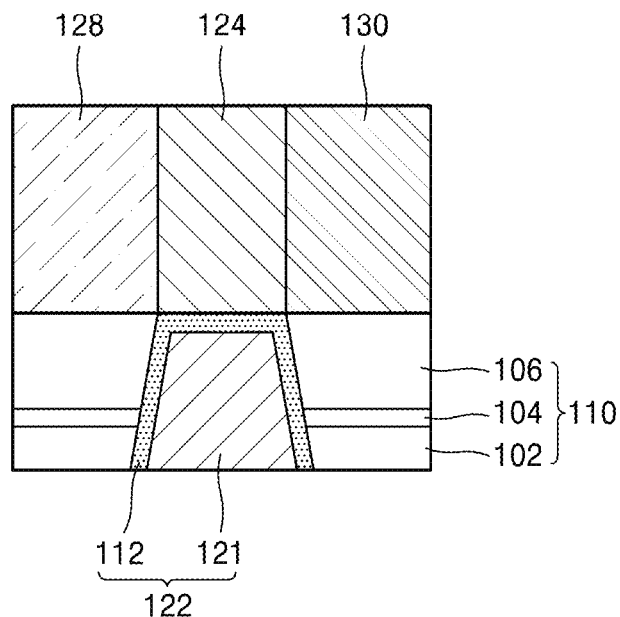
FIG. 4 is an enlarged view of portion IV of FIG. 3.

FIGS. 1 and 2 are plan views of a light-emitting diode (LED) device according to some example embodiments, FIG. 3 is a cross-sectional view of portions of the LED device, obtained along a line III-III' of FIGS. 1 and 2, and FIG. 4 is an enlarged view of portion IV of FIG. 3.

In detail, as shown in FIGS. 1 through 3, the LED device 100 may include a plurality of light-emitting cells A, B, and C, e.g., a first light-emitting cell A, a second light-emitting cell B, and a third light-emitting cell C. Although FIG. 1 through 3 show that the LED device 100 includes the three light-emitting cells A, B, and C for convenience of explanation, the LED device 100 may also include only two light-emitting cells.

In FIGS. 1 and 2, the light-emitting cells A, B, and C may be defined by a partition layer 124 that extends in an x-axis direction and a y-axis direction. The partition layer 124 of FIG. 1 may surround phosphor layers 128, 130, and 132. In FIG. 2, the light-emitting cells A, B, and C may be defined by the portions of the partition layer 124 extending in the y-axis direction. The partition layer 124 may have a substrate structure or an insulation structure and be a single body. The partition layer 124 may be arranged at both sides, in both the x-axis direction and the y-axis direction, of each of the phosphor layers 128, 130, and 132.

As shown in FIG. 3, in the LED device 100, each of the light-emitting cells A, B, and C may include a separate light-emitting structure 110, respectively. As shown in FIGS. 1 and 2, the light-emitting structures 110 may be spaced apart from one another in a direction, e.g., the x-axis direction. Each of the light-emitting cells A, B, and C may include a separate light-emitting structure 110 that is configured to emit ultraviolet light (e.g., light having a wavelength of about 10 nm to about 440 nm) or blue light (e.g., light having a wavelength of about 440 nm to about 495 nm).

As shown in FIG. 4, the light-emitting structure 110 may include a first conductive type semiconductor layer 102, an active layer 104, and a second conductive type semiconductor layer 106. The first conductive type semiconductor layer 102 may be a P-type semiconductor layer. The second conductive type semiconductor layer 106 may be an N-type semiconductor layer. The first conductive type semiconductor layer 102 and the second conductive type semiconductor layer 106 may include a nitride semiconductor, e.g., a GaN/InGaN material. The first conductive type semiconductor layer 102 and the second conductive type semiconductor layer 106 may include a nitride semiconductor, e.g., a material having the composition of $Al_xIn_yGa_{1-x-y}N$, where $0 \leq x \leq 1$, $0 \leq y \leq 1$, and $0\ 1-x-y \leq 1$.

Each of the first conductive type semiconductor layer 102 and the second conductive type semiconductor layer 106 may be embodied as a single layer. In some example embodiments, each of the first conductive type semiconductor layer 102 and the second conductive type semiconductor layer 106 may include a plurality of layers having different properties including at least one of different doping concentration and different composition, respectively. In some example embodiments, the first conductive type semiconductor layer 102 and the second conductive type semiconductor layer 106 may include an AlInGaP-based semiconductor or an AlInGaAs-based semiconductor.

The active layer 104 disposed between the first conductive type semiconductor layer 102 and the second conductive type semiconductor layer 106 may emit light having a certain energy level, according to the recombination of electrons and holes. The active layer 104 may have a multi-quantum well (MQW) structure in which quantum well layers and quantum barrier layers are alternately stacked, e.g., a GaN/InGaN structure, if and/or when the first conductive type semiconductor layer 102 and the second conductive type semiconductor layer 106 include a nitride semiconductor. The active layer 104 may have a single quantum-well (SQW) structure including a nitride semiconductor. The active layer 104 may emit light of at least one of an ultraviolet wavelength and a blue wavelength based on types and compositions of materials at least partially comprising the same.

In the LED device 100, separate sets 190 of one or more electrode layers 118 and 120 may be disposed on a surface S1 of separate, respective light-emitting structures 110. As shown in FIG. 3, a separate set 190 of an electrode layer 118 and an electrode layer 120 may be disposed on a bottom surface S1 of each of the light-emitting structure 110. As shown in FIG. 3, each given light-emitting cell A, B, and C may include a separate set 190 of electrode layers 118 and 120 on the respective light-emitting structure 110 included in the given light-emitting cell.

As further shown in FIG. 3, a separate set 190 of an electrode layer 118 and an electrode layer 120 may be disposed directly on a bottom surface S1 of each of the light-emitting structure 110, such that each set contacts a separate light-emitting structure 110. In some example embodiments, the LED device 100 may be mounted on a board substrate (not shown) in a flip-chip manner.

The electrode layers 118 and 120 may each include a metal. The electrode layers 118 and 120 may include at least one of aluminium (Al), gold (Au), silver (Ag), platinum (Pt), nickel (Ni), chromium (Cr), titanium (Ti), and copper (Cu). The electrode layers 118 and 120 may include a first electrode layer 118 that is electrically connected to the first conductive type semiconductor layer 102 and a second electrode layer 120 that is electrically connected to the second conductive type semiconductor layer 106.

A first reflective layer 114 and a second reflective layer 116 may be further disposed on a first electrode layer 118 and a second electrode layer 120, respectively, in a given set 190. The first reflective layer 114 and the second reflective layer 116 may reflect light emitted by the light-emitting structure 110. The first reflective layer 114 and the second reflective layer 116 may include a highly reflective material, e.g., a metal. The first reflective layer 114 and the second reflective layer 116 may include a common material with respect to a material at least partially comprising the first electrode layer 118 and the second electrode layer 120. The first reflective layer 114 and the second reflective layer 116 may be referred to as electrode layers.

The LED device 100 further includes a separation layer 122 configured to electrically insulate the light-emitting structures 110 from each other. The separation layer 122 may be further configured to electrically insulate the reflective layers 114 and 116 from each other. The separation layer 122 may be further configured to electrically insulate the electrode layers 118 and 120 from each other. The separation layer 122 may include a separating insulation layer 112 on sidewalls and bottom surfaces of the light-emitting structures 110 and a mold insulation layer 121 insulating the electrode layers 118 and 120 from the light-emitting structures 110.

The separating insulation layer 112 may include at least one of a silicon oxide layer and a silicon nitride layer. The mold insulation layer 121 may include at least one of a silicon resin, an epoxy resin, and an acrylic resin. One or more surfaces of the mold insulation layer 121 may overlap one or more surfaces of the light-emitting structure 110. A rear surface R1 of the mold insulation layer 121 may overlap surfaces of the electrode layers 118 and 120. As shown in FIG. 3, a rear surface R1 of the mold insulation layer 121 may be flush with surfaces of the electrode layers 118 and 120. As shown in FIG. 3, a bottom surface (R1) of the mold insulation layer 121 may be flush with the bottom surfaces of the electrode layers 118 and 120.

The separation layer 122 may be disposed at both sides of a given light-emitting structure 110 and below the given light-emitting structure 110, as shown in FIG. 3. The separation layer 122 may electrically separate ("insulate") the light-emitting structures 110 from one another. Thus, the separate, respective light-emitting structures 110 may be individually driven. As shown in the example embodiments illustrated in FIG. 3, the separation layer 122 may separate the light-emitting structures 110 into individual light-emitting cells, e.g., the first light-emitting cell A, the second light-emitting cell B, and the third light-emitting cell C, where each of the light-emitting cells A, B, and C may be individually driven.

In the LED device 100, the plurality of phosphor layers 128, 130, and 132 associated with different colors are disposed on surfaces S2 of the light-emitting structures 110, respectively. As shown in the example embodiments illustrated in FIG. 3, for example, the phosphor layers 128, 130, and 132 are disposed on top surfaces S2 of separate, respective light-emitting structures 110. The phosphor layers 128, 130, and 132 may include a blue phosphor layer 128, a green phosphor layer 130, and a red phosphor layer 132, such that the blue phosphor layer 128 is associated with a blue color (wavelength range) of light, the green phosphor layer 130 is associated with a green color (wavelength range) of light (e.g., light having a wavelength of about 495 nm to about 570 nm), the red phosphor layer 132 is associated with a red color (wavelength range) of light (e.g., light having a wavelength of about 620 nm to about 740 nm), etc.

As shown in FIG. 3, each given light-emitting cell A, B, and C may include a separate phosphor layer 128, 130, 132 on the respective light-emitting structure 110 included in the given light-emitting cell.

Although FIGS. 1 through 3 show the three phosphor layers 128, 130, and 132 as being different from one another, two phosphor layers different from each other may be disposed. The LED device 100 may be configured to implement multi-color displays, as light emitted by the light-emitting structures 110 may pass through the phosphor layers 128, 130, and 132 associated with different colors. A given phosphor layer associated with a given color (wavelength range) may be configured to filter one or more colors (wavelength ranges) from emitted light entering the phosphor layer, such that the filtered light that is emitted from the phosphor layer is the associated color (wavelength range) of light.

If and/or when the LED device 100 includes the three phosphor layers 128, 130, and 132, the LED device 100 may be configured to generate a multi-color display based on the three colors associated with the phosphor layers 128, 130, 132. If and/or when the light-emitting structure 110 emits light having blue wavelength, the LED device 100 may generate a multi-color display based on three colors even if the LED device 100 includes two phosphor layers. Since the LED device 100 may be electrically separated into the respective light-emitting structure 110 and each of the light-emitting structures 110 may be individually driven. Therefore, the LED device 100 may be configured to generate a display that includes various colors as occasions demand.

In the LED device 100, the partition layer 124 is disposed between the phosphor layers 128, 130, and 132 to separate the phosphor layers 128, 130, and 132 from one another. The partition layer 124 is disposed on the separation layer 122 between the light-emitting structures 110. The partition layer 124 may suppress optical interferences between the light-emitting cells A, B, and C. The partition layer 124 may include a material different from the material at least partially comprising the light-emitting structure 110. The partition layer 124 may include a substrate structure. As described above, a substrate structure or an insulation structure at least partially comprising the partition layer 124 may include a single body.

The substrate structure may include a silicon-based substrate structure or an insulation substrate structure. The silicon-based substrate structure may include a silicon substrate or a silicon carbide substrate. The insulation substrate structure may include an insulation substrate containing $MgAl_2O_4$, MgO, $LiAlO_2$, $LiGaO_2$, GaN, AlN, etc. The substrate structure may be referred to as an insulation structure.

The LED device 100 may include the plurality of light-emitting cells A, B, and C and the partition layer 124 that defines the light-emitting cells A, B, and C. Therefore, the LED device 100 may include the plurality of light-emitting cells A, B, and C to implement multi-colors and include the partition layer 124 to suppress optical interferences between the light-emitting cells A, B, and C.

Figure 5:
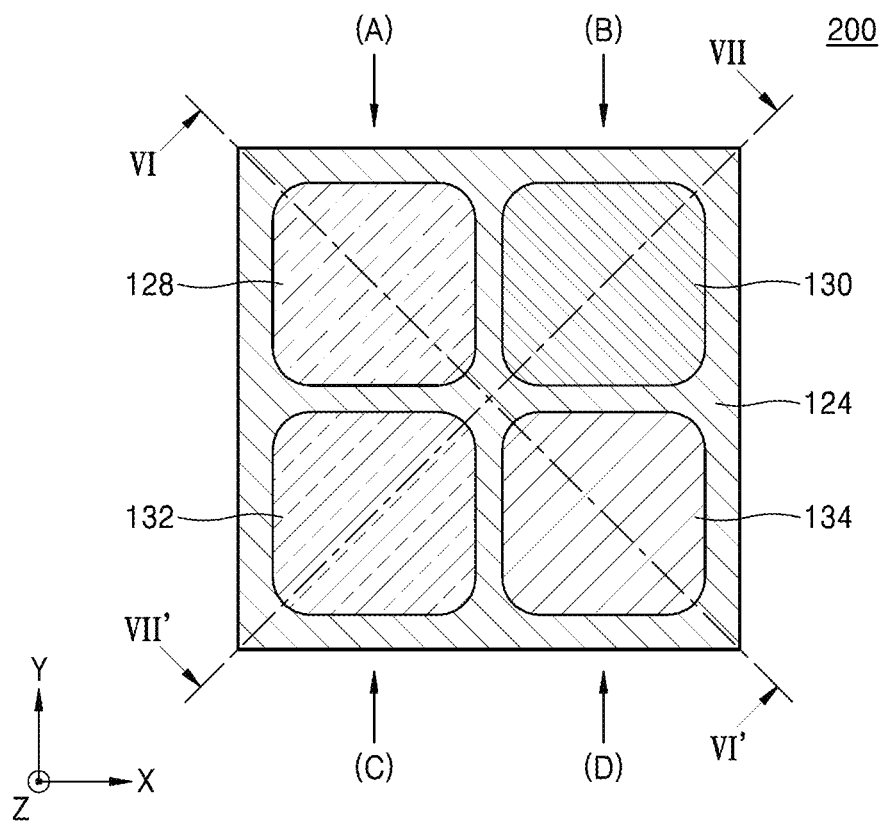
FIG. 5 is a plan view of a LED device according to some example embodiments.
Figure 6:
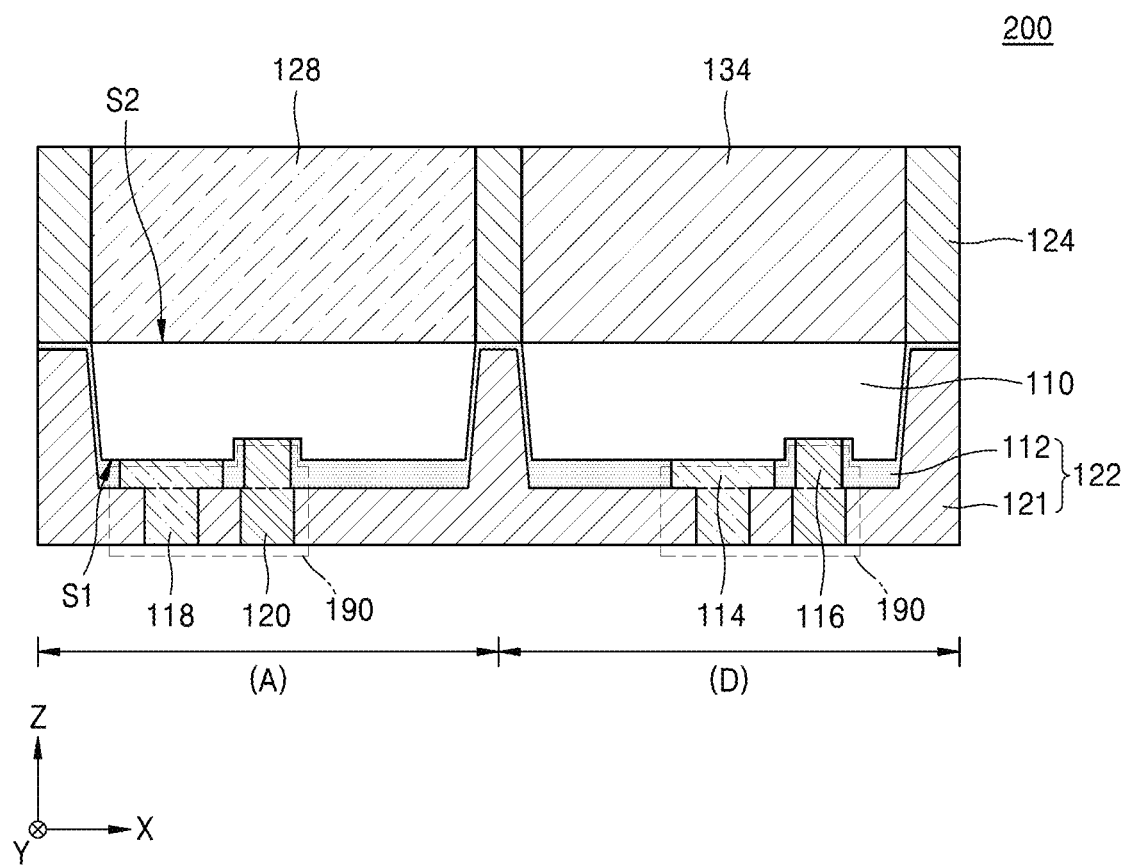
FIG. 6 is a sectional view of one or more portions of the LED device of FIG. 5 along a line VI-VI' of FIG. 5.
Figure 7:
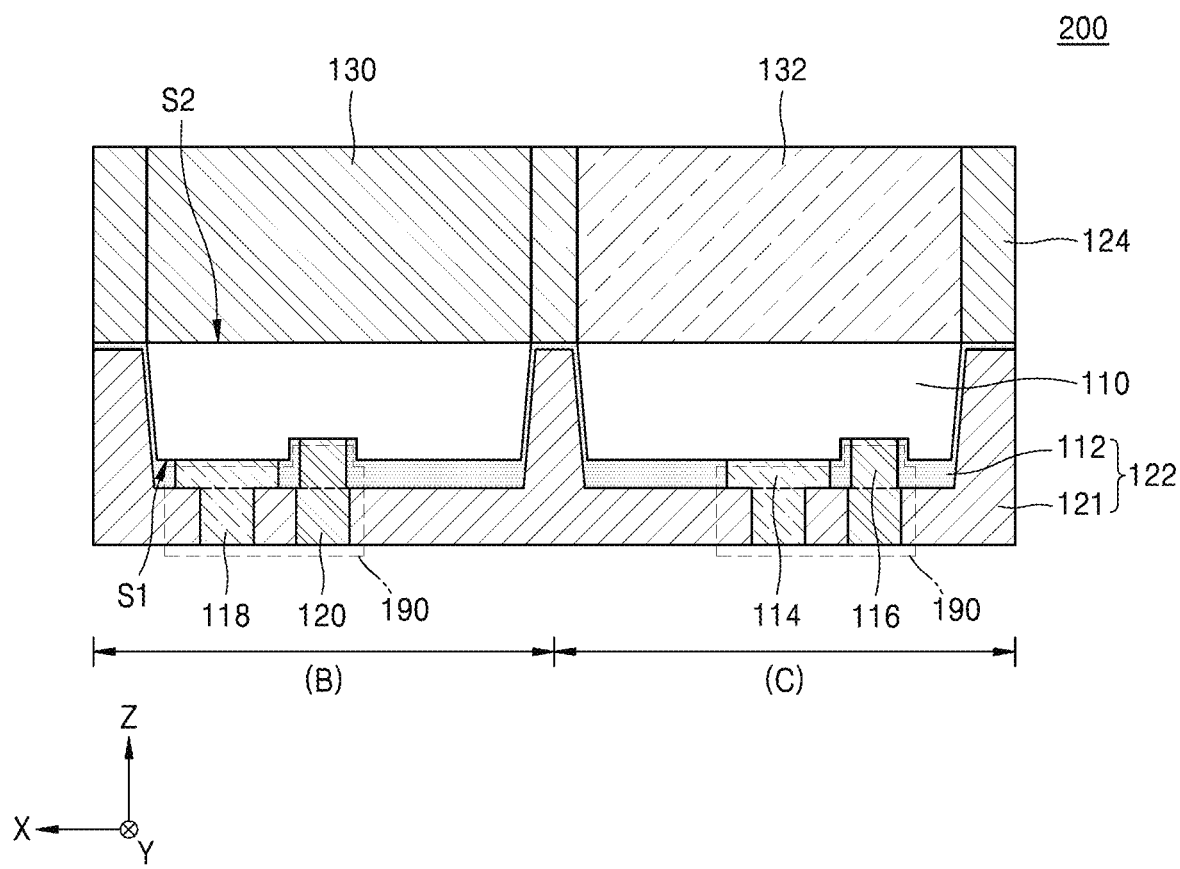
FIG. 7 is a sectional view of one or more portions of the LED device of FIG. 5 along a line VII-VII' of FIG. 5.

FIG. 5 is a plan view of a LED device according to some example embodiments, and FIGS. 6 and 7 are sectional views of portions of the LED device of FIG. 5, respectively obtained along a line VI-VI' and a line VII-VII'.

In detail, compared to the LED device 100 of FIGS. 1 through 4, the configuration of and the display generated by a LED device 200 may be identical or substantially identical (e.g., identical within material and manufacturing tolerances) except that the LED device 200 includes a fourth light-emitting cell D. Therefore, descriptions identical to those given above with reference to FIGS. 1 through 4 will be omitted or briefly given below.

As shown in FIG. 5, the LED device 200 may include a plurality of light-emitting cells A, B, C, and D, e.g., a first light-emitting cell A, a second light-emitting cell B, a third light-emitting cell C, and a fourth light-emitting cell D. The first light-emitting cell A and the second light-emitting cell B may be disposed in parallel to each other in the x-axis direction. The third light-emitting cell C and the fourth light-emitting cell D may be disposed apart from each other in the y-axis direction and in parallel to each other along the x-axis direction.

The first light-emitting cell A and the third light-emitting cell C may be disposed in parallel to each other in the y-axis direction. The second light-emitting cell B and the fourth light-emitting cell D may be disposed apart from the first light-emitting cell A and the third light-emitting cell C in the x-axis direction and in parallel to each other in the y-axis direction.

An arrangement relationship between the first light-emitting cell A, the second light-emitting cell B, the third light-emitting cell C, and the fourth light-emitting cell D may vary. Although FIG. 5 shows that the LED device 200 includes the four light-emitting cells A, B, C, and D for convenience of explanation, the LED device 200 may include only two light-emitting cells in some example embodiments. In FIG. 5, the light-emitting cells A, B, C, and D may be defined by the partition layer 124 extending in both the x-axis direction and the y-axis direction. The partition layer 124 may surround phosphor layers 128, 130, 132, and 134.

As shown in FIGS. 6 and 7, the LED device 200 may include the light-emitting structures 110 for the light-emitting cells A, B, C, and D, respectively. FIG. 6 shows the first light-emitting cell A and the fourth light-emitting cell D, whereas FIG. 7 shows the second light-emitting cell B and the third light-emitting cell C. As shown in FIG. 5, the light-emitting structure 110 may be apart from one another in a direction, e.g., the x-axis direction. Each of the light-emitting cells A, B, C, and D may include the light-emitting structure 110 that emits light of an ultraviolet wavelength or light of a blue wavelength. Since the configuration of the light-emitting structure 110 is described above with reference to FIG. 4, detailed description thereof will be omitted.

Each separate set 190 of electrode layers 118 and 120, of a plurality of sets thereof included in the LED device 200, may be disposed on a surface S1 of a separate light-emitting structure 110 of a plurality of light-emitting structures 110. As shown in FIGS. 6 and 7, the electrode layers 118 and 120 may be disposed on the surface S1 of each of the light-emitting structure 110, e.g., the bottom surface of the light-emitting structure 110. Therefore, the LED device 200 may be mounted on a board substrate (not shown) in a flip-chip manner. The first reflective layer 114 and the second reflective layer 116 may be further disposed on the first electrode layer 118 and the second electrode layer 120, respectively. Since materials and functions of the electrode layers 118 and 120 and the reflective layers 114 and 116 are described above with reference to FIGS. 3 and 4, detailed description thereof will be omitted.

The LED device 200 further includes a separation layer 122 for electric insulation between the light-emitting structures 110 and between the reflective layers 114 and 116 and the electrode layers 118 and 120. The separation layer 122 may include the separating insulation layer 112 on sidewalls and bottom surfaces of the light-emitting structures 110 and the mold insulation layer 121 insulating the electrode layers 118 and 120 from the light-emitting structures 110. Since materials and functions of the separating insulation layer 112 and the mold insulation layer 121 are described above with reference to FIG. 4, detailed description thereof will be omitted.

The separation layer 122 may electrically separate ("insulate") the light-emitting structures 110 from one another. Thus, the separate, respective light-emitting structures 110 may be individually driven. The separation layer 122 may separate the light-emitting structures 110 into individual light-emitting cells, e.g., the first light-emitting cell A, the second light-emitting cell B, the third light-emitting cell C, and the fourth light-emitting cell D.

In the LED device 200, the plurality of phosphor layers 128, 130, 132, and 134 having different colors are disposed on surfaces S2 of the light-emitting structures 110, respectively. The phosphor layers 128, 130, 132, and 134 may include the blue phosphor layer 128, the green phosphor layer 130, the red phosphor layer 132, and the white phosphor layer 134.

Although FIGS. 5 through 7 show the four phosphor layers 128, 130, 132, and 134 as different from one another, some example embodiments of an LED device may include two phosphor layers that are different from each other. The LED device 200 may generate a multi-color display based on light emitted by the light-emitting structures 110 passing through the phosphor layers 128, 130, 132, and 134 having different colors.

If and/or when the light-emitting structure 110 emits light of a blue wavelength (e.g., light having a wavelength ranging from about 450 nanometers to about 495 nanometers), the LED device 200 may generate a display including at least three colors even if the LED device 200 includes two phosphor layers. Since the LED device 200 may be electrically separated into the respective light-emitting structure 110 and each of the light-emitting structure 110 may be individually driven, displays including various colors may be generated by the LED device 200.

In the LED device 200, the partition layer 124 is disposed between the phosphor layers 128, 130, 132, and 134 to separate the phosphor layers 128, 130, 132, and 134 from one another. The partition layer 124 is disposed on the separation layer 122 between the light-emitting structures 110. The partition layer 124 may suppress optical interferences between the light-emitting cells A, B, C, and D. The partition layer 124 may include a material different from the material at least partially comprising the light-emitting structure 110. The partition layer 124 may include a substrate structure or an insulation structure. For example, the partition layer 124 may include a silicon-based substrate, e.g., a silicon substrate or a silicon carbide substrate.

The LED device 200 may include the plurality of light-emitting cells A, B, C, and D and the partition layer 124 that defines the light-emitting cells A, B, C, and D. Therefore, the LED device 200 may include the plurality of light-emitting cells A, B, C, and D to implement multi-colors and include the partition layer 124 to suppress optical interferences between the light-emitting cells A, B, C, and D.

Figure 8:
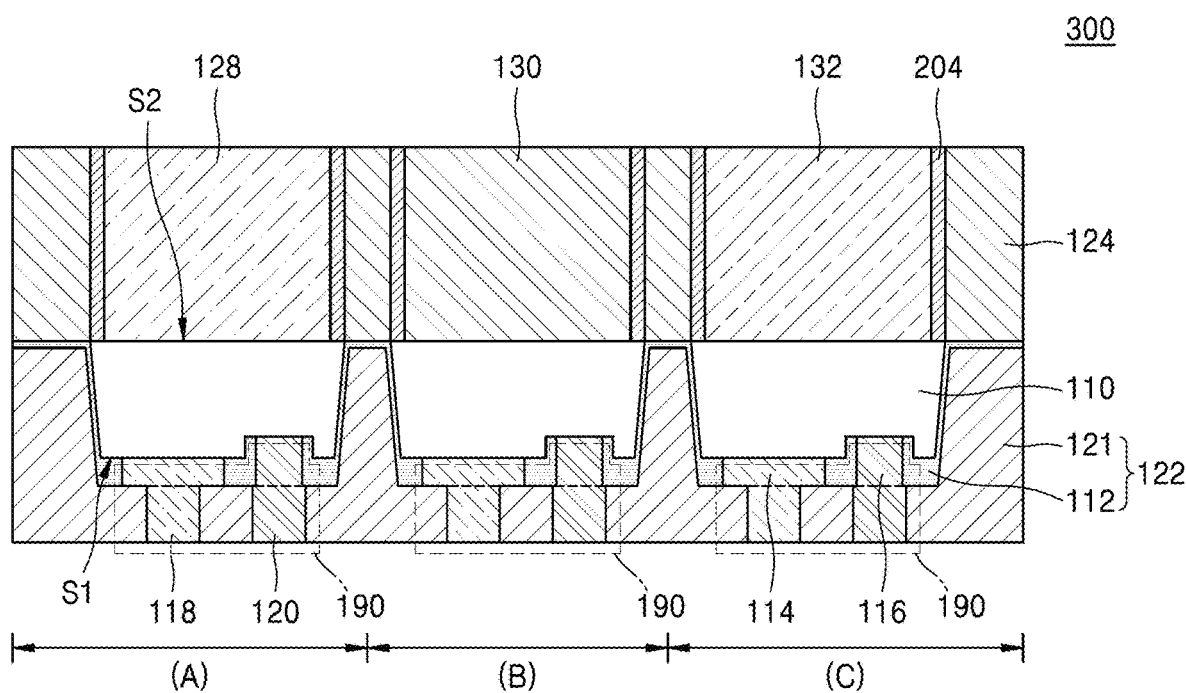
FIG. 8 is a cross-sectional view of a portion of a LED device according to some example embodiments.

FIG. 8 is a cross-sectional view of a portion of a LED device according to some example embodiments.

In detail, compared to the LED device 100 of FIGS. 1 through 4, the configuration of and the display generated by a LED device 300 may be identical or substantially identical (e.g., within material and manufacturing tolerances) to those of the LED device 100 except that the LED device 300 includes a light reflecting layer 204. Therefore, descriptions identical to those given above with reference to FIGS. 1 through 4 will be omitted or briefly given below.

The LED device 300 may include a plurality of light-emitting cells A, B, and C, e.g., a first light-emitting cell A, a second light-emitting cell B, and a third light-emitting cell C. the LED device 300 may include light-emitting structures 110 in correspondence to the respective light-emitting cells A, B, and C. Since the configuration of the light-emitting structure 110 is described above with reference to FIG. 4, detailed description thereof will be omitted.

The separate sets 190 of electrode layers 118 and 120 and the reflective layers 114 and 116 may be disposed on a surface S1 of each of the light-emitting structures 110. Since materials and functions of the electrode layers 118 and 120 and the reflective layers 114 and 116 are described above with reference to FIGS. 3 and 4, detailed description thereof will be omitted.

The LED device 300 further includes a separation layer 122 for electric insulation between the light-emitting structures 110 and between the reflective layers 114 and 116 and the electrode layers 118 and 120. The separation layer 122 may include the separating insulation layer 112 on sidewalls and bottom surfaces of the light-emitting structure 110 and the mold insulation layer 121 insulating the electrode layers 118 and 120 from the light-emitting structures 110. Since materials and functions of the separating insulation layer 112 and the mold insulation layer 121 are described above with reference to FIG. 4, detailed description thereof will be omitted.

In the LED device 300, the plurality of phosphor layers 128, 130, and 132 having different colors are disposed on surfaces S2 of the light-emitting structures 110, respectively. In the LED device 300, the partition layer 124 is disposed between the phosphor layers 128, 130, and 132 to separate the phosphor layers 128, 130, and 132 from one another.

In the LED device 300, the light reflecting layer 204 is disposed on a sidewall of the partition layer 124. The light reflecting layer 204 may reflect light emitted by the light-emitting structure 110. The light reflecting layer 204 may be at least one of a metal layer, a resin layer containing a metal oxide, and a distributed Bragg reflection layer.

The metal layer may be at least one of an Al layer, an Au layer, an Ag layer, a Pt layer, a Ni layer, a Cr layer, a Ti layer, and a Cu layer. The resin layer containing a metal oxide may be a resin layer containing a Ti oxide. The distributed Bragg reflection layer may include from several insulation layers to hundreds of insulation layers (e.g., from 2 to 100 insulation layers) having different refraction indexes and which are repeatedly stacked. Each of the insulation layers in the distributed Bragg reflection layer may include an oxide or a nitride including $SiO_2$, SiN, $SiO_xN_y$, $TiO_2$, $Si_3N_4$, $Al_2O_3$, TiN, AlN, $ZrO_2$, TiAlN, and TiSiN or a combination thereof. Therefore, light extraction efficiency of the LED device 300 may be improved based on the presence of the light reflecting layer 204.

Figure 9:
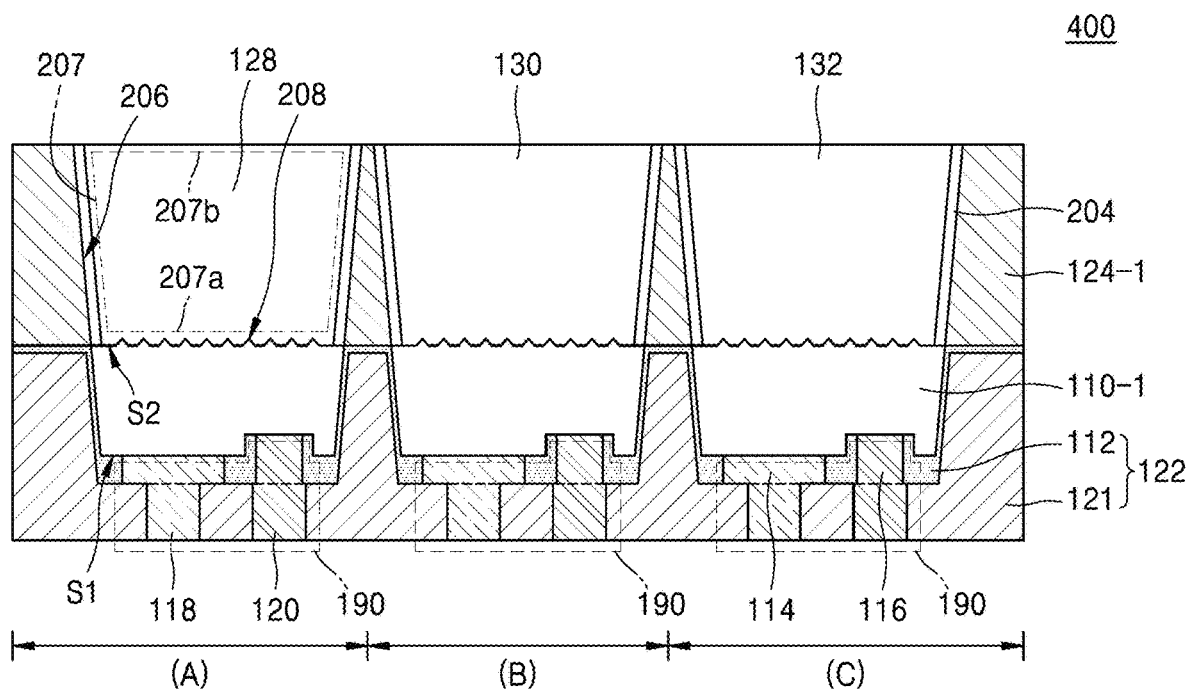
FIG. 9 is a cross-sectional view of a portion of a LED device according to some example embodiments.

FIG. 9 is a cross-sectional view of a portion of a LED device according to some example embodiments.

In detail, compared to the LED device 100 of FIGS. 1 through 4, the configuration of and the display generated by a LED device 400 may be identical or substantially identical (e.g., identical within material and manufacturing tolerances) except that the LED device 400 includes one or more light-emitting structures 110-1 including an uneven structure 208 and a partition layer 124-1 including (e.g., associated with) one or more sloped sidewalls 206. In some example embodiments, the uneven structure 208 may be separate from the light-emitting structure 110-1, such that the uneven structure 208 is on a surface S2 of the light-emitting structure 110-1. If and/or when the uneven structure 208 is separate from the light-emitting structure 110-1, the uneven structure 208 may include a common material composition or a different material composition, in relation to a material composition of the light-emitting structure 110-1. Therefore, descriptions identical to those given above with reference to FIGS. 1 through 4 will be omitted or briefly given below.

The LED device 400 may include a plurality of light-emitting cells A, B, and C, e.g., a first light-emitting cell A, a second light-emitting cell B, and a third light-emitting cell C. The LED device 400 may include separate light-emitting structures 110-1 for each of the respective light-emitting cells A, B, and C. The uneven structure 208 may be disposed on a surface S2 of each of the light-emitting structure 110-1. The LED device 400 may be configured to provide improved light extraction efficiency based on the uneven structure 208. Since the configuration of the light-emitting structure 110-1 except the uneven structure 208 is identical to the configuration of the light-emitting structure 110 described above with reference to FIG. 4, detailed description thereof will be omitted.

The electrode layers 118 and 120 in each given set 190 may be disposed on a surface S1 of a separate light-emitting structure 110-1. The reflective layers 114 and 116 in the given set 190 may be further disposed on the electrode layers 118 and 120 of the given set 190, respectively. Since materials and functions of the electrode layers 118 and 120 and the reflective layers 114 and 116 are described above with reference to FIGS. 3 and 4, detailed description thereof will be omitted.

The LED device 400 further includes the separation layer 122 configured to provide electric insulation between the light-emitting structures 110-1 and between the reflective layers 114 and 116 and the electrode layers 118 and 120. The separation layer 122 may include the separating insulation layer 112 on sidewalls and bottom surfaces of the light-emitting structure 110-1 and the mold insulation layer 121 insulating the electrode layers 118 and 120 from the light-emitting structures 110-1. Since materials and functions of the separating insulation layer 112 and the mold insulation layer 121 are described above with reference to FIG. 4, detailed description thereof will be omitted.

In the LED device 400, the plurality of phosphor layers 128, 130, and 132 having different colors are disposed on the surfaces S2 of the light-emitting structures 110, respectively. The phosphor layers 128, 130, and 132 may include the blue phosphor layer 128, the green phosphor layer 130, and the red phosphor layer 132.

In the LED device 400, a partition layer 124-1 is disposed between the phosphor layers 128, 130, and 132 to separate the phosphor layers 128, 130, and 132 from one another. The partition layer 124-1 may suppress optical interferences between the light-emitting cells A, B, and C. In some example embodiments, including the example embodiments illustrated in FIG. 9, one or more of the sidewalls 206 of the partition layer 124-1 may exhibit a slope, such that the one or more sidewalls 206 are sloped sidewalls 206. Due to the sloped sidewall 206 of the partition layer 124-1, a diameter of the space surrounded by the sloped sidewall 206 increase in a direction in which light travels in the LED device 400, that is, upward in the z-direction from the light-emitting structures 110-1 through the phosphor layers 128, 130, and 132. Thus, the sloped sidewall 206 defines a space 207 having a proximate end 207a and a distal end 207b, in relation to the light-emitting structure 110-1, and where the distal end 207b has a greater diameter than the proximate end 207a. The sloped sidewalls 206 may improve light extraction efficiency of the LED device 400.

The light reflecting layer 204 is disposed on the sloped sidewalls 206. The light reflecting layer 204 may reflect light emitted by the light-emitting structure 110-1. The light reflecting layer 204 may include a material as described above. As described above, the LED device 400 may include the partition layer 124-1 having the sloped sidewall 206 and the light-emitting structure 110-1 having the uneven structure 208 for improved light extraction efficiency.

Figure 10:
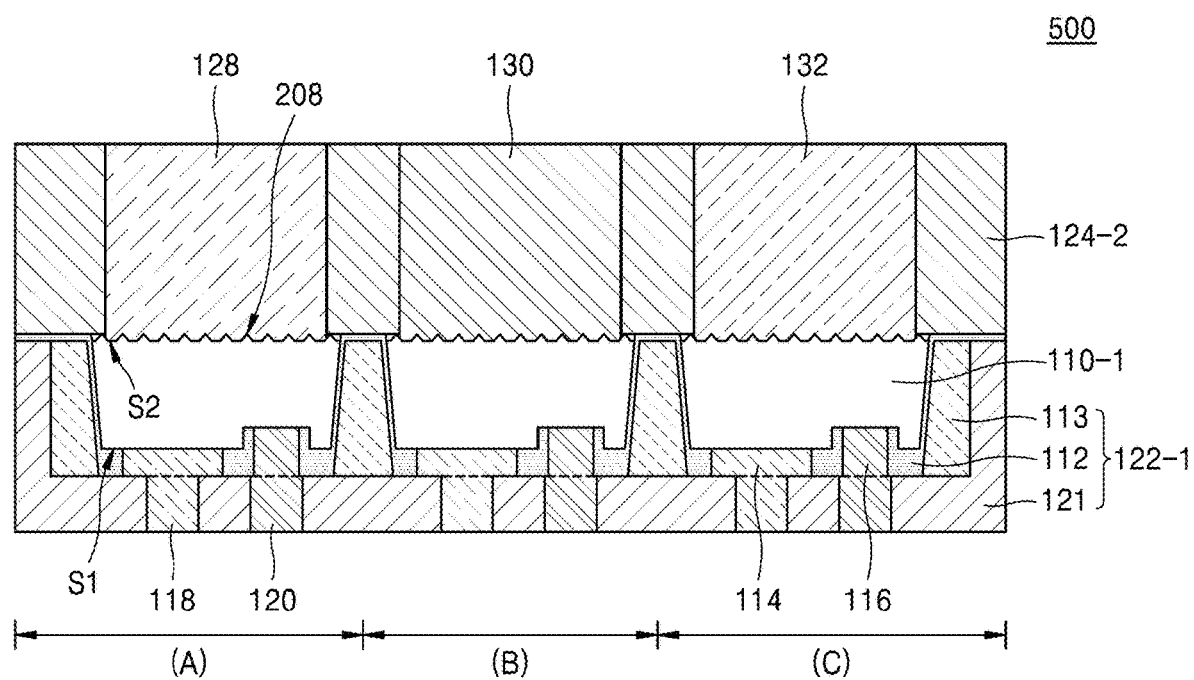
FIG. 10 is a cross-sectional view of a portion of a LED device according to some example embodiments.

FIG. 10 is a cross-sectional view of a portion of a LED device according to some example embodiments.

In detail, compared to the LED device 100 of FIGS. 1 through 4, the configuration of and the display generated by a LED device 500 may be identical or substantially identical (e.g., identical within material and manufacturing tolerances) except that the LED device 500 includes a separation layer 122-1 including a metal layer 113 and a partition layer 124-2 including a light reflecting structure.

Compared to the LED device 400 of FIG. 9, the display generated by a LED device 500 may be identical or substantially identical (e.g., within material and manufacturing tolerances) except that the LED device 500 includes the separation layer 122-1 including the metal layer 113. Therefore, descriptions identical to those given above with reference to FIGS. 1 through 4 and FIG. 9 will be omitted or briefly given below.

The LED device 400 may include a plurality of light-emitting cells A, B, and C, e.g., a first light-emitting cell A, a second light-emitting cell B, and a third light-emitting cell C. The LED device 400 may include a separate light-emitting structure 110-1 in each of the respective light-emitting cells A, B, and C. The uneven structure 208 may be disposed on a surface S2 of each of the light-emitting structure 110-1 for improving light extraction efficiency. Since the configuration of the light-emitting structure 110-1 except the uneven structure 208 is identical to the configuration of the light-emitting structure 110 described above with reference to FIG. 4, detailed description thereof will be omitted.

The electrode layers 118 and 120 in each given set 190 may be disposed on a surface S1 of a separate light-emitting structure 110-1 of the light-emitting structures 110-1. The reflective layers 114 and 116 in the given set 190 may be further disposed on the electrode layers 118 and 120 of the given set 190, respectively. Since materials and functions of the electrode layers 118 and 120 and the reflective layers 114 and 116 are described above with reference to FIGS. 3 and 4, detailed description thereof will be omitted.

The LED device 500 further includes the separation layer 122-1 configured to provide electric insulation between the light-emitting structures 110-1 and between the reflective layers 114 and 116 and the electrode layers 118 and 120. The separation layer 122-1 may include the separating insulation layer 112 on sidewalls and bottom surfaces of the light-emitting structure 110-1, the metal layer 113 insulated from the light-emitting structure 110-1 by the separating insulation layer 112, and the mold insulation layer 121 that insulates between the electrode layers 118 and 120 and the metal layer 113.

The metal layer 113 may reflect light emitted by the light-emitting structures 110-1. The metal layer 113 may include at least one of Al, Au, Ag, Pt, Ni, Cr, Ti, and Cu. Since materials at least partially comprising the separating insulation layer 112 and the mold insulation layer 121 are described above with reference to FIG. 4, detailed description thereof will be omitted.

In the LED device 500, the plurality of phosphor layers 128, 130, and 132 having different colors are disposed on the surfaces S2 of separate, respective light-emitting structures 110-1. The phosphor layers 128, 130, and 132 may include the blue phosphor layer 128, the green phosphor layer 130, and the red phosphor layer 132.

In the LED device 500, the partition layer 124-2 is disposed between the phosphor layers 128, 130, and 132 to separate the phosphor layers 128, 130, and 132 from one another. The partition layer 124-2 may include a light reflecting structure. The light reflecting structure at least partially comprising the partition layer 124-2 may include a single body. The light reflecting structure at least partially comprising the partition layer 124-2 may include a light reflecting layer as described herein. The light reflecting layer may be at least one of a metal layer, a resin layer containing a metal oxide, and a distributed Bragg reflection layer. As described above, the LED device 500 may include the metal layer 113 at least partially comprising the separation layer 122-1 and the partition layer 124-2 including the light reflecting structure for improved light extraction efficiency associated with the LED device 500.

Figure 11:
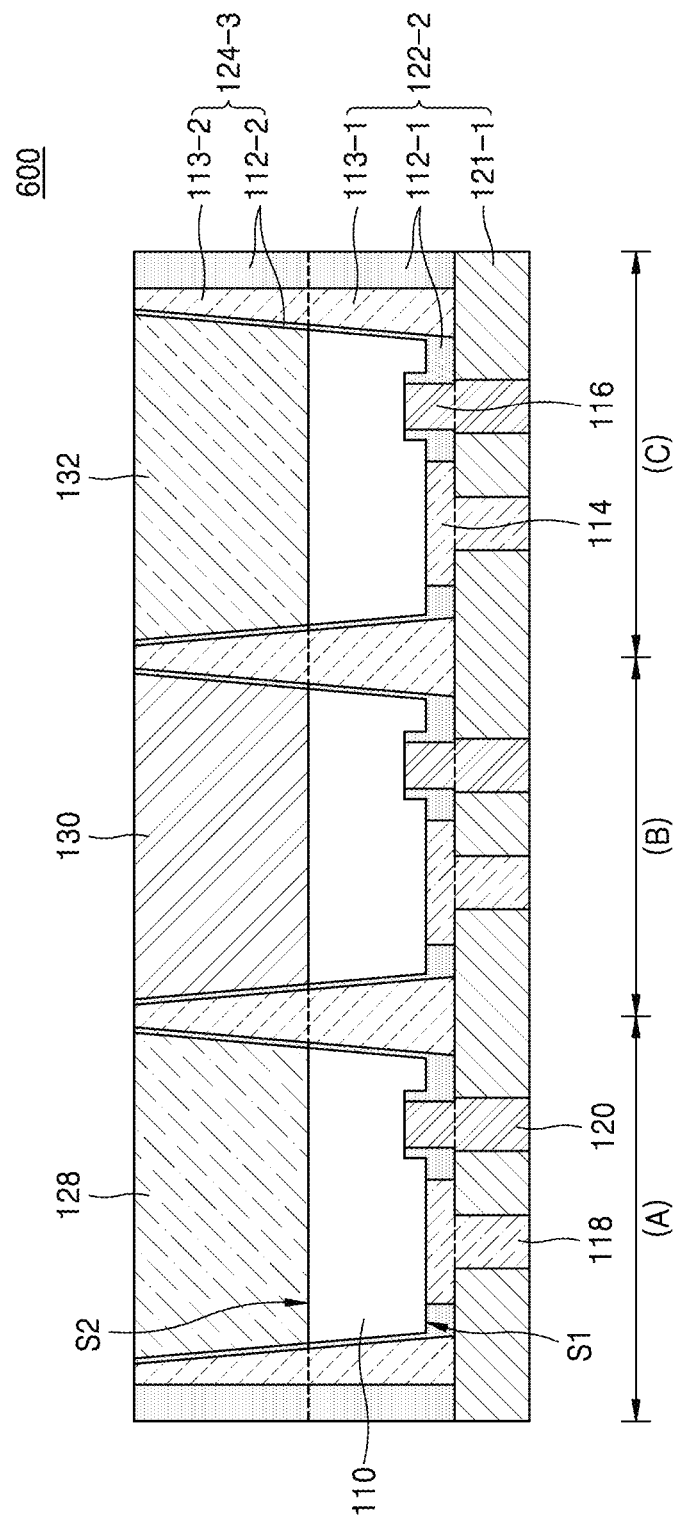
FIG. 11 is a cross-sectional view of a portion of a LED device according to some example embodiments.

FIG. 11 is a cross-sectional view of a portion of a LED device according to some example embodiments.

In detail, compared to the LED device 100 of FIGS. 1 through 4, the configuration of and the display generated by a LED device 600 may be identical or substantially identical (e.g., identical within material and manufacturing tolerances) except the structures of a separation layer 122-2 and a partition layer 124-3. Compared to the LED device 500 of FIG. 10, the configuration of and the display generated by a LED device 600 may be identical or substantially identical (e.g., identical within material and manufacturing tolerances) except that the LED device 600 includes the partition layer 124-3 including a second metal layer 113-2. Therefore, descriptions identical to those given above with reference to FIGS. 1 through 4 and FIG. 10 will be omitted or briefly given below.

The LED device 600 may include a plurality of light-emitting cells A, B, and C, e.g., a first light-emitting cell A, a second light-emitting cell B, and a third light-emitting cell C. The LED device 600 may include light-emitting structures 110 for the respective light-emitting cells A, B, and C. Since the configuration of the light-emitting structure 110 is described above with reference to FIG. 4, detailed description thereof will be omitted.

The separate sets 190 of electrode layers 118 and 120 may be disposed on a surface S1 of each of the light-emitting structures 110. The reflective layers 114 and 116 in a given set 190 may be further disposed on the electrode layers 118 and 120 of the given set 190, respectively. Since materials and functions of the electrode layers 118 and 120 and the reflective layers 114 and 116 are described above with reference to FIGS. 3 and 4, detailed description thereof will be omitted.

The LED device 600 further includes the separation layer 122-2 for electric insulation between the light-emitting structures 110 and between the reflective layers 114 and 116 and the electrode layers 118 and 120. The separation layer 122-2 may include a first separating insulation layer 112-1 disposed on sidewalls and bottom surfaces of the light-emitting structure 110, a first metal layer 113-1 insulated from the light-emitting structure 110 by the first separating insulation layer 112-1, and a mold insulation layer 121-1 that insulates between the electrode layers 118 and 120.

The first metal layer 113-1 may include Al, Au, Ag, Pt, Ni, Cr, Ti, or Cu. The first metal layer 113-1 may reflect light emitted by the light-emitting structures 110. Since materials at least partially comprising the first separating insulation layer 112-1 and the mold insulation layer 121-1 are identical to the materials at least partially comprising the separating insulation layer 112 and the mold insulation layer 121 described above with reference to FIG. 4, detailed description thereof will be omitted.

In the LED device 600, the plurality of phosphor layers 128, 130, and 132 having different colors are disposed on the surfaces S2 of the light-emitting structures 110, respectively. The phosphor layers 128, 130, and 132 may include the blue phosphor layer 128, the green phosphor layer 130, and the red phosphor layer 132. In the LED device 600, the partition layer 124-3 is disposed between the phosphor layers 128, 130, and 132 to separate the phosphor layers 128, 130, and 132 from one another.

A second separating insulation layer 112-2 and the second metal layer 113-2 respectively extending from the first separating insulation layer 112-1 and the first metal layer 113-1 are disposed on a sidewall of each of the phosphor layers 128, 130, and 132. The second metal layer 113-2 may include Al, Au, Ag, Pt, Ni, Cr, Ti, or Cu. The second metal layer 113-2 may reflect light emitted by the light-emitting structures 110. The second separating insulation layer 112-2 and the second metal layer 113-2 may at least partially comprise the above-stated partition layer 124-3. The partition layer 124-3 includes the second metal layer 113-2 capable of reflecting light and may be referred to as a light reflecting structure. The partition layer 124-3 may include the second separating insulation layer 112-2 and may be referred to as an insulation structure. The partition layer 124-3 including a light reflecting structure or an insulation structure may include a single body.

The first separating insulation layer 112-1 and the first metal layer 113-1 of the LED device 600 may be integrally combined with the second separating insulation layer 112-2 and the second metal layer 113-2, respectively. For example, the first separating insulation layer 112-1 and the second separating insulation layer 112-2 may be included in a common separating insulation layer, and the first metal layer 113-1 and the second metal layer 113-2 may be included in a common metal layer. The first separating insulation layer 112-1, the first metal layer 113-1, the second separating insulation layer 112-2, and the second metal layer 113-2 may at least partially comprise the separation layer 122-2 and the partition layer 124-3. In some example embodiments, the separation layer 122-2 and the partition layer 124-3 may be included in a common layer.

As described above, in the LED device 600, the separation layer 122-2 and the partition layer 124-3 may include the first metal layer 113-1 and the second metal layer 113-2 for improved light extraction efficiency.

FIGS. 12A-I are sectional diagrams for describing a method of fabricating a LED device according to some example embodiments.

In detail, FIGS. 12A through 12I are sectional diagrams for describing a method of fabricating the LED device 100 of FIGS. 1 through 4. Therefore, descriptions identical to those given above with reference to FIGS. 1 through 4 will be omitted or briefly given.

Figure 12A:
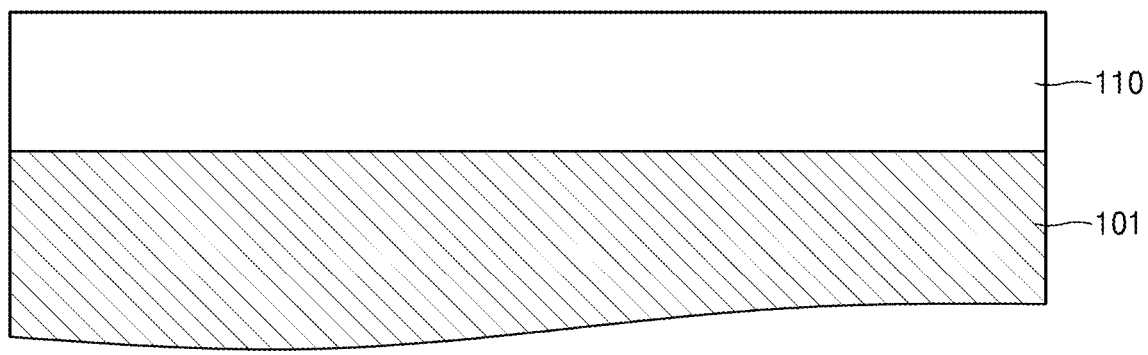

Referring to FIG. 12A, the light-emitting structure 110 is formed on a substrate 101. The substrate 101 may be a growth substrate for growing the light-emitting structure 110. The substrate 101 may be a semiconductor wafer. The substrate 101 may be a silicon-based substrate. The silicon-based substrate may be a silicon (Si) substrate or a silicon carbide (SiC) substrate. If and/or when a silicon-based substrate is used as the substrate 101, the substrate 101 may easily have a large size and productivity of manufacturing the same may be high due to a relatively inexpensive cost.

The substrate 101 may be an insulation substrate including at least one of sapphire, $MgAl_2O_4$, MgO, $LiAlO_2$, $LiGaO_2$, GaN, AlN, etc. As described above with reference to FIG. 4, the light-emitting structure 110 may include the first conductive type semiconductor layer 102, the active layer 104, and the second conductive type semiconductor layer 106.

Figure 12B:
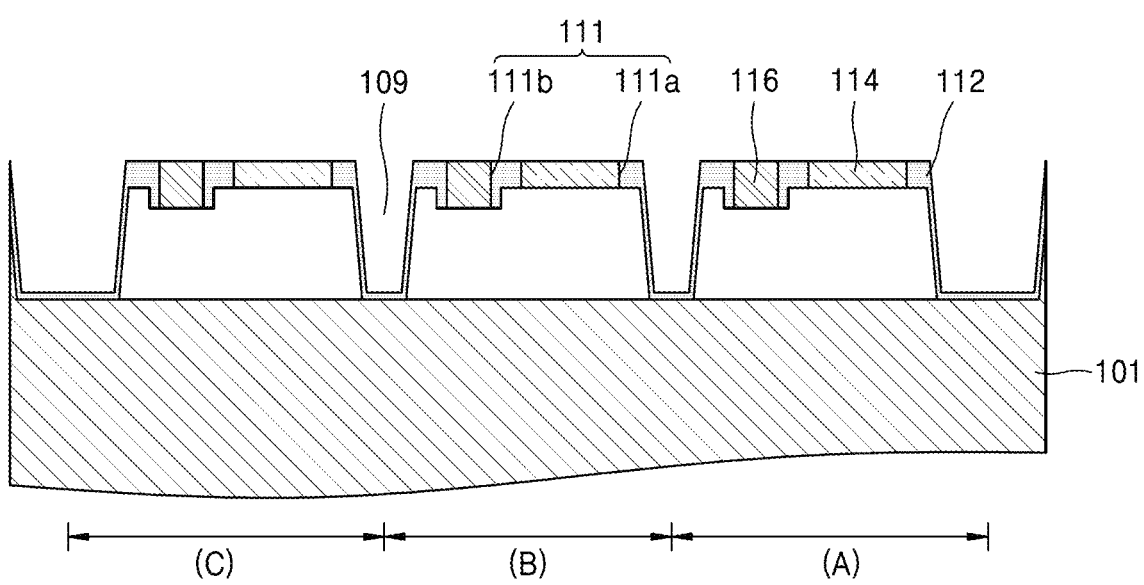

Referring to FIG. 12B, a separation hole 109 separating the light-emitting structure 110 into separate light-emitting structures corresponding to separate, respective light-emitting cells A, B, and C by selectively etching the light-emitting structure 110. In other words, the separation hole 109 that separates the light-emitting structure 110 into a separate light-emitting structure corresponding to the first light-emitting cell A, a separate light-emitting structure corresponding to the second light-emitting cell B, and a separate light-emitting structure corresponding to the third light-emitting cell C is formed.

The separating insulation layer 112 including first exposing holes 111 that expose portions of the light-emitting structure 110 is formed on the inner wall of the separation hole 109 and on the light-emitting structure 110. The first exposing holes 111 may include a first sub-exposing hole 111a and another first sub-exposing hole 111b. The separating insulation layer 112 includes at least one of silicon oxide layer and a silicon nitride layer.

The separating insulation layer 112 may be formed on a sidewall and the top surface of each given light-emitting structure 110. A first sub-exposing hole 111a may be a hole that exposes a first conductive type semiconductor layer of a given light-emitting structure 110, e.g., a P-type semiconductor layer. A first sub-exposing hole 111b may be a hole that exposes a second conductive type semiconductor layer of a given light-emitting structure 110, e.g., an N-type semiconductor layer.

The reflective layers 114 and 116 are formed in the first exposing holes 111. The reflective layers 114 and 116 may include highly-reflective material layers, e.g., metal layers. The reflective layers 114 and 116 may include at least one of Al, Au, Ag, Pt, Ni, Cr, Ti, and Cu. The first reflective layer 114 and the second reflective layer 116 are formed in the first sub-exposing hole 111a and the first sub-exposing hole 111b, respectively. The reflective layers 114 and 116 in a given light-emitting cell may reflect light emitted by the light-emitting structure 110 in the given light emitting cell and function as electrode layers.

Figure 12C:
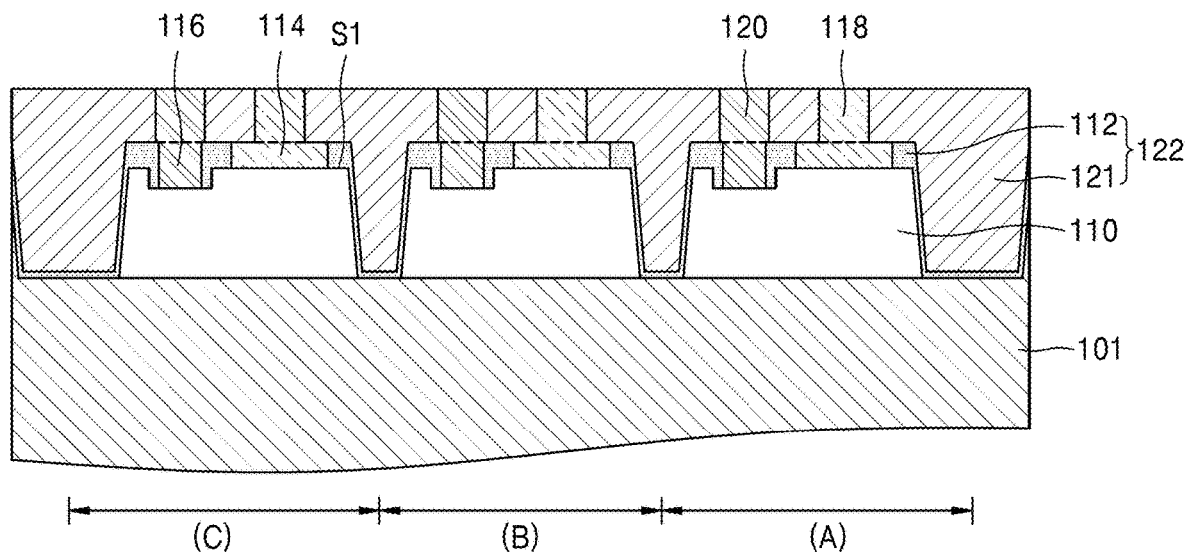

Referring to FIG. 12C, separate sets of electrode layers 118 and 120 are formed on the reflective layers 114 and 116 of the separate light-emitting cells A, B, C. In other words, in each given light-emitting cell, the first electrode layer 118 and the second electrode layer 120 are formed on the first reflective layer 114 and the second reflective layer 116 of the given light-emitting cell, respectively. The first electrode layer 118 may be electrically connected to the first conductive type semiconductor layer 102 shown in FIG. 4, whereas the second electrode layer 120 may be electrically connected to the second conductive type semiconductor layer 106 shown in FIG. 4.

The electrode layers 118 and 120 may include a same (e.g., common) material as the reflective layers 114 and 116. Accordingly, a separate set 190 of the electrode layers 118 and 120 and the reflective layers 114 and 116 may be formed on the surface S1 of each of the light-emitting structures 110.

Next, the mold insulation layer 121 that electrically insulates between the electrode layers 118 and 120 and the light-emitting structures 110 is formed. The mold insulation layer 121 may include a silicon resin, an epoxy resin, or an acryl resin. The top surface of the mold insulation layer 121 and surfaces of the electrode layers 118 and 120 may form a continuous surface. Accordingly, the separating insulation layer 112 and the mold insulation layer 121 may at least partially comprise the separation layer 122 that electrically insulates the light-emitting cells A, B, and C from one another.

Figure 12D:
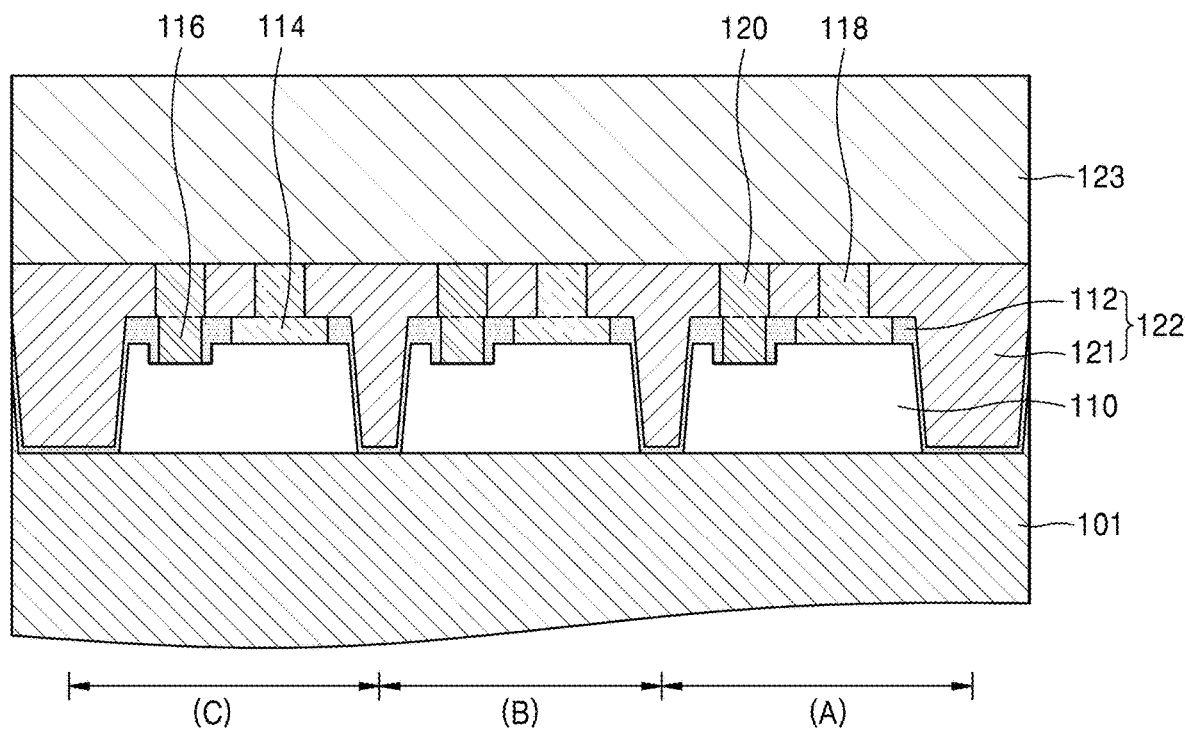
Figure 12E:
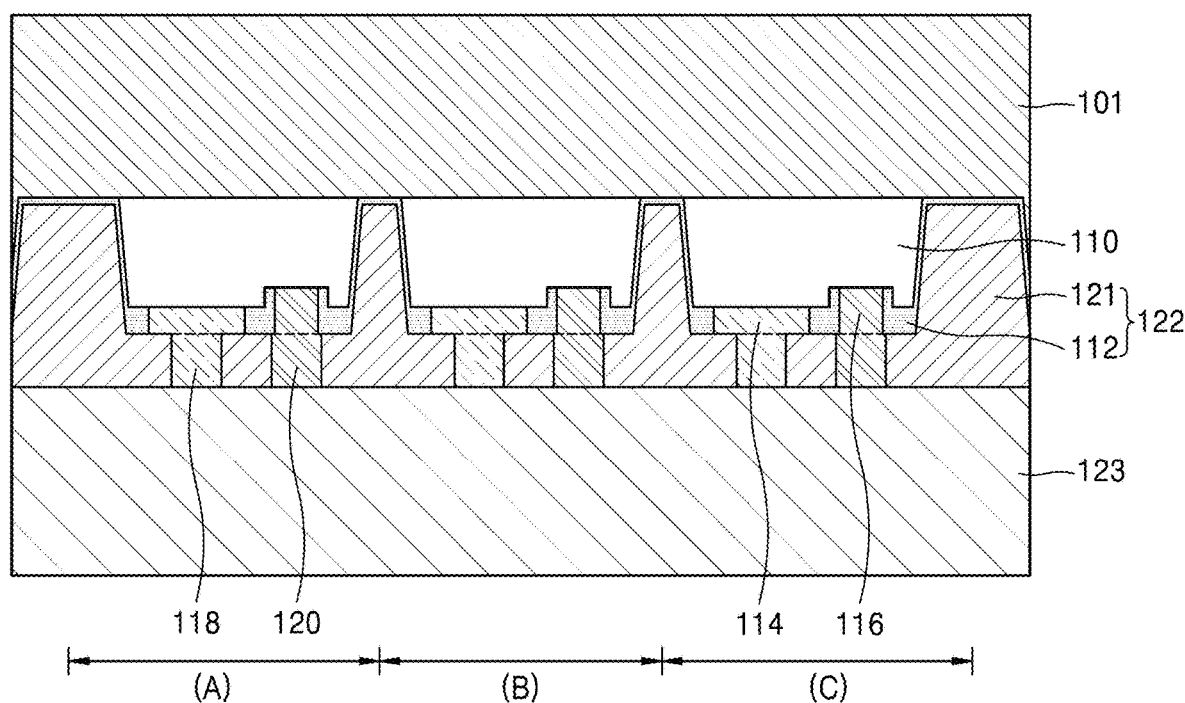

Referring to FIGS. 12D and 12E, a temporary substrate 123 is attached onto the electrode layers 118 and 120 and the separation layer 122 as shown in FIG. 12D. The temporary substrate 123 may be a substrate for supporting the electrode layers 118 and 120 and the separation layer 122. The temporary substrate 123 may be a glass substrate or an insulation substrate.

Next, as shown in FIG. 12E, the structure is turned upside down (e.g., inverted), such that the temporary substrate 123 faces downward, and the thickness of the structure is reduced by grinding the rear surface of the substrate 101. If and/or when the rear surface of the substrate 101 is grinded as described above, the rear surface of the substrate 101 is planarized.

Figure 12G:
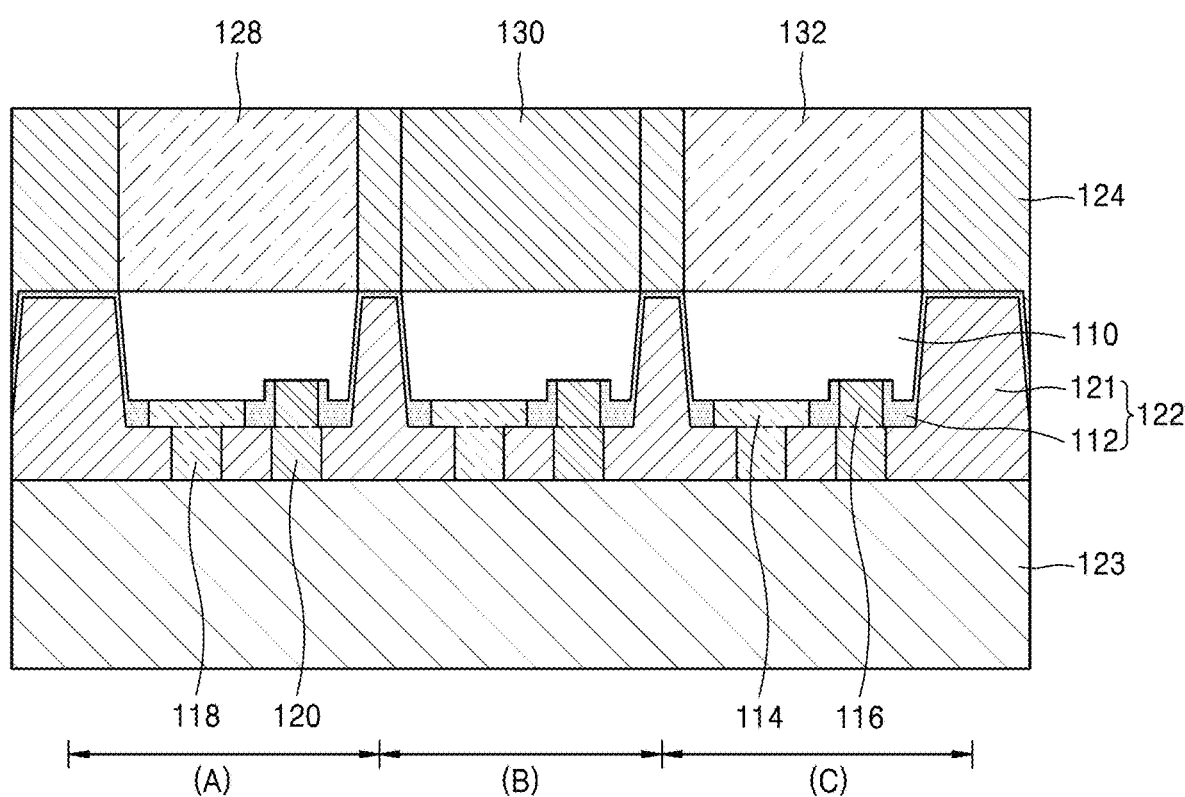

Referring to FIGS. 12F and 12G, the partition layer 124 including second exposing holes 126 that exposes the surfaces S2 of the light-emitting structures 110 is formed by selectively etching the substrate 101. The second exposing holes 126 may include a second sub-exposing hole 126a, a second sub-exposing hole 126b, and a second sub-exposing hole 126c corresponding to the light-emitting cells A, B, and C, respectively.

The partition layer 124 may include a substrate structure or an insulation structure. The partition layer 124 may include a single body. The partition layer 124 may include a silicon-based substrate structure or an insulation substrate structure based on a material at least partially comprising the substrate 101. Since the partition layer 124 according to the present embodiment includes a silicon-based substrate structure or an insulation substrate structure, it is not necessary to perform a separate stacking operation, and thus the overall fabrication process may be simplified. Furthermore, size of the partition layer 124 may be easily controlled.

As shown in FIG. 12G, the phosphor layers 128, 130, and 132 are formed in the second exposing holes 126 of the light-emitting structures 110, respectively. The blue phosphor layer 128, the green phosphor layer 130, and the red phosphor layer 132 are formed in the second sub-exposing hole 126a, the second sub-exposing hole 126b, and the second sub-exposing hole 126c, respectively. Therefore, the phosphor layers 128, 130, and 132 may include the blue phosphor layer 128, the green phosphor layer 130, and the red phosphor layer 132.

Figure 12H:
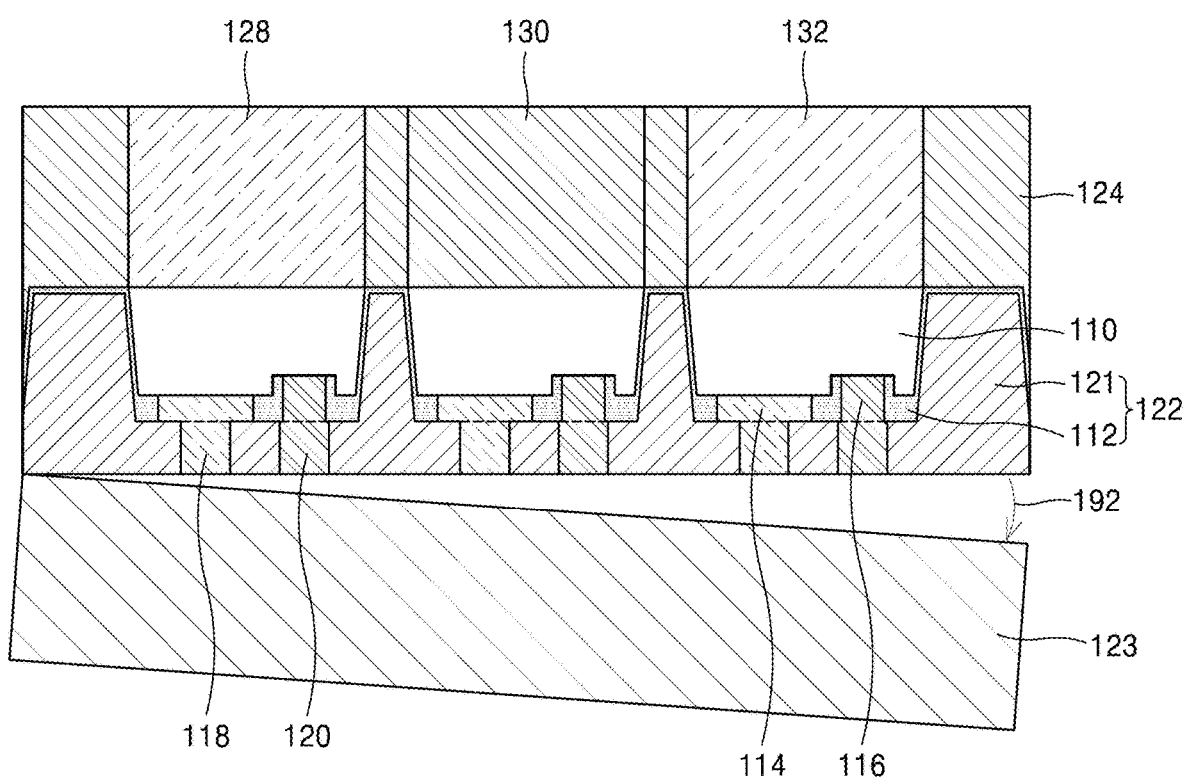
Figure 12I:
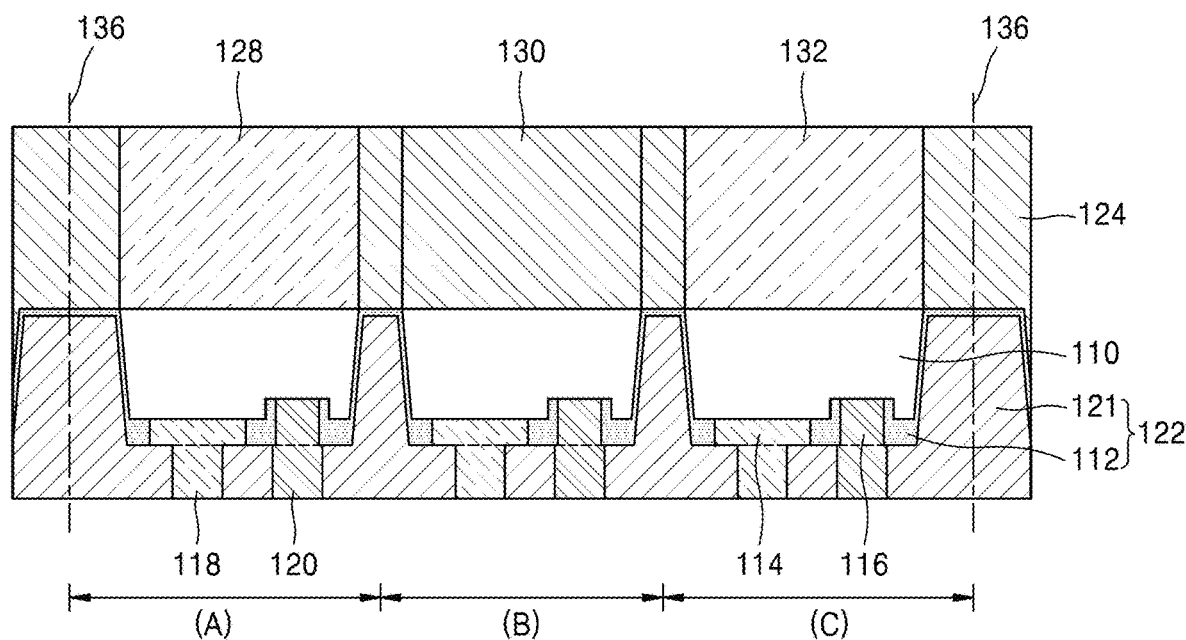

Referring to FIGS. 12H and 12I, the temporary substrate 123 is removed 192 as shown in FIG. 12H. Next, as shown in FIG. 12I, the LED device 100 as shown in FIGS. 1 through 4 is completed by dicing the partition layer 124 and the separation layer 122 along a dicing line 136, such that the LED device 100 includes the plurality of light-emitting cells A, B, and C.

Figure 13A:
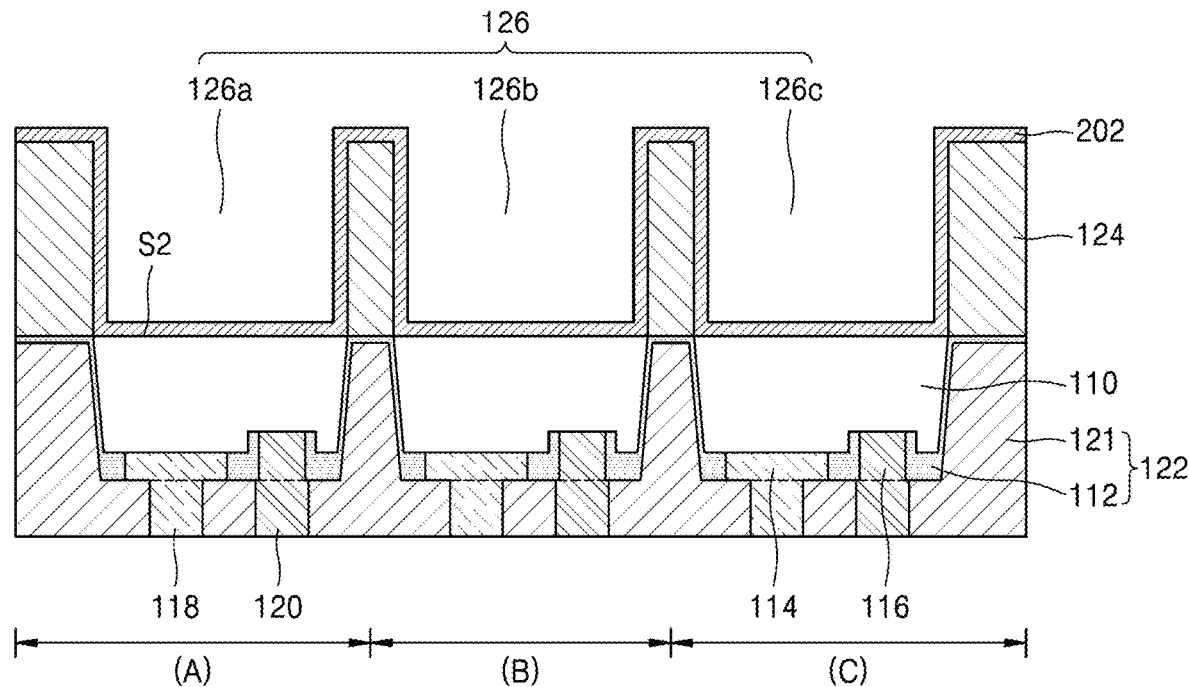
FIGS. 13A-B are sectional views for describing a method of fabricating a LED device according to some example embodiments.
Figure 13B:
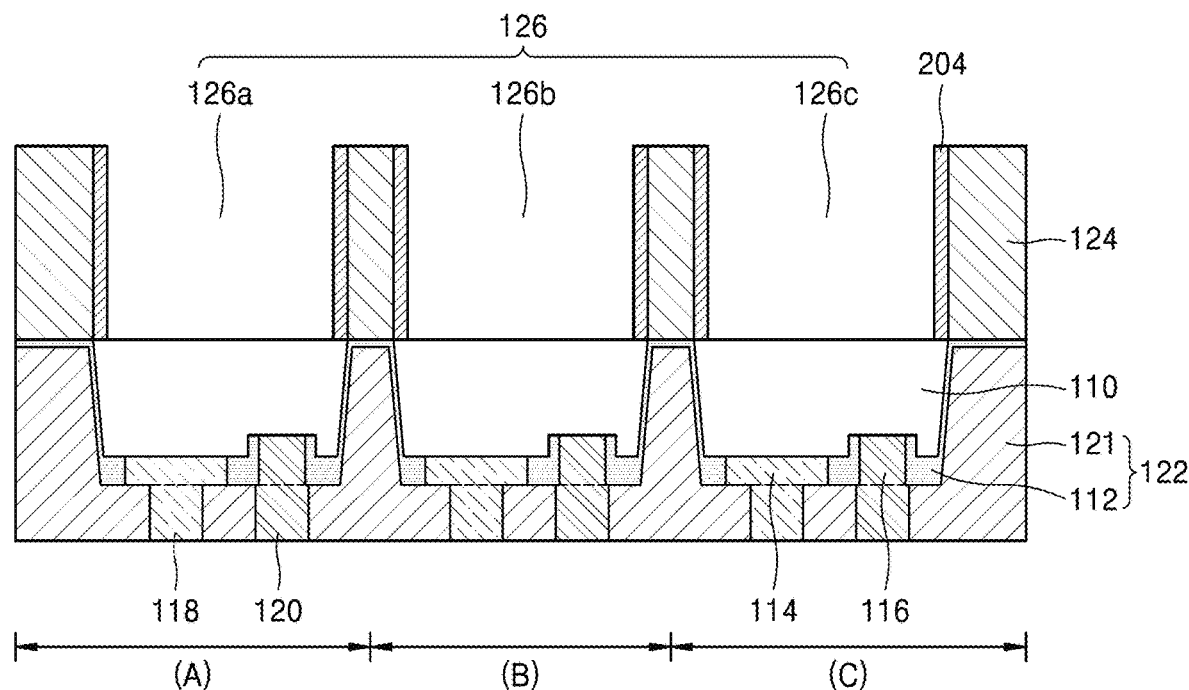

FIGS. 13A and 13B are sectional diagrams for describing a method of fabricating a LED device according to some example embodiments.

In detail, FIGS. 13A and 13B are sectional diagrams for describing a method of fabricating the LED device 300 of FIG. 8. The method shown in FIGS. 13A and 13B may be identical to the method shown in FIGS. 12A through 12I except that the light reflecting layer 204 is formed on a sidewall of the partition layer 124. Therefore, descriptions identical to those given above with reference to FIG. 8 and FIGS. 12A through 12I will be omitted or briefly given.

As described above with reference to FIGS. 12A through 12F, the partition layer 124 including the second exposing holes 126 that expose the surfaces S2 of the light-emitting structures 110 is formed. The second exposing holes 126 may include the second sub-exposing hole 126a, the second sub-exposing hole 126b, and the second sub-exposing hole 126c corresponding to the light-emitting cells A, B, and C, respectively.

As shown in FIG. 13A, a light reflecting material layer 202 is formed on the second exposing holes 126 and the partition layer 124. The light reflecting material layer 202 is formed on the surfaces S2 of the light-emitting structures 110 and the side surfaces and the top surface of the partition layer 124. The light reflecting material layer 202 may be a material layer that reflects light well.

As shown in FIG. 13B, the light reflecting layer 204 is formed on a sidewall of the partition layer 124 by selectively etching the light reflecting material layer 202. Since the material at least partially comprising the light reflecting layer 204 is described above, detailed description thereof will be omitted. If and/or when the light reflecting material layer 202 is etched, a portion of the light reflecting material layer 202 formed on the top surface of the light-emitting structure 110 may be removed. Next, as shown in FIGS. 12G through 12I, the LED device 300 (FIG. 8) may be completed by forming the phosphor layers 128, 130, and 132 in the second exposing holes 126.

Figure 14A:
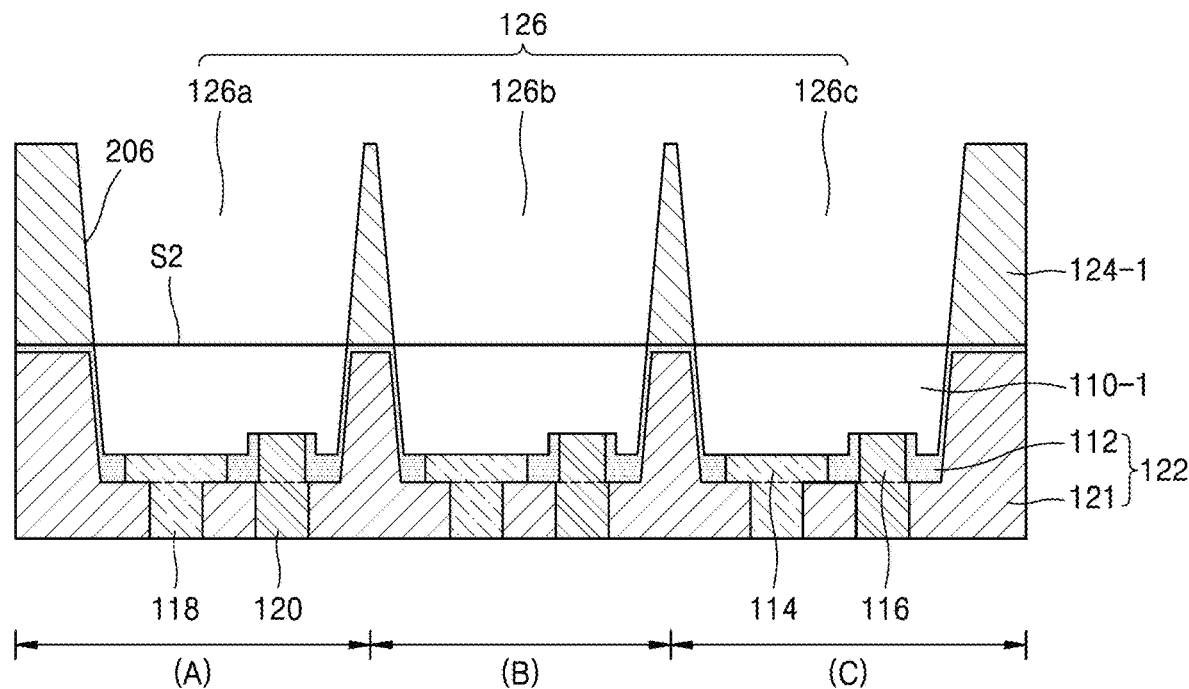
FIGS. 14A-C are sectional views for describing a method of fabricating the LED device of FIG. 9.
Figure 14B:
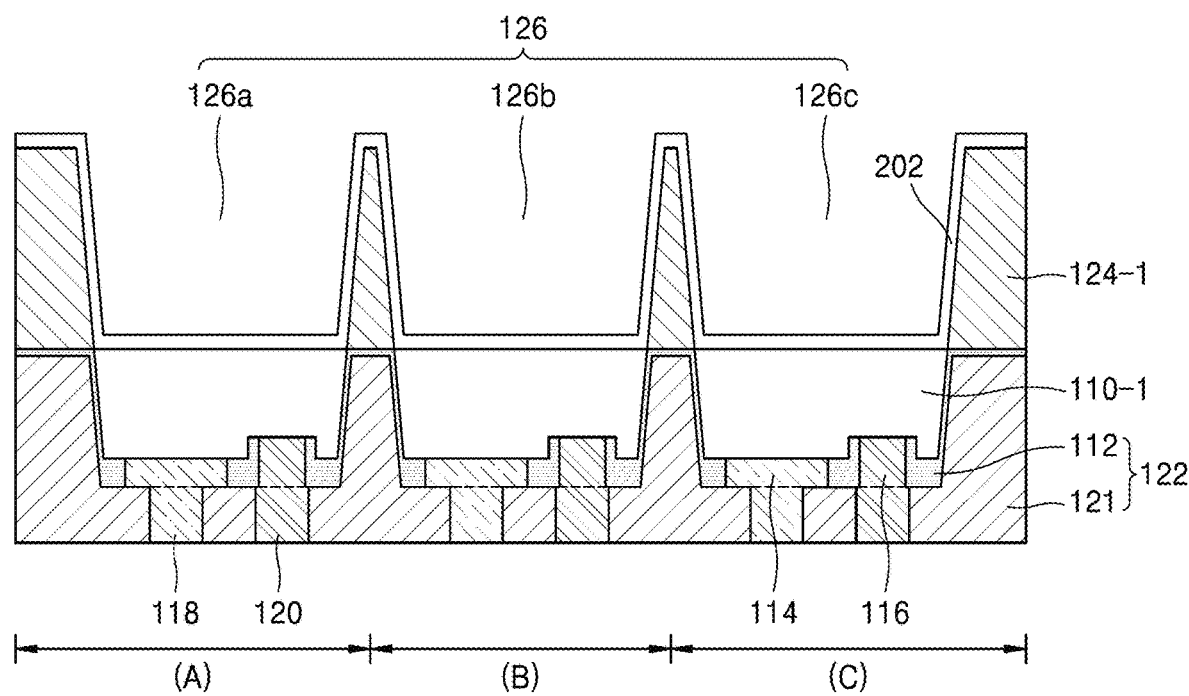
Figure 14C:
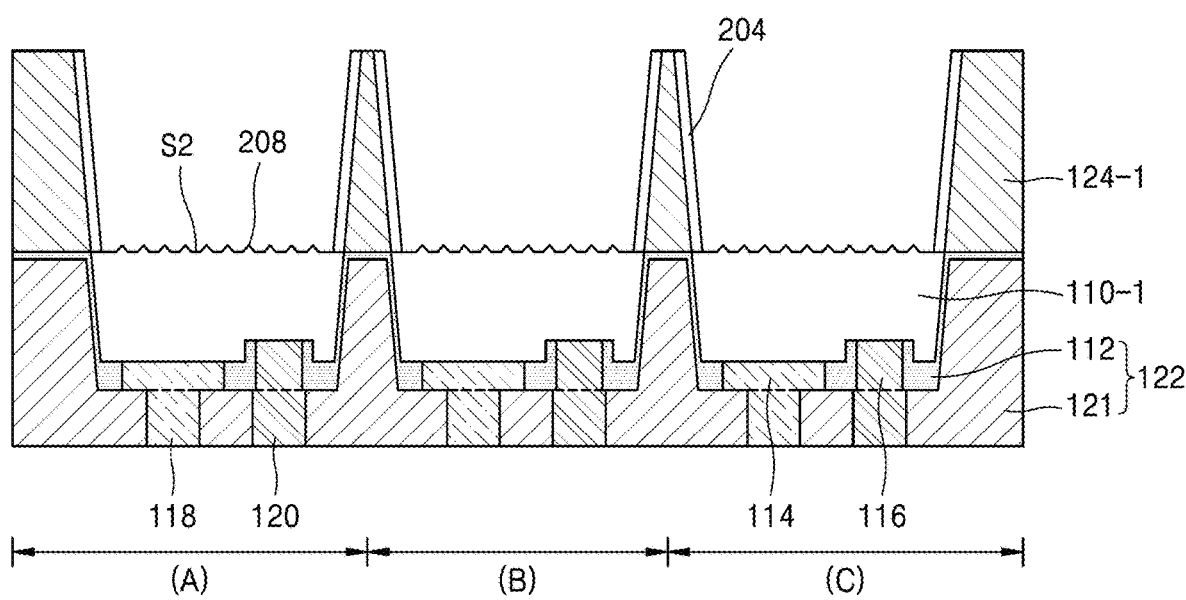

FIGS. 14A through 14C are sectional diagrams for describing a method of fabricating the LED device 400 of FIG. 9. The method shown in FIG. 14A through 14C may be identical to the method shown in FIGS. 12A through 12I except that a sidewall of the partition layer 124-1 is the sloped sidewall 206 and the uneven structure 208 is formed on a surface of the light-emitting structure 110. Therefore, descriptions identical to those given above with reference to FIG. 9 and FIGS. 12A through 12I will be omitted or briefly given.

As described above with reference to FIGS. 12A through 12F, the partition layer 124-1 including the second exposing holes 126 that expose the surfaces S2 of the light-emitting structures 110 is formed. The second exposing holes 126 may include the second sub-exposing hole 126a, the second sub-exposing hole 126b, and the second sub-exposing hole 126c corresponding to the light-emitting cells A, B, and C, respectively.

As shown in FIG. 14A, during the formation of the partition layer 124-1, a sidewall of the partition layer 124-1 is formed as the sloped sidewall 206 unlike in FIG. 12F. Due to the sloped sidewall 206, a diameter of the space surrounded by the sloped sidewall 206 may increase in a direction in which light travels (that is, upward). Therefore, light extraction efficiency of the LED device 400 may be improved.

As shown in FIG. 14B, the light reflecting material layer 202 is formed on the second exposing holes 126 and a surface of the partition layer 124-1. The light reflecting material layer 202 is formed to completely cover top surfaces of the light-emitting structure 110 and the side surfaces and the top surface of the partition layer 124. The light reflecting material layer 202 may be a material layer that reflects light well.

As shown in FIG. 14B, the light reflecting layer 204 is formed on a sidewall of the partition layer 124-1 by selectively etching the light reflecting material layer 202. If and/or when the light reflecting material layer 202 is etched, the light reflecting material layer 202 formed on the surface of the light-emitting structure 110 may be removed. Since a material at least partially comprising the light reflecting layer 204 is described above, detailed description thereof will be omitted. Next, the uneven structure 208 is formed by etching the surface S2 (e.g., the top surface) of the light-emitting structure 110. The uneven structure 208 is formed to improve an efficiency for extracting light emitted by the light-emitting structure 110.

Next, as shown in FIGS. 12G through 12I, the LED device 400 (FIG. 9) may be completed by forming the phosphor layers 128, 130, and 132 in the second exposing holes 126.

FIGS. 15A through 15D are sectional diagrams for describing a method of fabricating a LED device according to some example embodiments.

In detail, FIGS. 15A through 15D are sectional diagrams for describing a method of fabricating the LED device 500 of FIG. 10. The method shown in FIGS. 15A through 15D may be identical to the method shown in FIGS. 12A through 12I except the light-emitting structure 110-1 including the uneven structure 208, the separation layer 122-1 including the metal layer 113, and the partition layer 124-2 including a light reflecting structure. Therefore, descriptions identical to those given above with reference to FIG. 10 and FIGS. 12A through 12I will be omitted or briefly given.

Figure 15A:
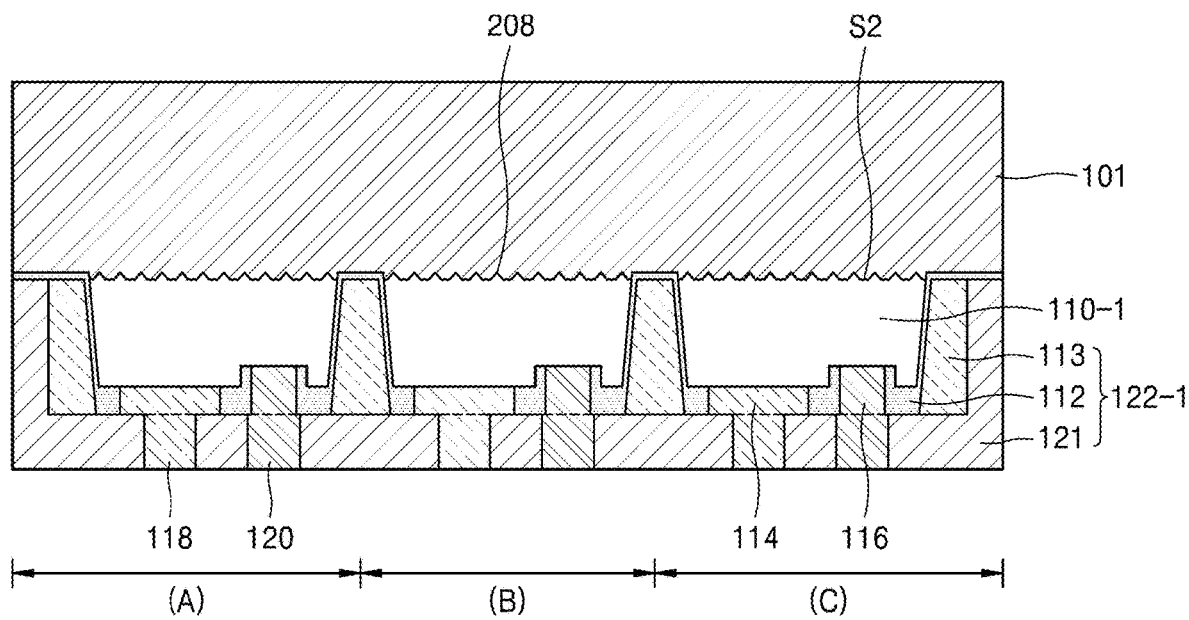
FIGS. 15A-D are sectional views for describing a method of fabricating a LED device according to some example embodiments.

As described above with reference to FIGS. 12A through 12I, the light-emitting structures 110-1 and the separation layer 122-1 that electrically separates the light-emitting structures 110-1 are formed. However, as shown in FIG. 15A, the uneven structure 208 is formed on the surfaces S2 (e.g., the top surfaces) of the light-emitting structures 110-1. If and/or when a corresponding uneven structure is formed on the substrate 101, the uneven structure 208 may be formed on the light-emitting structure 110-1 in correspondence to the uneven structure formed on the substrate 101.

The separation layer 122-1 may include the separating insulation layer 112 that is formed on the two opposite sidewalls and the bottom surface of the light-emitting structure 110-1, the metal layer 113 that is insulated from the light-emitting structure 110-1 by the separating insulation layer 112, and the mold insulation layer 121 that insulates between the electrode layers 118 and 120 and the metal layer 113.

Figure 15B:
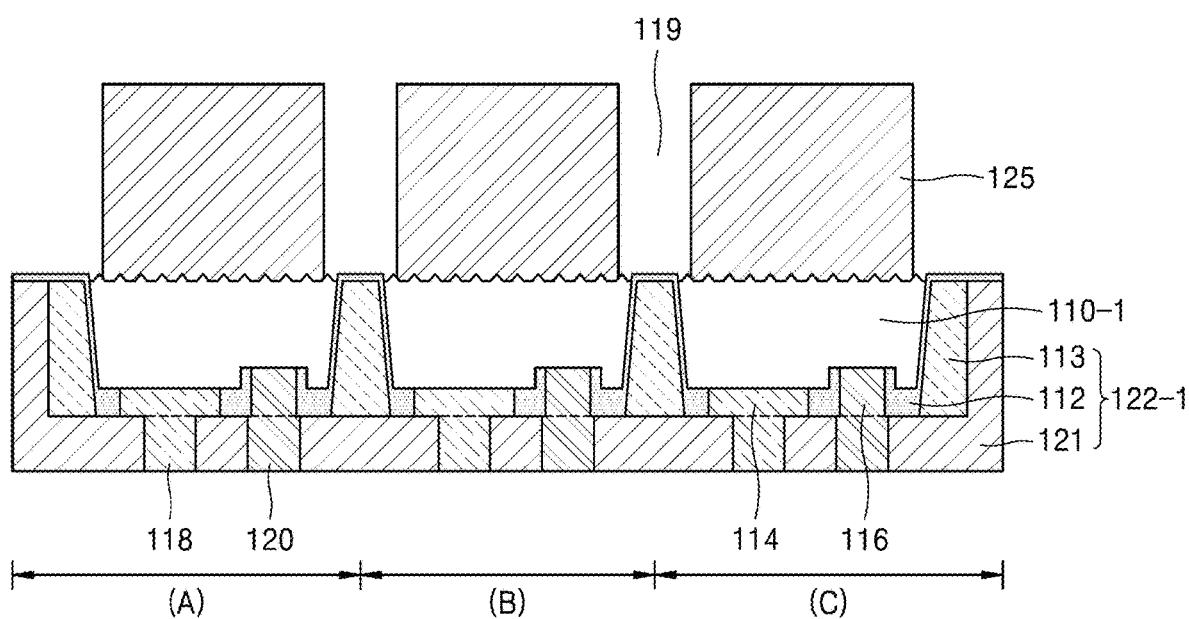

Referring to FIG. 15B, a substrate sacrificing layer 125 including a separating exposing hole 119 that exposes the separation layer 122-1 is formed by etching the substrate 101. The substrate sacrificing layer 125 may be formed on the light-emitting structures 110. The substrate sacrificing layer 125 may include a silicon substrate or an insulation substrate.

Figure 15C:
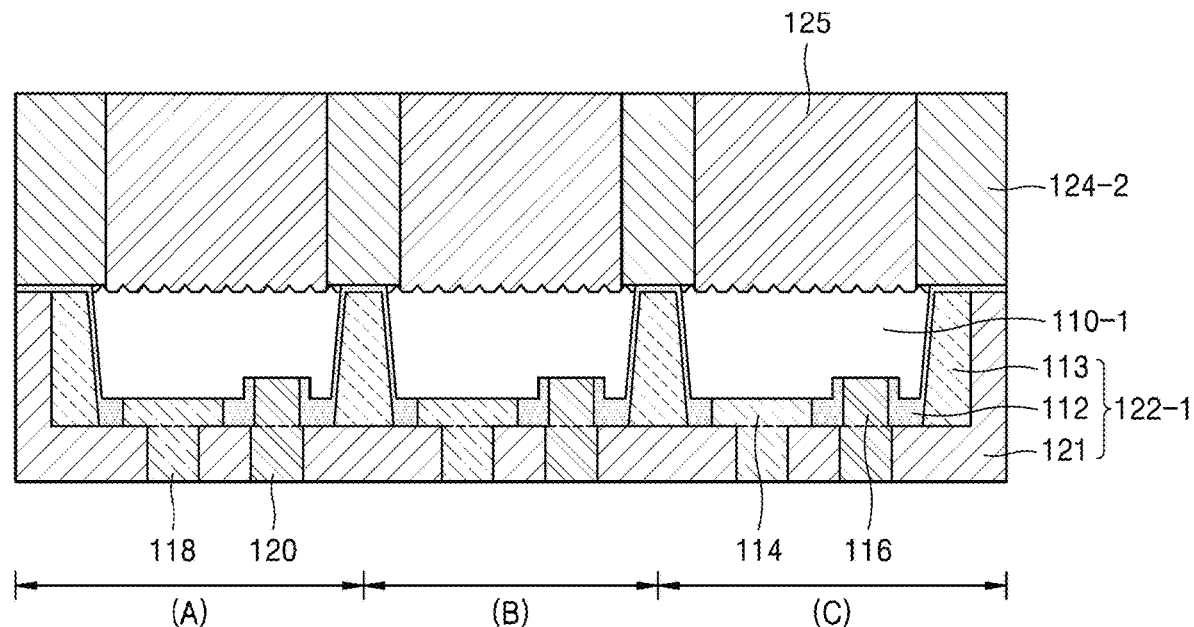
Figure 15D:
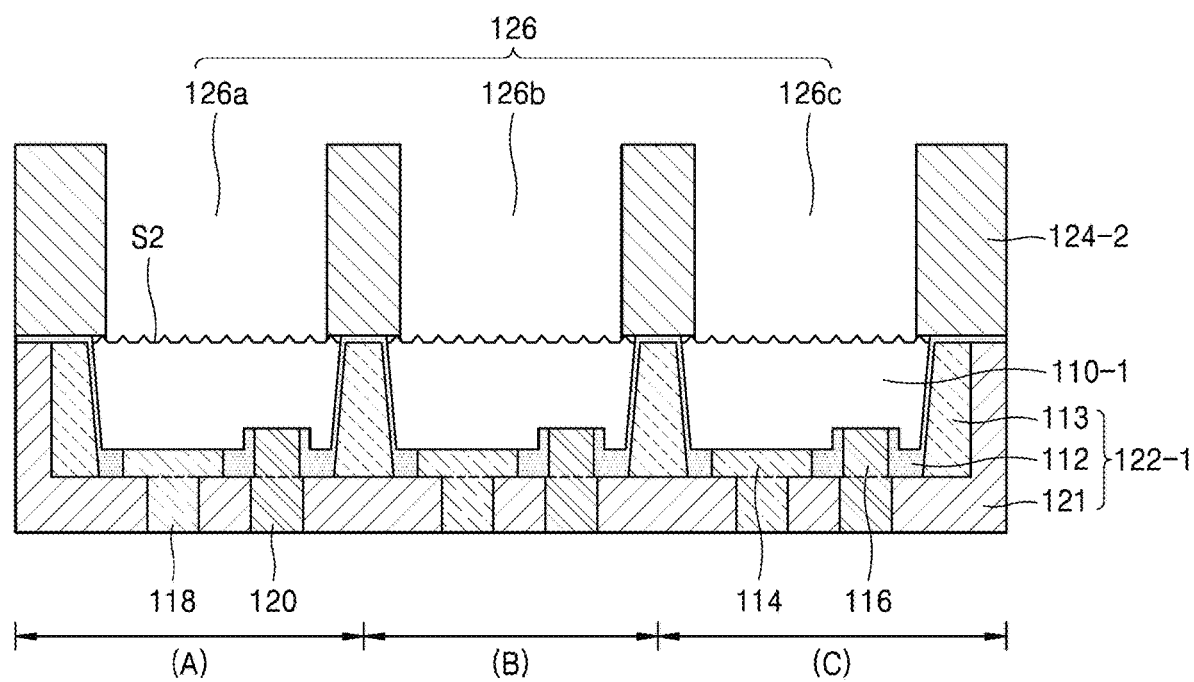

Referring to FIGS. 15C and 15D, the partition layer 124-2 including a light reflecting material layer is formed in the separating exposing hole 119 as shown in FIG. 15C. The partition layer 124-2 may include a single body. The light reflecting material layer may be a metal layer, a resin layer containing a metal oxide, or a distributed Bragg reflection layer. The light reflecting material layer may include a material as described above. The partition layer 124-2 may be formed to fill the separating exposing hole 119 on the separation layer 122-1.

As shown in FIG. 15D, the partition layer 124-2 including the second exposing holes 126 that expose the surfaces S2 of the light-emitting structures 110 is formed by removing the substrate sacrificing layer 125. As described above, the partition layer 124-2 may include a light reflecting structure. The second exposing holes 126 may include the second sub-exposing hole 126a, the second sub-exposing hole 126b, and the second sub-exposing hole 126c corresponding to the light-emitting cells A, B, and C, respectively.

Next, as shown in FIGS. 12G through 12I, the LED device 500 (FIG. 10) may be completed by forming the phosphor layers 128, 130, and 132 in the second exposing holes 126.

Figure 16B:
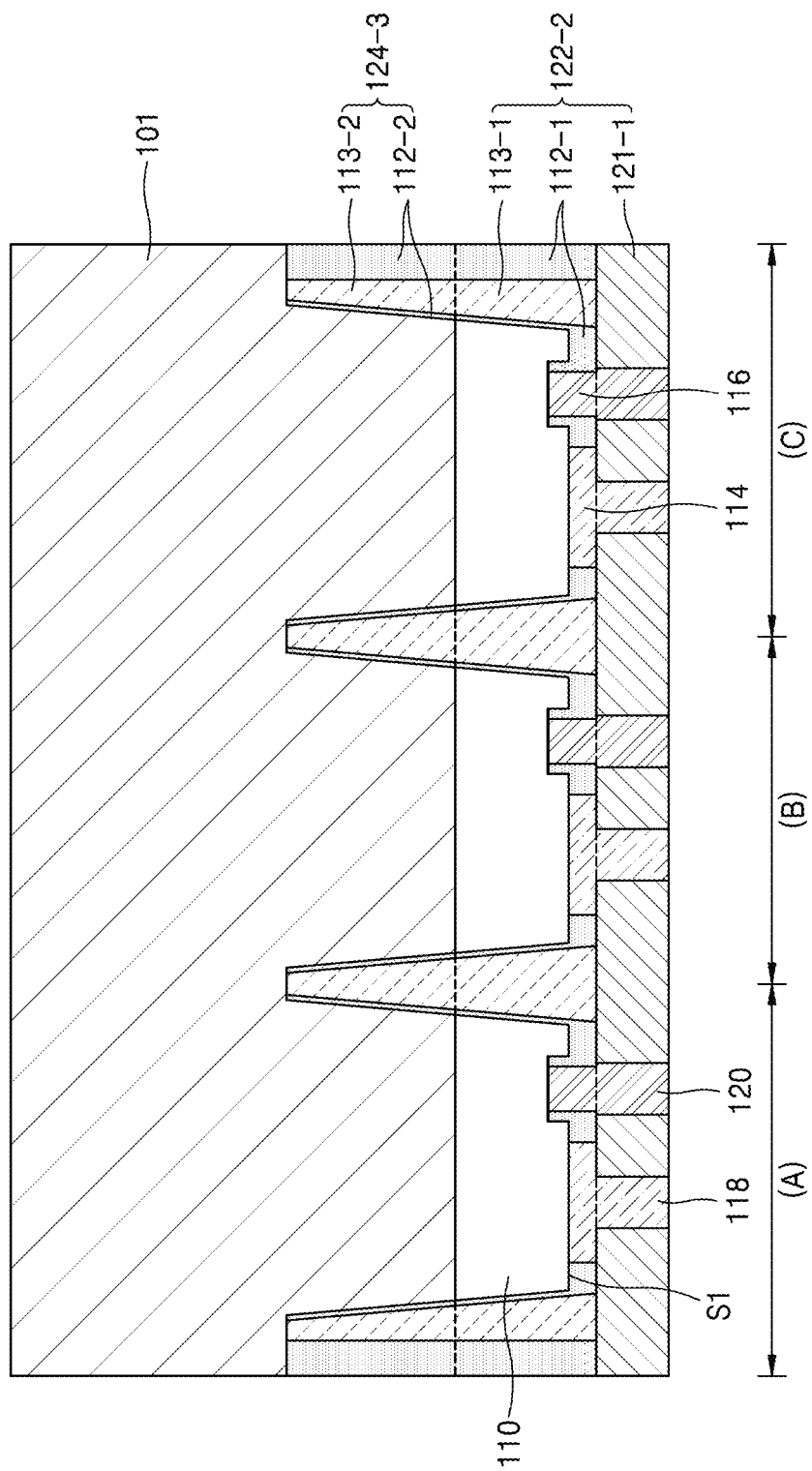
Figure 16C:
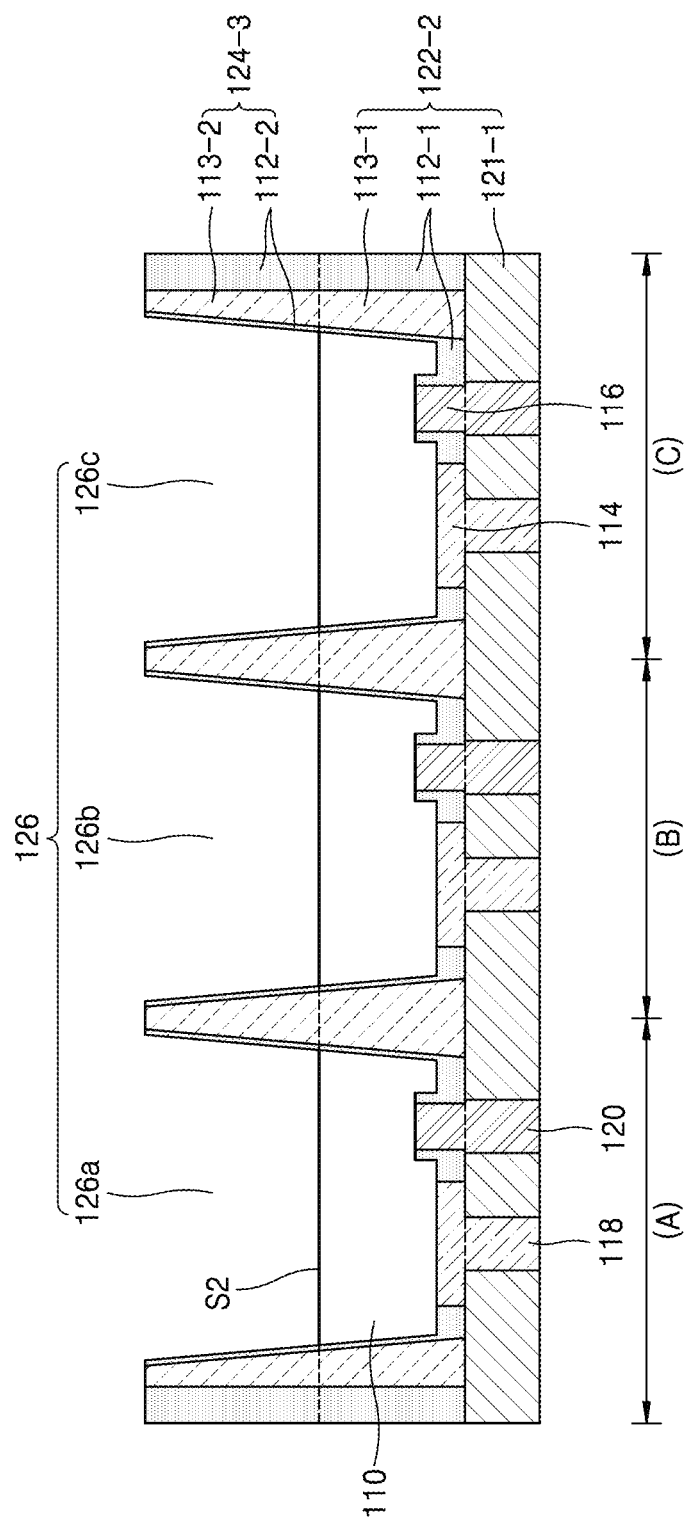

FIGS. 16A through 16C are sectional diagrams for describing a method of fabricating a LED device according to some example embodiments.

In detail, FIGS. 16A through 16C are sectional diagrams for describing a method of fabricating the LED device 600 of FIG. 11. The method shown in FIGS. 16A through 16C may be identical to the method shown in FIGS. 12A through 12I except the structures of the separation layer 122-2 and the partition layer 124-3.

The LED device 600 of FIG. 11 may be identical to the LED device 500 of FIG. 10 except the partition layer 124-3 including the second metal layer 113-2. Therefore, descriptions identical to those given above with reference to FIG. 11 and FIGS. 12A through 12I will be omitted or briefly given.

As shown in FIG. 16A, the light-emitting structures 110 are formed on the substrate 101 and a separation hole 109-1 separating the light-emitting structures 110 from one another is formed. Unlike in FIG. 12B, the separation hole 109-1 is also formed in the substrate 101 to a certain depth. A contact hole 107 may be formed in the light-emitting structure 110, such that a second electrode layer 120 is connected to a second conductive type semiconductor layer.

Referring to FIGS. 16B and 16C, the reflective layers 114 and 116 and the electrode layers 118 and 120 are formed on the surfaces S1 of the light-emitting structures 110 as shown in FIG. 16B. Next, the separation layer 122-2 and the partition layer 124-3 are simultaneously formed in the separation hole 109-1. For convenience of explanation, the separation layer 122-2 will be described below with reference to FIG. 16B, whereas the partition layer 124-3 will be described below with reference to FIG. 16C.

As shown in FIG. 16B, the separation layer 122-2 is formed to fill the separation hole 109-1. The separation layer 122-2 is formed to electrically insulate between the light-emitting structures 110 and between the reflective layers 114 and 116 and the electrode layers 118 and 120.

The separation layer 122-2 may include the separating insulation layer 112-1 that is formed on the two opposite sidewalls and the bottom surface of the light-emitting structure 110, the first metal layer 113-1 that is insulated from the light-emitting structure 110 by the separating insulation layer 112-2, and the mold insulation layer 121-1 that insulates between the electrode layers 118 and 120. The mold insulation layer 121-1 may be formed after the second separating insulation layer 112-2 and the first metal layer 113-1 are formed. The first metal layer 113-1 may reflect light emitted by the light-emitting structures 110.

As shown in FIG. 16C, the second exposing holes 126 exposing the surfaces S2 of the light-emitting structures 110 by removing the substrate 101. The second exposing holes 126 may include the second sub-exposing hole 126a, the second sub-exposing hole 126b, and the second sub-exposing hole 126c corresponding to the light-emitting cells A, B, and C, respectively.

Referring back to FIG. 11, the plurality of phosphor layers 128, 130, and 132 having different colors are formed in the second exposing holes 126 in correspondence to the light-emitting structures 110, respectively. If and/or when the phosphor layers 128, 130, and 132 are formed, the partition layer 124-3 may be formed between the phosphor layers 128, 130, and 132 to separate the phosphor layers 128, 130, and 132 from one another. The second separating insulation layer 112-2 and the second metal layer 113-2 respectively extending from the first separating insulation layer 112-1 and the first metal layer 113-1 may be formed on a side surface of each of the phosphor layers 128, 130, and 132. The second separating insulation layer 112-2 and the second metal layer 113-2 may at least partially comprise the above-stated partition layer 124-3.

As described above, the partition layer 124-3 may include the metal layer 113 capable of reflecting light and may be referred to as a light reflecting structure. As described above, the partition layer 124-3 may include the second separating insulation layer 112-2 and may be referred to as an insulation structure. The partition layer 124-3 may include a single body.

The first separating insulation layer 112-1 and the first metal layer 113-1 may be combined with the second separating insulation layer 112-2 and the second metal layer 113-2 in the fabrication operation shown in FIG. 16B. If and/or when the phosphor layers 128, 130, and 132 are formed, the first separating insulation layer 112-1, the first metal layer 113-1, the first separating insulation layer 112-1, and the second metal layer 113-2 may be combined with one another to form the second separating insulation layer 112-2 and the partition layer 124-3.

Next, the LED device 600 may be completed in the fabrication operations as shown in FIGS. 12H and 12I.

Figure 17:
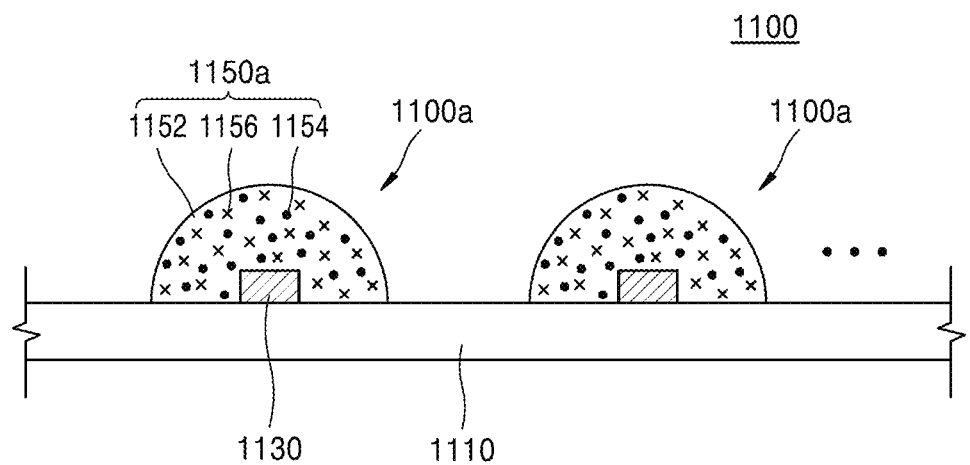
FIG. 17 is a sectional view of a white light source module including a LED device according to some example embodiments.
Figure 18:
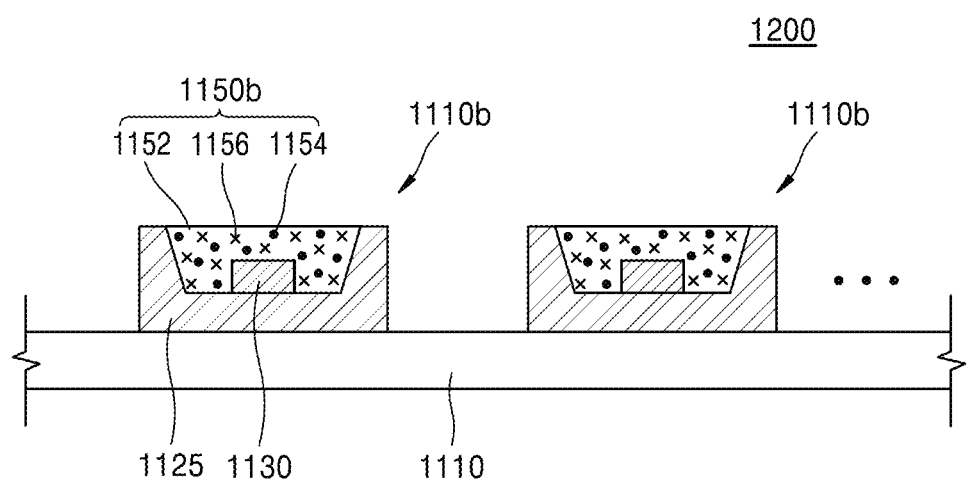
FIG. 18 is a sectional view of a white light source module including a LED device according to some example embodiments

FIGS. 17 and 18 are schematic sectional views of a white light source module including a LED device according to some example embodiments.

Referring to FIG. 17, a LCD backlight light source module 1100 may include a circuit board 1110 and an array including a plurality of white LED devices 1100a mounted on the circuit board 1110. A conductive pattern to be connected to the white LED devices 1100a may be disposed on the top surface of the circuit board 1110.

Each of the white LED devices 1100a may have a structure in which a LED device 1130 emitting blue light is directly mounted on the circuit board 1110 as a chip on board (COB). The LED device 1130 may be at least any one of the LED devices 100 through 600 according to any example embodiments encompassed herein. Each of the white LED devices 1100a may have a hemispheric shape that a wavelength transformer 1150a functions as a lens, thereby exhibiting a wide beam opening angle. Such a wide beam opening angle may contribute to reduction of the thickness or the width of a LCD display apparatus.

Referring to FIG. 18, a LCD backlight light source module 1200 may include the circuit board 1110 and an array including a plurality of white LED devices 1100b mounted on the circuit board 1110. Each of the white LED devices 1100b may include a LED device 1130 that is mounted inside a reflective cup of a package main unit 1125 and emits blue light and a wavelength transformer 1150b that encapsulates the LED device 1130. The LED device 1130 may be at least any one of the LED devices 100 through 600 according to any example embodiments encompassed herein.

The wavelength transformers 1150a and 1150b may include a phosphor and/or wavelength transforming materials 1152, 1154, and 1156 as an occasion demands. Detailed description thereof will be given below.

Figure 19A:
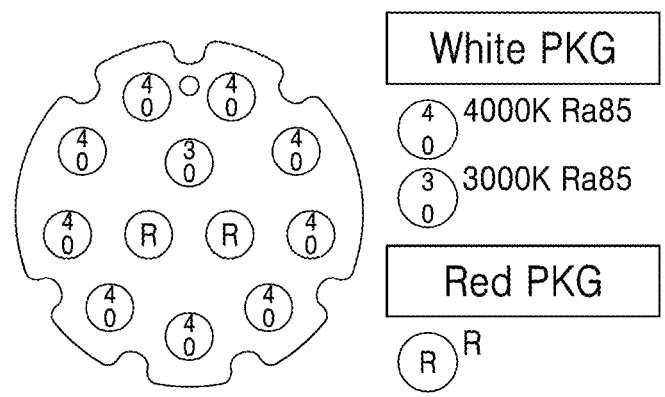
FIGS. 19A-B illustrate a white light source module that is a LED device according to some example embodiments and may be used in an illuminating apparatus.
Figure 19B:
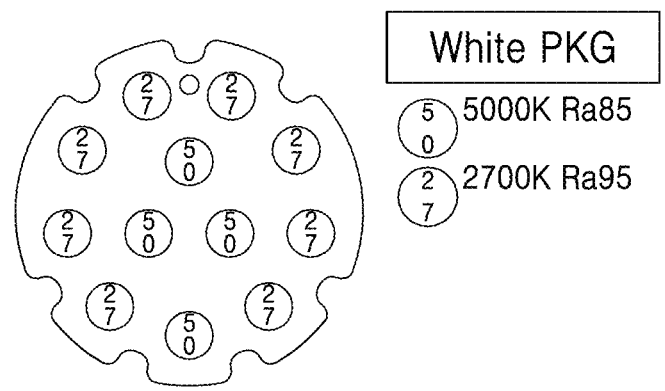
Figure 20:
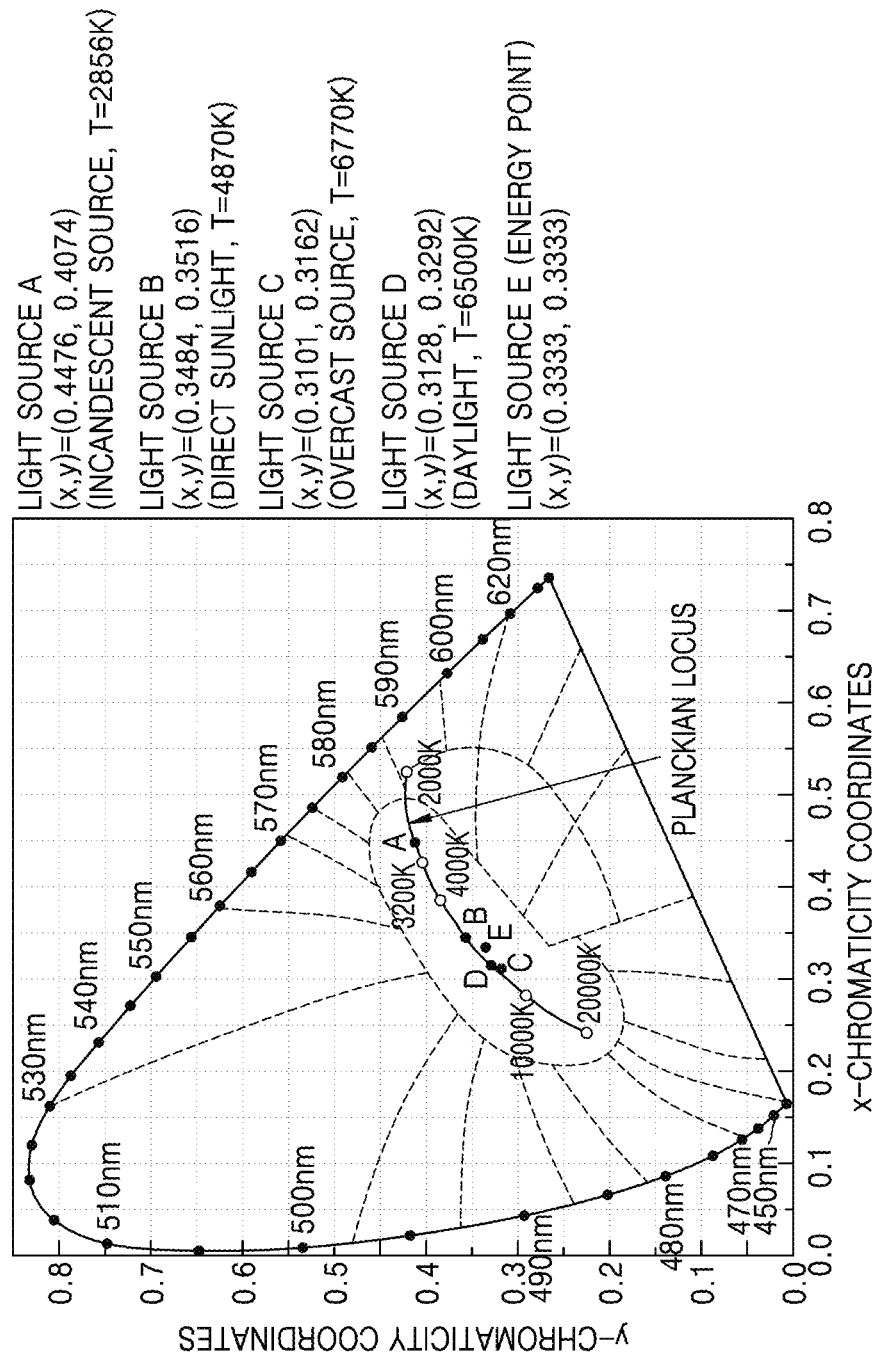
FIG. 20 is a CIE chromaticity diagram showing perfect radiator spectrums of a LED device fabricated according to some example embodiments.

FIGS. 19A-B illustrate a white light source module, that is, a LED device according to some example embodiments, which may be used in an illuminating apparatus, and FIG. 20 is a CIE chromaticity diagram showing perfect radiator spectrums of a LED device fabricated according to some example embodiments.

In detail, each of the light source modules shown in FIGS. 19A and 19B may include a plurality of LED device packages 30, 40, RED, 27, and 50. The LED device packages 30, 40, RED, 27, and 50 may include at least any one of the LED devices 100 through 600 according to any example embodiments encompassed herein. A plurality of LED device packages mounted on a single light source module may include homogeneous packages emitting light beams of a same wavelength or heterogeneous packages emitting light beams of different wavelengths.

Referring to FIG. 19A, a white light source module may include a combination of white LED device packages 40 and 30 respectively corresponding to color temperatures of 4000K and 3000K and a red LED device package RED. A white light source module may provide white light that exhibits a color temperature from 3000K to 4000K and a color rendition Ra from 85 to 100.

In some example embodiments, a white light source module may include only white LED device packages, where some of the white LED device packages may emit white light corresponding to a different color temperature. For example, as shown in FIG. 19B, by combining white LED device packages 27 corresponding to the color temperature 2700K and white LED device packages 50 corresponding to the color temperature 5000K, white light that exhibits a color temperature from 2700K to 5000K and a color rendition Ra from 85 to 99 may be provided. Here, the number of LED device packages for each color temperature may vary mainly based on a default color temperature. For example, in case of an illumination apparatus of which the default color temperature is 4000K, the number of LED device packages corresponding to the color temperature 4000K may be greater than the number of LED device packages corresponding to the color temperature 3000K or the number of red LED device packages.

Accordingly, heterogeneous LED device packages may include a LED device that emits white light based on a combination of a blue LED device with a yellow, green, red, or orange LED phosphor, a purple LED device, a blue LED device, a green LED device, a red LED device, or an infrared (e.g., light having a wavelength of about 700 nm to about 1 mm) light-emitting device to adjust the color temperature and the color rendition index (CRI) of white light.

In a single LED device package, light of a desired color may be determined based on the wavelength of a LED chip, that is, a LED device, and a type and a mixing proportion of a phosphor. If and/or when the single LED device package emits white light, the color temperature and the CRI of the white light may be adjusted.

For example, if a LED chip emits blue light, a LED device package comprising at least one of a yellow phosphor, a green phosphor, and a red phosphor may emit white light of various color temperatures according to mix proportions of the phosphor. On the contrary, a LED device package including a blue LED chip having applied thereto a green phosphor or a red phosphor may emit green light or red light. Accordingly, the color temperature and the CRI of white light may be adjusted by combining a LED device package emitting white light and a LED device package emitting green light or red light. Furthermore, LED device packages may include at least one of a purple LED device, a blue LED device, a green LED device, a red LED device, or an infrared ray emitting device.

In this case, an illumination apparatus may adjust the CRI of emitted light from the CRI corresponding to sodium (Na) to a CRI corresponding to the sunlight and may emit white light of various color temperatures from 1500K to 20000K. If necessary, a color of light emitted by the illumination apparatus may be adjusted in correspondence to a surrounding atmosphere or a mood by emitting a visible ray, such as purple light, blue light, green light, red light, and orange light, or an infrared ray. Furthermore, the illumination apparatus may emit light of a special wavelength that may promote growth of a plant.

White light generated by combining a blue LED device with yellow, green, and red phosphors and/or green and red phosphors has two or more peak wavelengths that may be located inside a segment area defined by (x, y) coordinates of the CIE 1931 coordinates system including (0.4476, 0.4074), (0.3484, 0.3516), (0.3101, 0.3162), (0.3128, 0.3292), and (0.3333, 0.3333) as shown in FIG. 20. Alternatively, the peak wavelengths may be located inside an area surrounded by line segments and a black body radiation spectrum. Color temperature of white light is between 1500K and 20000K. In FIG. 20, white light nearby the point E (0.3333, 0.3333) below the black body radiation spectrum (Planckian locus) is light with relatively weak yellow light ingredients and may be used as an illumination light source for providing a relatively clear or fresh picture to the human eyes. Therefore, an illumination apparatus using white light nearby the point E (0.3333, 0.3333) below the black body radiation spectrum (Planckian locus) may be effective as an illumination apparatus for a food store or a clothing store.

Meanwhile, various materials including phosphors and/or quantum dots (QDs) may be used as materials for transforming wavelength of light emitted by a semiconductor LED device.

Phosphors may have compositions and colors as shown below.

Oxide-based: Yellow and Green $Y_3Al_5O_{12}$:Ce, $Tb_3Al_5O_{12}$:Ce, $Lu_3Al_5O_{12}$:Ce Silicate-based: Yellow and Green $(Ba,Sr)_2SiO_4$:Eu, Yellow and Orange $(Ba,Sr)_3SiO_5$:Ce Nitride-based: Green reSiAlON:Eu, Yellow $La_3Si_6Ni_{11}$:Ce, Orange αrSiAlON:Eu, Red $CaAlSiN_3$:Eu, $Sr_2Si_5Ns$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ $(0.5 \leq x \leq 3, 0<z<0.3, 0<y\leq 4)$—Equation (1)

Here, in Equation (1), Ln may be at least one atom selected from a group consisting of Group IIIa atoms and rare-earth atoms, whereas M may be at least one atom selected from a group consisting of Ca, Ba, Sr, and Mg.

Fluoride-based: KSF-based Red $K_2SiF_6$:$Mn_{4+}$, $K_2TiF_6$:$Mn_{4+}$, $NaYF_4$:$Mn_{4+}$, $NaGdF_4$:$Mn_{4+}$, $K_3SiF_7$:$Mn_{4+}$ A composition of a phosphor may satisfy the stoichiometry, where each atom may be substituted by another atom in a corresponding group in the periodic table. For example, Sr may be substituted by an alkaline-earth (group II) element including Ba, CA, and Mg, whereas Y may be substituted by a lanthanide including Tb, Lu, Sc, and Gd. Furthermore, Eu, which is an activator, may be substituted by Ce, Tb, Pr, Er, or Yb based on a desired level, where an activator may be used alone or a sub-activator may be additionally applied for changing characteristics of a phosphor.

In particular, a fluoride-based red phosphor may be coated with a fluoride without Mn or may further include an organic material coat on the surface of the phosphor or the surface coated with a fluoride without Mn for improved reliability against high temperatures and high humidity. Unlike other phosphors, a fluoride-based red phosphor as described above may exhibit a small half-width below or equal to 40 nm, and thus the fluoride-based red phosphor may be applied to a high-resolution TV, such as an ultra high-definition (UHD) TV.

Table 1 below shows types of phosphors categorized according to fields of application of white LED devices employing a blue LED chip (440 nm to 460 nm) or an UV LED chip (380 nm to 440 nm).

TABLE 1

| Usage | Phosphor | Usage | Phosphor |
|---|---|---|---|
| LED TV BLU | β-SiAlON:$Eu^{2+}$ | Side View | $Lu_3Al_5O_{12}$:$Ce^{3+}$ |
| | (Ca,Sr)AlSiN$_3$:$Eu^{2+}$ | (Mobile, Note PC) | Ca-α-SiAlON:$Eu^{2+}$ |
| | $La_3Si_6N_{11}$:$Ce^{3+}$ | | $La_3Si_6N_{11}$:$Ce^{3+}$ |
| | $K_2SiF_6$:$Mn^{4+}$ | | (Ca,Sr)AlSiN$_3$:$Eu^{2+}$ |
| | $SrLiAl_3N_4$:Eu | | $Y_3Al_5O_{12}$:$Ce^{3+}$ |
| | $Ln_{4-x}(Eu_zM_{1-z})_xSi_{12-y}Al_yO_{3+x+y}N_{18-x-y}$ | | (Sr,Ba,Ca,Mg)$_2$SiO$_4$:$Eu^{2+}$ |
| | $(0.5 \leq x \leq 3, 0 < z < 0.3, 0 <y \leq 4)$ | | $K_2SiF_6$:$Mn^{4+}$ |

TABLE 1-continued

| Usage | Phosphor | Usage | Phosphor |
|---|---|---|---|
| | $K_2TiF_6$:$Mn^{4+}$ | | $SrLiAl_3N_4$:Eu |
| | $NaYF_4$:$Mn^{4+}$ | | $Ln_{4-x}(Eu_zM_{1-z})_xSi_{12-y}Al_yO_{3+x+y}N_{18-x-y}$ |
| | $NaGdF_4$:$Mn^{4+}$ | | ($0.5 \leq x \leq 3, 0 < z < 0.3, 0 < y \leq 4$) |
| | | | $K_2TiF_6$:$Mn^{4+}$ |
| | | | $NaYF_4$:$Mn^{4+}$ |
| | | | $NaGdF_4$:$Mn^{4+}$ |
| Illumination | $Lu_3Al_5O_{12}$:$Ce^{3+}$ | Electrical Component (Head Lamp, etc.) | $Lu_3Al_5O_{12}$:$Ce^{3+}$ |
| | Ca-α-SiAlON:$Eu^{2+}$ | | Ca-α-SiAlON:$Eu^{2+}$ |
| | $La_3Si_6N_{11}$:$Ce^{3+}$ | | $La_3Si_6N_{11}$:$Ce^{3+}$ |
| | (Ca,Sr)AlSiN$_3$:$Eu^{2+}$ | | (Ca,Sr)AlSiN$_3$:$Eu^{2+}$ |
| | $Y_3Al_5O_{12}$:$Ce^{3+}$ | | $Y_3Al_5O_{12}$:$Ce^{3+}$ |
| | $K_2SiF_6$:$Mn^{4+}$ | | $K_2SiF_6$:$Mn^{4+}$ |
| | $SrLiAl_3N_4$:Eu | | $SrLiAl_3N_4$:Eu |
| | $Ln_{4-x}(Eu_zM_{1-z})_xSi_{12-y}Al_yO_{3+x+y}N_{18-x-y}$ | | $Ln_{4-x}(Eu_zM_{1-z})_xSi_{12-y}Al_yO_{3+x+y}N_{18-x-y}$ |
| | ($0.5 \leq x \leq 3, 0 < z < 0.3, 0 < y \leq 4$) | | ($0.5 \leq x \leq 3, 0 < z < 0.3, 0 < y \leq 4$) |
| | $K_2TiF_6$:$Mn^{4+}$ | | $K_2TiF_6$:$Mn^{4+}$ |
| | $NaYF_4$:$Mn^{4+}$ | | $NaYF_4$:$Mn^{4+}$ |
| | $NaGdF_4$:$Mn^{4+}$ | | $NaGdF_4$:$Mn^{4+}$ |

Furthermore, wavelength transformers may include wavelength transforming materials such as QDs, replacing the phosphor or mixed with the phosphor.

Figure 21:
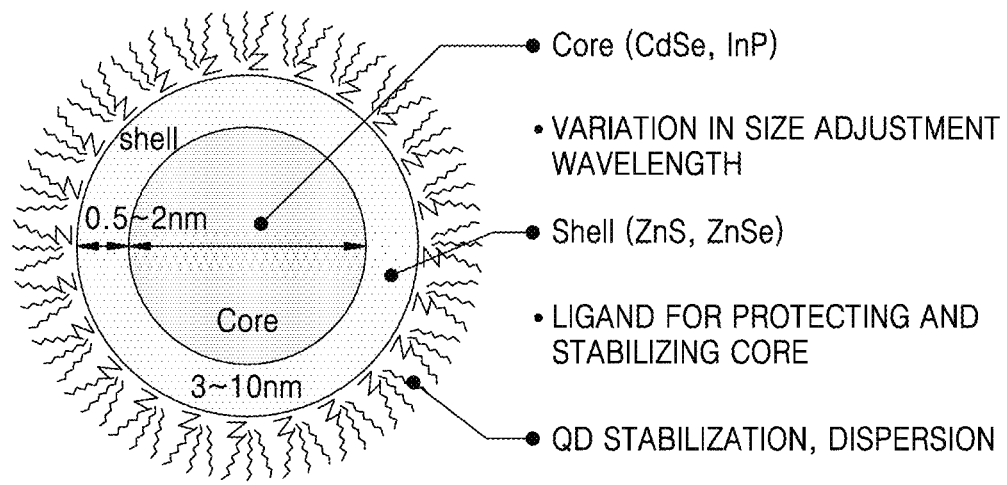
FIG. 21 is a cross-sectional view of a quantum dot (QD), which is a wavelength transforming materials that may be applied to a LED device according to some example embodiments.

FIG. 21 is a schematic cross-sectional view of a QD, which is a wavelength transforming material that may be applied to a LED device according to some example embodiments.

In detail, the QD may include a group III-V compound semiconductor or a group II-VI compound semiconductor and have a core-shell structure. For example, the QD may have a core including CdSe or InP and a shell including ZnS or ZnSe. Furthermore, the QD may have a ligand for stabilization of the core and the shell. For example, the diameter of the core may be from about 1 nm to about 30 nm (preferably, from about 3 nm to about 10 nm), whereas the thickness of the shell may be from about 0.1 nm to about 20 nm (preferably, from about 0.5 nm to about 2 nm).

The QD may embody various colors based on the size thereof. In particular, when the QD is used to substitute a phosphor, the QD may be used as a red phosphor or a green phosphor. If and/or when the QD is used to substitute a phosphor, a small half-width (e.g., about 35 nm) may be embodied.

The wavelength transforming material may be contained in an encapsulating element or may be fabricated as a film-like element and attached to a surface of an optical structure, such as a LED chip or a light guiding plate. In this case, the wavelength transforming material may have a uniform thickness and be easily applied to a desired area.

Figure 22:
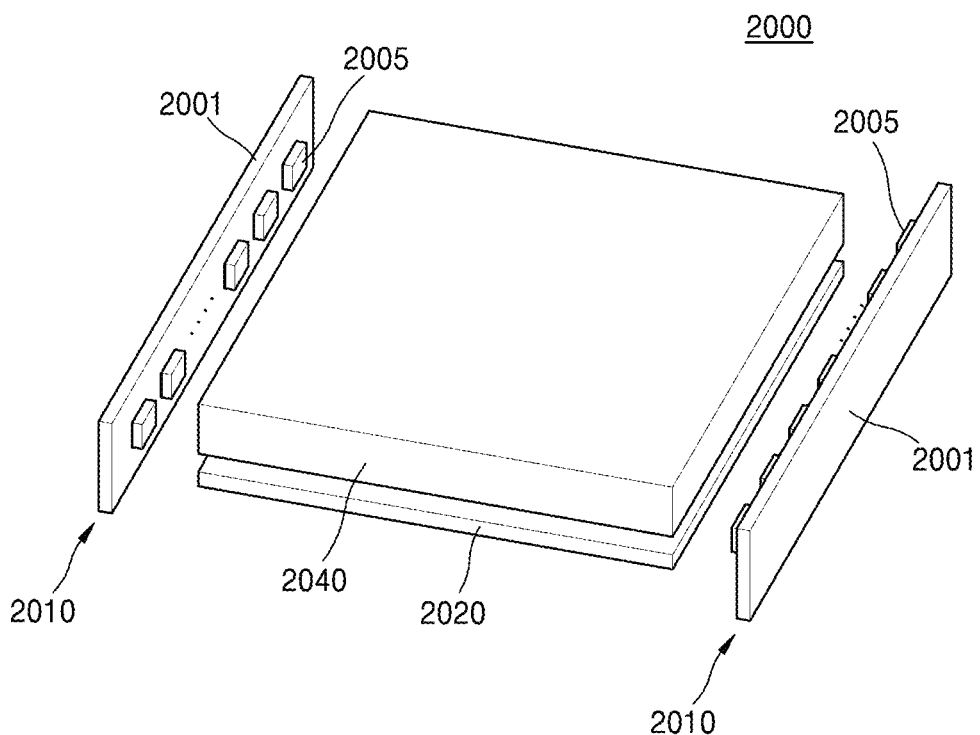
FIG. 22 is a perspective view of a backlight unit including a LED device according to some example embodiments.

FIG. 22 is a schematic perspective view of a backlight unit including a LED device according to some example embodiments.

In detail, a backlight unit 2000 may include a light guiding panel 2040 and light source modules 2010 provided at both sides of the light guiding panel 2040. Furthermore, the backlight unit 2000 may further include a reflective panel 2020 disposed below the light guiding panel 2040. The backlight unit 2000 according to the present embodiment may be an edge-type backlight unit. According to some embodiments, the light source module 2010 may be provided only at one side of the light guiding panel 2040 or the additional light source module 2010 may be provided at another side of the light guiding panel 2040. The light source module 2010 may include a printed circuit board 2001 and a plurality of light sources 2005 mounted on the top surface of the printed circuit board 2001. The light sources 2005 may include at least any one of the LED devices 100 through 600 according to the above embodiments.

Figure 23:
FIG. 23 illustrates a direct type backlight unit including a LED device according to some example embodiments.

FIG. 23 is a diagram showing a direct type backlight unit including a LED device according to some example embodiments.

In detail, a backlight unit 2100 may include a light diffusing plate 2140 and a light source module 2110 disposed below the light diffusing plate 2140. Furthermore, the backlight unit 2100 may further include a bottom case 2160 that is disposed below the light diffusing plate 2140 and accommodates the backlight unit 2100. The backlight unit 2100 according to the present embodiment may be a direct type backlight unit.

The light source module 2110 may include a printed circuit board 2101 and a plurality of light sources 2105 mounted on the top surface of the printed circuit board 2101. The light sources 2105 may include at least any one of the LED devices 100 through 600 according to the above embodiments.

Figure 24:
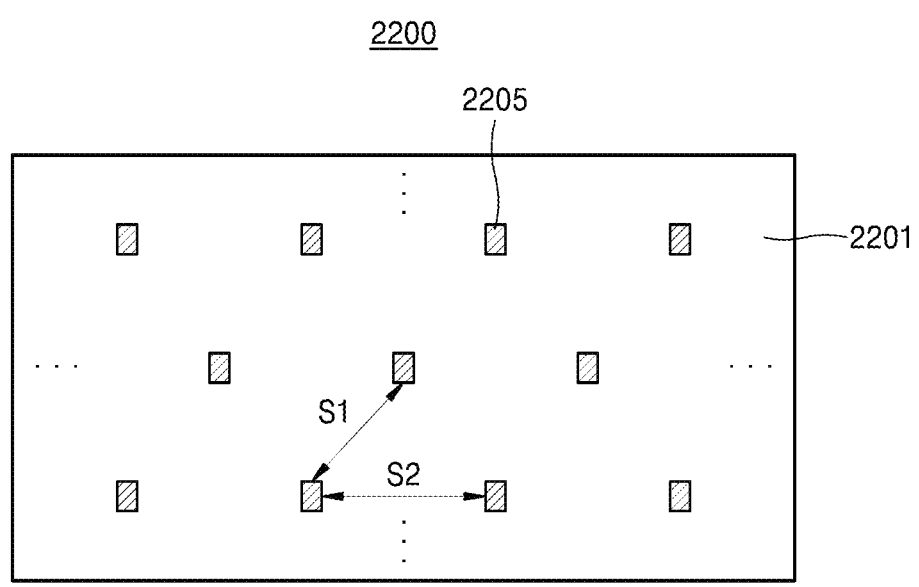
FIG. 24 illustrates a direct type backlight unit including a LED device according to some example embodiments.

FIG. 24 is a diagram showing a direct type backlight unit including a LED device according to some example embodiments.

In detail, FIG. 24 shows an example arrangement of light sources 2205 in a direct type backlight unit 2200. The light sources 2205 may include at least any one of the LED devices 100 through 600 according to the above embodiments.

The direct type backlight unit 2200 according to the present embodiment includes the plurality of light sources 2205 disposed on a substrate 2201. The light sources 2205 at least partially comprise a matrix including rows and columns, wherein the rows and columns are arranged in zigzag. In other words, a second matrix having the same structure as a first matrix is arranged in the first matrix including the plurality of light sources 2205 arranged linearly in rows and columns, wherein the light sources 2205 of the second matrix are located inside a rectangle including the four light sources 2205 of the first matrix adjacent to one another.

However, in order to further improve uniformity of brightness and optical efficiency of the direct type backlight unit 2200, the arrangement structure and intervals of the first and second matrixes may be changed. Furthermore, distances S1 and S2 between adjacent light sources may be adjusted to secure uniformity of brightness. As described above, as rows and columns including the light sources 2205 are disposed zigzag instead of disposing in the linear fashion, the number of the light sources 2205 may be reduced by from about 15% to about 25% with respect to a same light emitting area.

Figure 25:
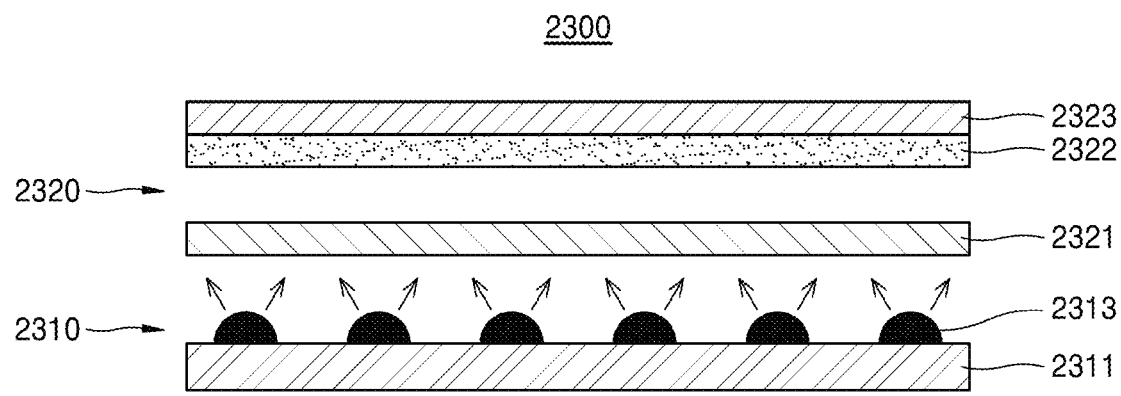
FIG. 25 illustrates a direct type backlight unit including a LED device according to some example embodiments.
Figure 26:
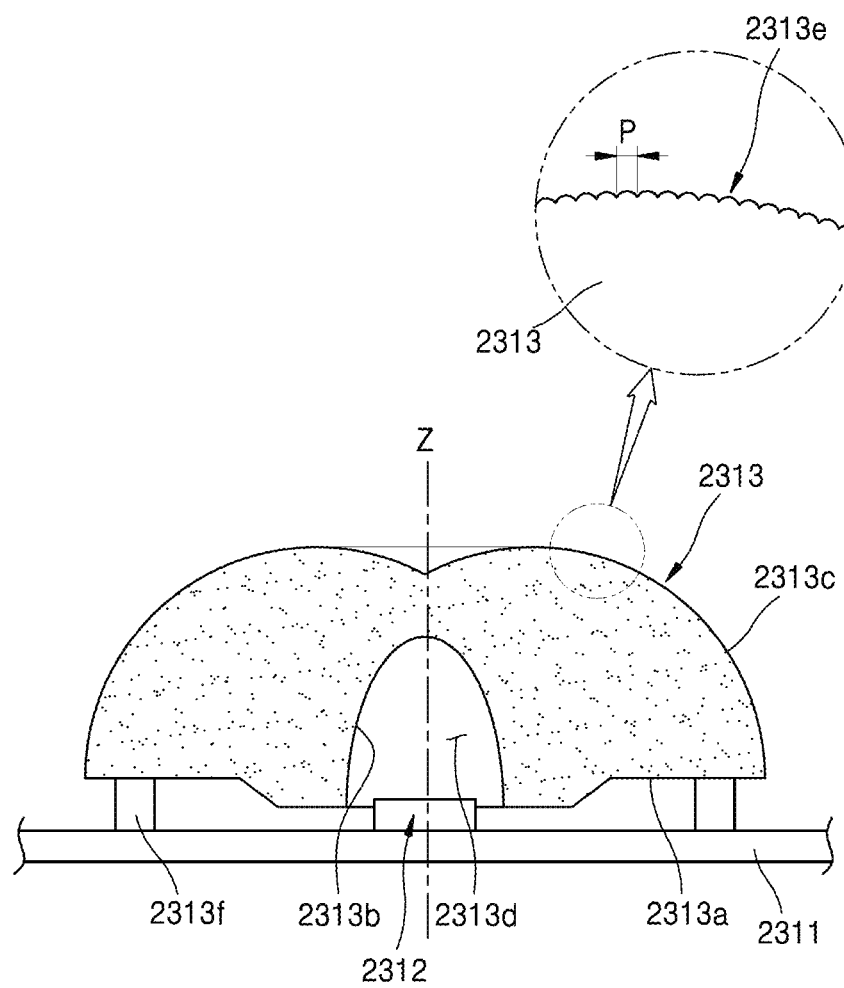
FIG. 26 illustrates a light source module of FIG. 25 in closer detail.

FIG. 25 is a diagram for describing a direct type backlight unit including a LED device according to some example embodiments, and FIG. 26 is a diagram showing a light source module of FIG. 25 in closer detail.

In detail, a backlight unit 2300 according to the present embodiment may include an optical sheet 2320 and a light source module 2310 disposed below the optical sheet 2320. The optical sheet 2320 may include a diffusing sheet 2321, a light focusing sheet 2322, and a protection sheet 2323.

The light source module 2310 may include a printed circuit board 2311, a plurality of light sources 2312 mounted on the printed circuit board 2311, and a plurality of optical devices 2313 respectively disposed on the light sources 2312. The light sources 2312 may include at least any one of the LED devices 100 through 600 according to the above embodiments.

The optical device 2313 may adjust the beam opening angle of light based on refraction. In particular, a lens having a wide beam opening angle for spreading light emitted by the light sources 2312 to a wide area may be utilized. Since the light source 2312 having attached thereto the optical device 2313 exhibits a relatively wide optical distribution, when a light source module including the same is used in a backlight unit or a flat panel illumination apparatus, the number of the light sources 2312 needed for a same area may be reduced.

As shown in FIG. 26, the optical device 2313 may include a bottom surface 2313a contacting the light source 2312, a light incidence surface 2313b via which light is incident thereto, and a light emitting surface 2313c via which light is emitted to outside. The bottom surface 2313a may include a groove 2313d, which is a center portion of the bottom surface 2313a recessed toward the light emitting surface 2313c along the optical axis Z of the light source 2312. A surface of the groove 2313d may be defined as the light incidence surface 2313b via which light emitted by the light source 2312 is incident. In other words, the light incidence surface 2313b may at least partially comprise the surface of the groove 2313d.

The center portion of the bottom surface 2313a connected to the light incidence surface 2313b may partially protrude toward the light source 2312, and thus the bottom surface 2313a may have an overall non-flat structure. In other words, unlike a common flat structure, the bottom surface 2313a may have a structure in which the bottom surface 2313a partially protrude around the groove 2313d. A plurality of supporters 2313f may be disposed on the bottom surface 2313a. If and/or when the optical devices 2313 is mounted on the printed circuit board 2311, the supporters 2313f may fix and support the optical device 2313.

The light emitting surface 2313c protrude upward (light emitting direction) from an edge connected to the bottom surface 2313a to have a dome-like shape, wherein the center portion of the light emitting surface 2313c may be recessed toward the groove 2313d along the optical axis Z to have an inflection point. A plurality of uneven portions 2313e may be periodically disposed on the light emitting surface 2313c in directions from the optical axis Z toward edges. The plurality of uneven portions 2313e may have a ring-like shape corresponding to the horizontal cross-sectional shape of the optical device 2313 and may at least partially comprise a concentric circle around the optical axis Z. furthermore, the plurality of uneven portions 2313e may be disposed to at least partially comprise a periodical pattern along the light emitting surface 2313c and to spread in a radial shape.

The plurality of uneven portions 2313e may be apart from one another at a constant pitch P and at least partially comprise a pattern. In this case, the pitch P between the plurality of uneven portions 2313e may be from about 0.01 mm to about 0.04 mm. The plurality of uneven portions 2313e may compensate differences between performance of the optical devices 2313 due to a fine machining error that may occur during fabrication of the optical devices 2313, thereby improving uniformity of optical distribution.

Figure 27:
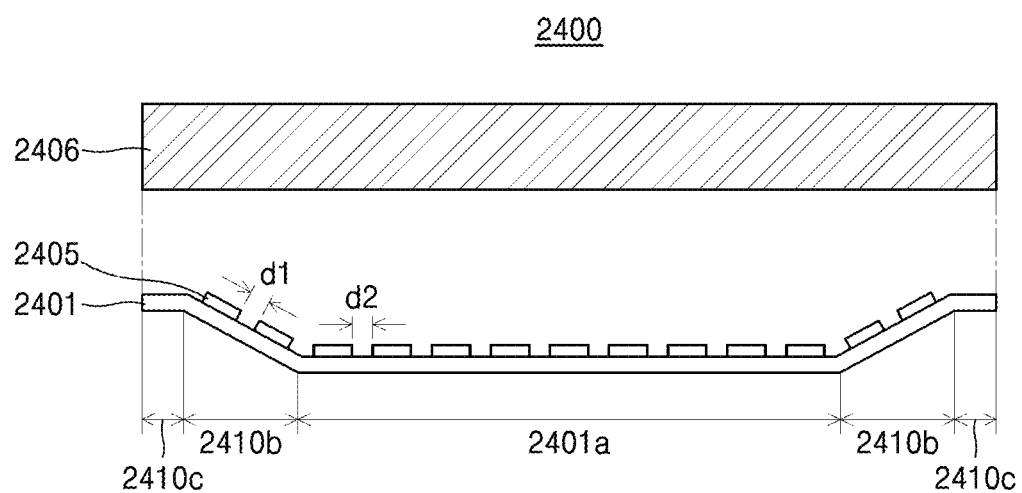
FIG. 27 illustrates a direct type backlight unit including a LED device according to some example embodiments.

FIG. 27 is a diagram for describing a direct type backlight unit including a LED device according to some example embodiments.

In detail, a backlight unit 2400 includes light sources 2405 mounted on a printed circuit board 2401 and includes one or more optical sheets 2406 disposed thereon. The light source 2405 may be a white LED device including a red phosphor. The light sources 2405 may be modules mounted on the printed circuit board 2401. The light sources 2405 may include at least any one of the LED devices 100 through 600 according to the above embodiments.

The printed circuit board 2401 according to the present embodiment may include a first flat surface portion 2401a corresponding to a main area, a sloped portion 2401b that is disposed around the first flat surface portion 2401a and is at least partially bent, and a second flat surface portion 2401c disposed at edges of the printed circuit board 2401 outside the sloped portion 2401b. The light sources 2405 may be disposed on the first flat surface portion 2401a at a first interval d1, whereas the one or more light sources 2405 may be disposed on the sloped portion 2401b at a second interval d2. The first interval d1 may be identical to the second interval d2. The width of the sloped portion 2401b (or a length in a cross-sectional view) may be less than the width of the first flat surface portion 2401a and longer than the width of the second flat surface portion 2401c. Furthermore, as an occasion demands, the at least one light source 2405 may be disposed on the second flat surface portion 2401c.

The slope of the sloped portion 2401b may form an angle greater than 0° and less than 90° with the first flat surface portion 2401a. Due to the structure of the printed circuit board 2401, uniform brightness may be maintained nearby edges of the optical sheet 2406.

Figure 28:
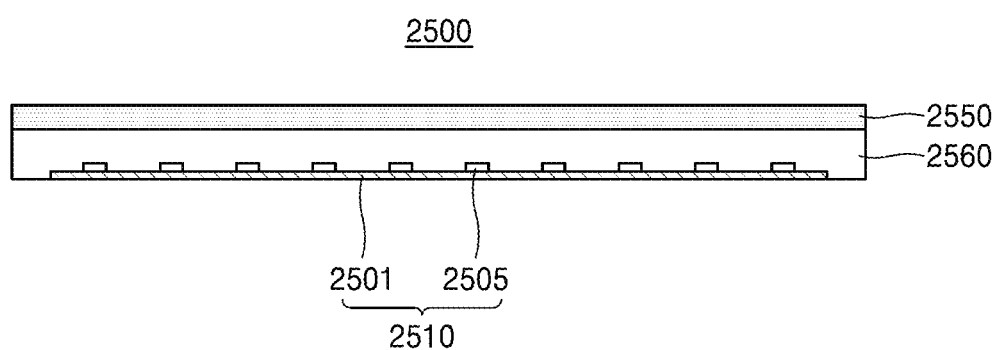
FIG. 28 illustrates a backlight unit including one or more LED devices according to some example embodiments.
Figure 29:
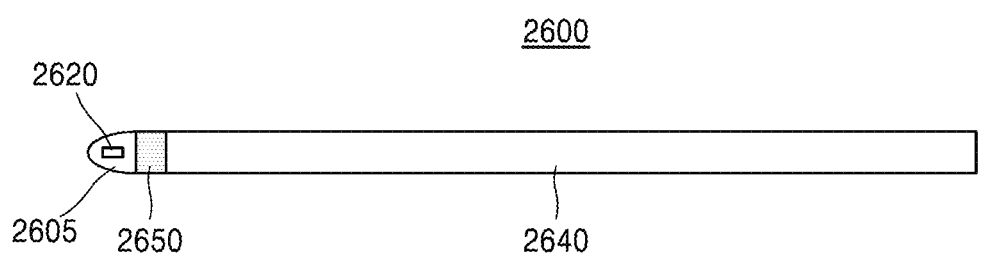
FIG. 29 illustrates a backlight unit including one or more LED devices according to some example embodiments.
Figure 30:
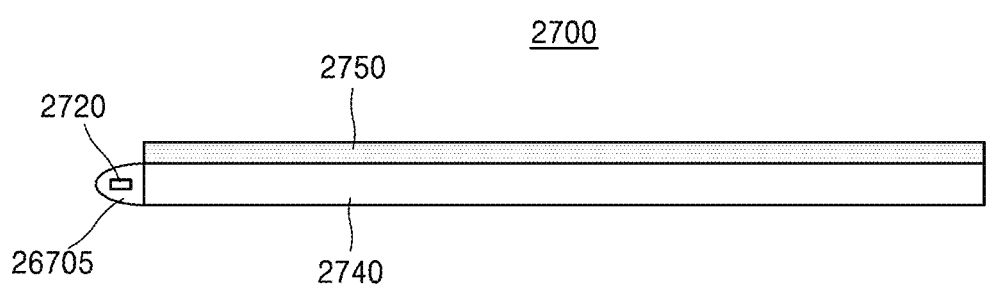
FIG. 30 illustrates a backlight unit including one or more LED devices according to some example embodiments.

FIG. 28, FIG. 29, and FIG. 30 are diagrams for describing backlight units including LED devices according to some example embodiments.

In detail, in backlight units 2500, 2600, and 2700, wavelength transformers 2550, 2650, and 2750 may not be disposed at light sources 2505, 2605, and 2705 and may be disposed outside the light sources 2505, 2605, and 2705 in the backlight units 2500, 2600, and 2700 and transform light. The light sources 2505, 2605, and 2705 may include at least any one of the LED devices 100 through 600 according to the above embodiments.

The backlight unit 2500 is a direct type backlight unit and may include the wavelength transformer 2550, a light source module 2510 disposed below the wavelength transformer 2550, and a bottom case 2560 accommodating the light source module 2510. Furthermore, the light source module 2510 may include a printed circuit board 2501 and a plurality of light sources 2505 mounted on the top surface of the printed circuit board 2501.

In the backlight unit 2500, the wavelength transformer 2550 may be disposed on the bottom case 2560. Therefore, light emitted by the light source module 2510 may be at least partially wavelength-transformed by the wavelength transformer 2550. The wavelength transformer 2550 may be fabricated as a separate film, where the wavelength transformer 2550 may be combined with a light diffusing plate (not shown).

The backlight units 2600 and 2700 are edge type backlight units and may include wavelength transformers 2650 and 2750, light guiding plates 2640 and 2740, reflectors 2620 and 2720 and light sources 2605 and 2705 that are arranged at first sides of the light guiding plates 2640 and 2740. Light emitted by the light sources 2605 and 2705 may be guided into the light guiding plates 2640 and 2740 by the reflectors 2620 and 2720. In the backlight unit 2600, the wavelength transformer 2650 may be disposed between the light guiding plate 2640 and the light source 2605. In the backlight unit 2700, the wavelength transformer 2750 may be disposed on the light emitting surface of the light guiding plate 2740.

The wavelength transformers 2550, 2650, and 2750 may include common phosphors. In particular, in order to compensate vulnerability of quantum dots to heat from a light source or moisture, a quantum dot phosphor may be applied.

Figure 31:
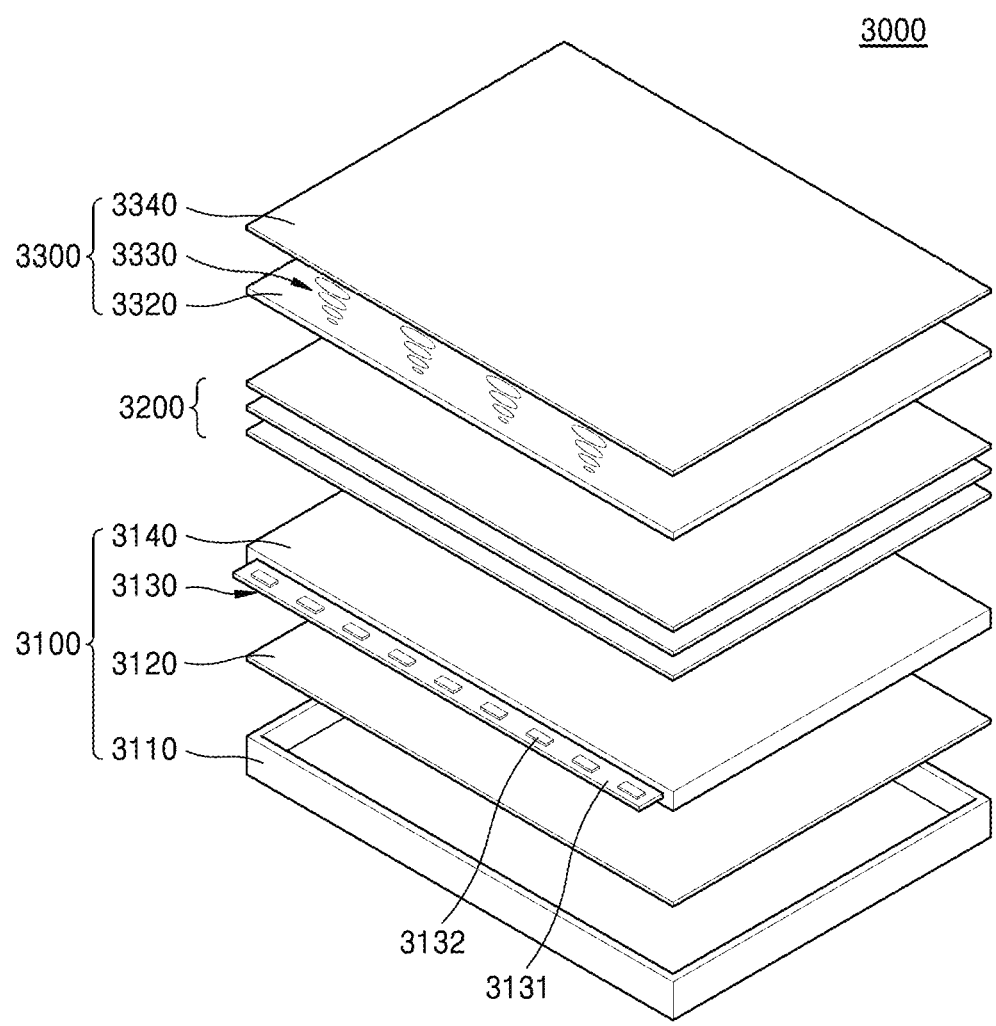
FIG. 31 is an exploded perspective view of a display apparatus including a LED device according to some example embodiments.

FIG. 31 is a schematic exploded perspective view of a display apparatus including a LED device according to some example embodiments.

In detail, a display apparatus 3000 may include a backlight unit 3100, an optical sheet 3200, and an image display panel 3300, such as a LCD panel. The backlight unit 3100 may include a bottom case 3110, a reflective plate 3120, a light guiding plate 3140, and a light source module 3130 provided on at least one surface of the light guiding plate 3140. The light source module 3130 may include a printed circuit board 3131 and light sources 3132.

In particular, the light sources 3132 may be side-view type LED devices mounted on a side surface adjacent to a light-emitting surface. The light sources 3132 may include at least any one of the LED devices 100 through 600 according to the above embodiments. The optical sheet 3200 may be disposed between the light guiding plate 3140 and the image display panel 3300 and may include one of various types of sheets, such as a spreading sheet, a prism sheet, and a protection sheet.

The image display panel 3300 may display an image by using light emitted from the optical sheet 3200. The image display panel 3300 may include an array substrate 3320, a liquid crystal layer 3330, and a color filter substrate 3340. The array substrate 3320 may include pixel electrodes disposed in a matrix-like shape, thin-film transistors that apply driving voltages to the pixel electrodes, and signal lines for operating the thin-film transistors.

The color filter substrate 3340 may include a transparent substrate, a color filter, and a common electrode. The color filter may include filters for selectively transmitting light of particular wavelengths from white light emitted by the backlight unit 3100. The liquid crystal layer 3330 may be rearranged by an electric field formed between the pixel electrodes and the common electrode, thereby adjusting light transmittance. Light of which transmittance is adjusted may pass through the color filter of the color filter substrate 3340, thereby displaying an image. The image display panel 3300 may further include a driving circuit unit for processing image signals.

Since the display apparatus 3000 according to the present embodiment employs the light source 3132 that emit blue light, green light, and red light having relatively small half-widths, light emitted by the light source 3132 may pass through the color filter substrate 3340 and embody blue color, green color, and red color of high color purity.

Figure 32:
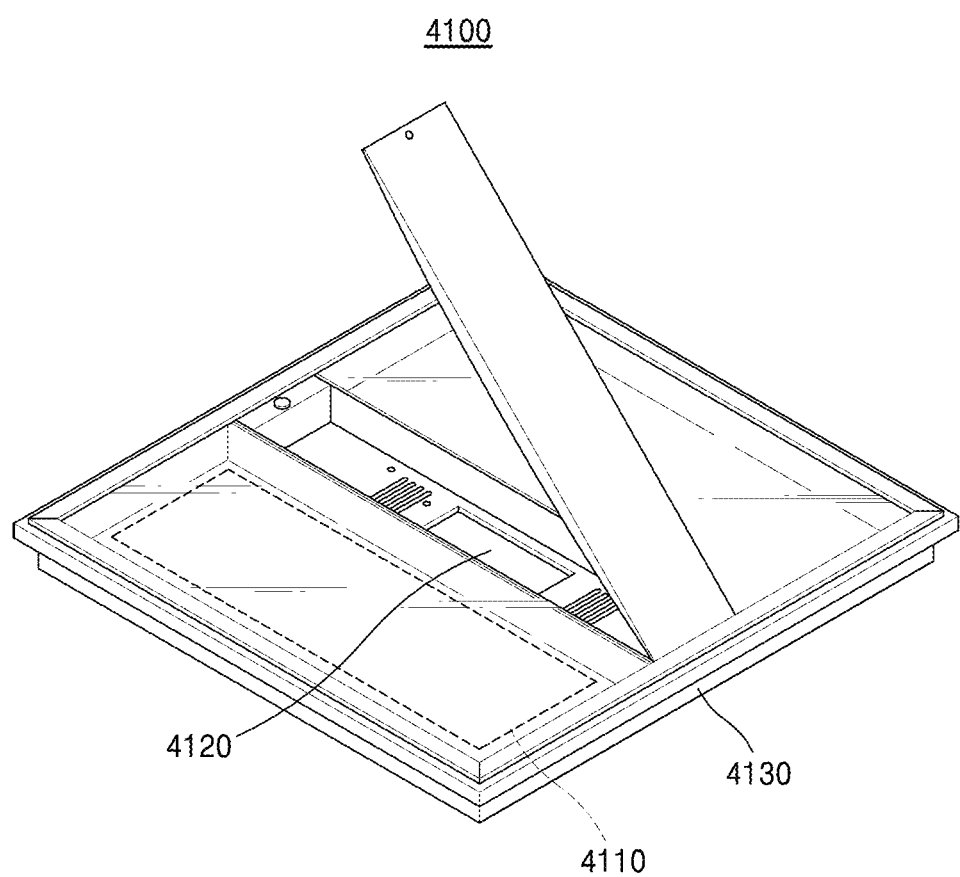
FIG. 32 is a perspective view of a flat-panel illumination apparatus including a LED device according to some example embodiments.

FIG. 32 is a schematic perspective view of a flat-panel illumination apparatus including a LED device according to some example embodiments.

In detail, a flat-panel illumination apparatus 4100 may include a light source module 4110, a power supply unit 4120, and a housing 4130. According to some example embodiments, the light source module 4110 may include a LED device array as a light source. The light source module 4110 may include at least any one of the LED devices 100 through 600 according to the above embodiments as a light source. The power supply unit 4120 may include a LED device driving unit.

The light source module 4110 may include a LED device array and may have an overall flat shape. According to some example embodiments, the LED device array may include LED devices and a controller that stores information for driving the LED devices.

The power supply unit 4120 may be configured to supply power to the light source module 4110. The housing 4130 may form an accommodation space in which the light source module 4110 and the power supply unit 4120 are accommodated and have a hexahedral shape with one open side. However, the inventive concepts are not limited thereto. The light source module 4110 may be disposed to emit light toward the open side of the housing 4130.

Figure 33:
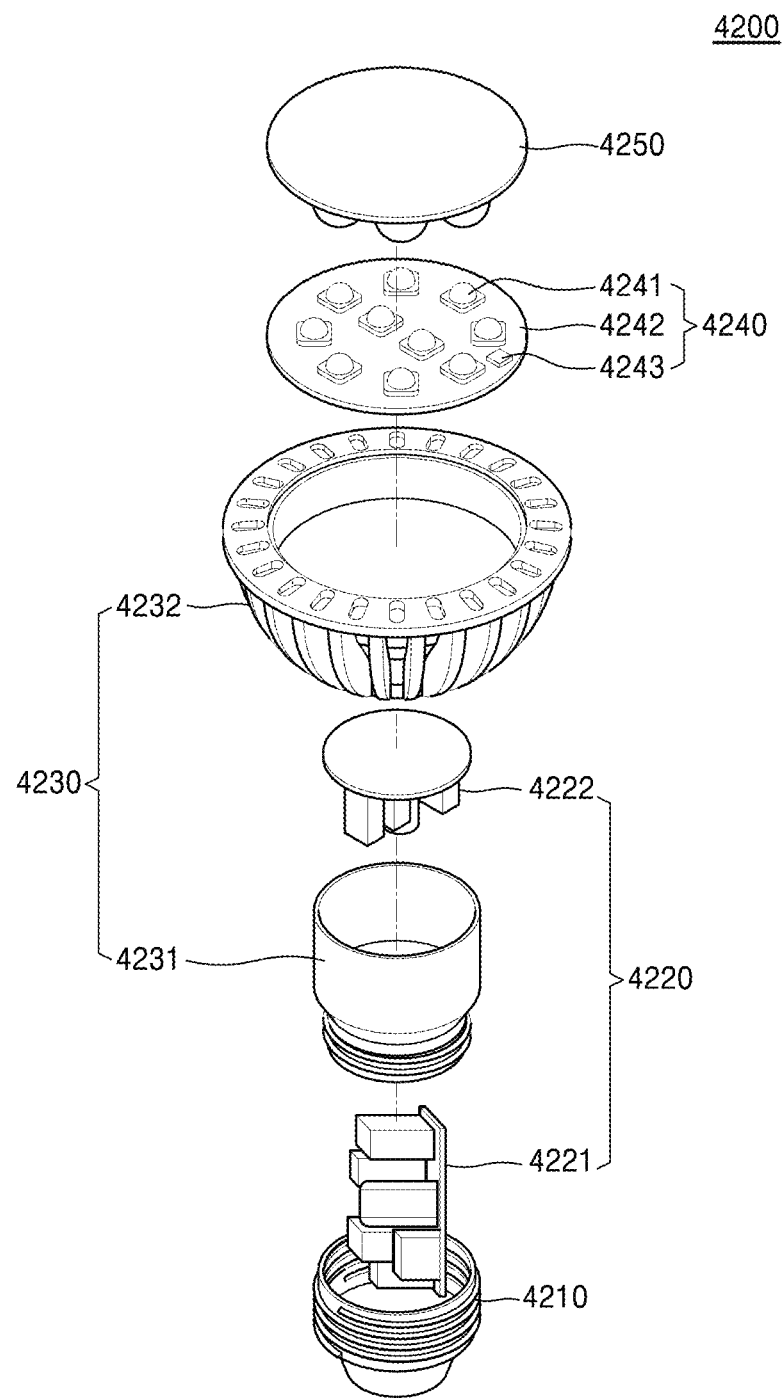
FIG. 33 is an exploded perspective view of an illumination apparatus including a LED device according to some example embodiments.

FIG. 33 is a schematic exploded perspective view of an illumination apparatus including a LED device according to some example embodiments.

In detail, an illumination apparatus 4200 may include a socket 4210, a power supply unit 4220, a heat dissipater 4230, a light source module 4240, and an optical unit 4250. According to some example embodiments, the light source module 4240 may include a LED device array, whereas the power supply unit 4220 may include a LED device driving unit.

The socket 4210 may be configured to replace an existing illumination apparatus. Power supplied to the illumination apparatus 4200 may be applied via the socket 4210. As shown in FIG. 33, the power supply unit 4220 may include a first power supply unit 4221 and a second power supply unit 4222. The heat dissipater 4230 may include an inner heat dissipating unit 4231 and an outer heat dissipating unit 4232. The inner heat dissipating unit 4231 may be directly connected to the light source module 4240 and/or the power supply unit 4220, such that heat is transmitted to the outer heat dissipating unit 4232. The optical unit 4250 may include an inner optical unit (not shown) and an outer optical unit (not shown) and may be configured to uniformly disperse light emitted by the light source module 4240.

The light source module 4240 may receive power from the power supply unit 4220 and emit light toward the optical unit 4250. The light source module 4240 may include one or more LED device packages 4241, a circuit board 4242, and a controller 4243, where the controller 4243 may store information for driving the LED device package 4241. The LED device package 4241 may include at least any one of the LED devices 100 through 600 according to the above embodiments.

Figure 34:
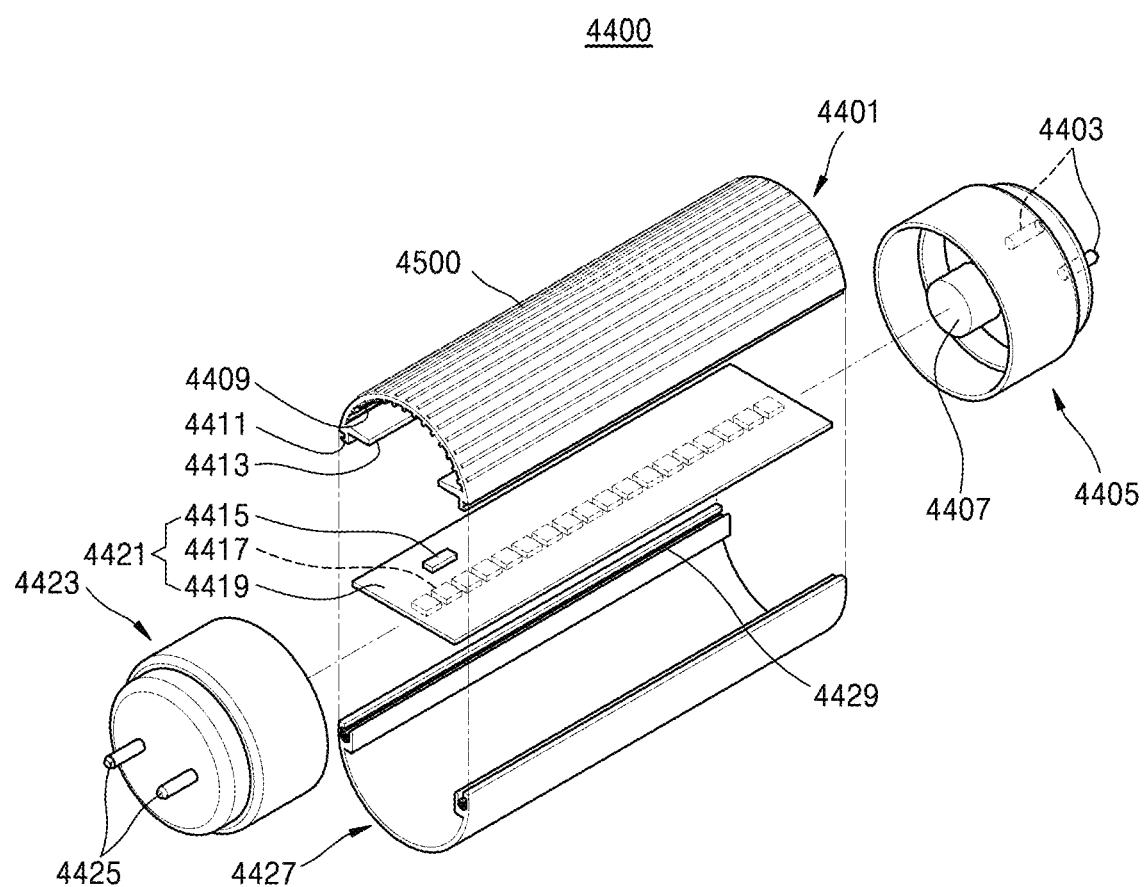
FIG. 34 is a schematic exploded perspective view of a bar-type illumination apparatus including a LED device according to some example embodiments.

FIG. 34 is a schematic exploded perspective view of a bar-type illumination apparatus including a LED device according to some example embodiments.

In detail, an illumination apparatus 4400 includes a heat dissipating unit 4401, a cover 4427, a light source module 4421, a first socket 4405, and a second socket 4423. A plurality of heat dissipating pins 4500 and 4409 may be disposed on the inner surface and/or the outer surface of the heat dissipating unit 4401 as uneven structures, where the heat dissipating pins 4500 and 4409 may be disposed to have one of various shapes at one of various intervals. A protruding supporter 4413 is disposed inside the heat dissipating unit 4401. The light source module 4421 may be fixed by the supporter 4413. Locking hooks 4411 may be disposed at two opposite ends of the heat dissipating unit 4401.

Locking grooves 4429 are disposed at the cover 4427, where the locking hooks 4411 of the heat dissipating unit 4401 may be hook-combined with the locking grooves 4429. Locations of the locking grooves 4429 and the locking hooks 4411 may be reversed.

The light source module 4421 may include a LED device array. The light source module 4421 may include a printed circuit board 4419, light sources 4417, and a controller 4415. The controller 4415 may store information for driving the light source 4417. Circuit wires for driving the light sources 4417 may be disposed on the printed circuit board 4419. Furthermore, the printed circuit board 4419 may include components for driving the light sources 4417. The light sources 4417 may include at least any one of the LED devices 100 through 600 according to the above embodiments.

First and second sockets 4405 and 4423 are a pair of sockets and are attached to two opposite ends of the cylindrical cover unit consisting of the heat dissipating unit 4401 and the cover 4427. For example, the first socket 4405 may include an electrode terminal 4403 and a power supply unit 4407, whereas a dummy terminal 4425 may be disposed at the second socket 4423. Furthermore, an optical sensor and/or a communication module may be embedded to either one of the first socket 4405 or the second socket 4423. For example, an optical sensor and/or a communication module may be embedded to the second socket 4423 including the dummy terminal 4425. In another example, an optical sensor and/or a communication module may be embedded to the first socket 4405 including the electrode terminal 4403.

Figure 35:
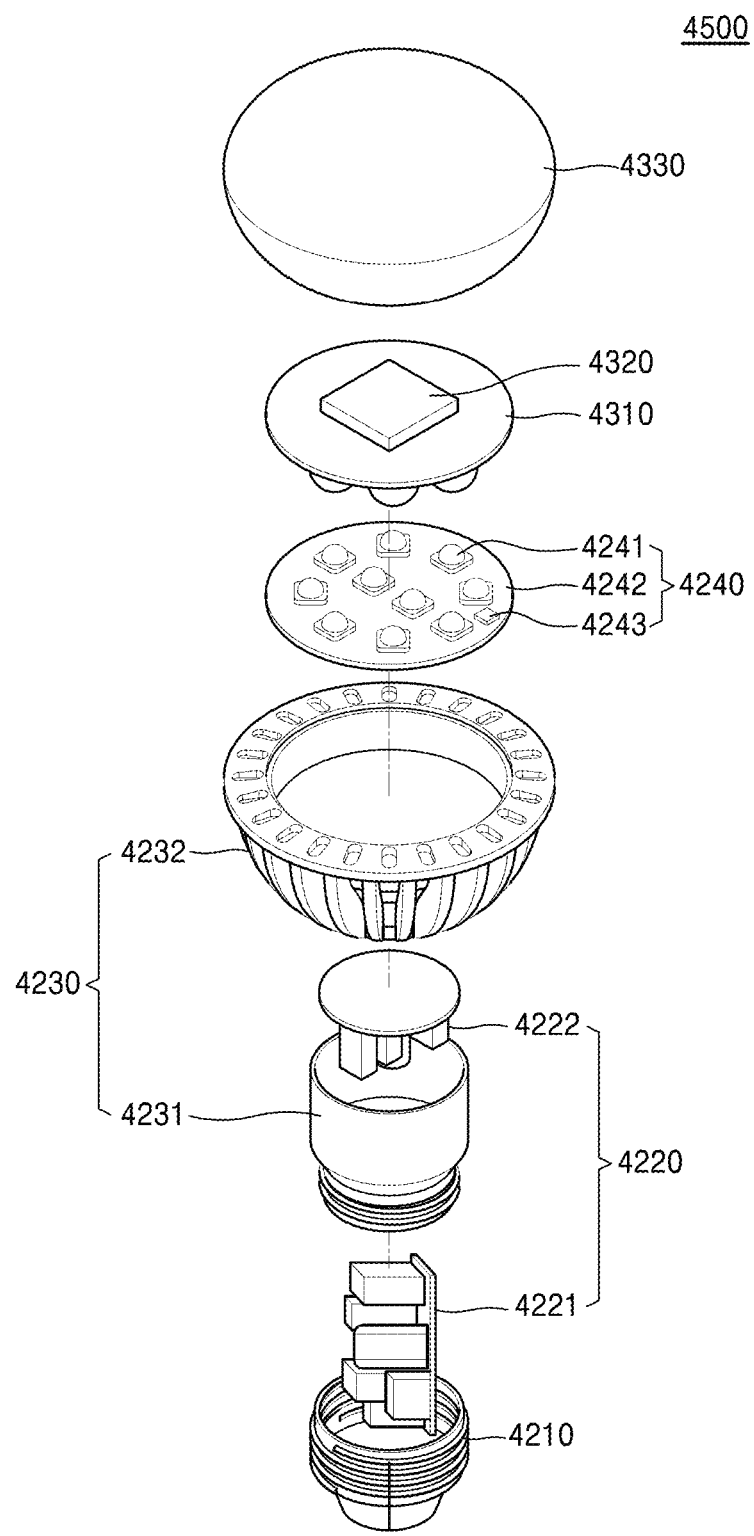
FIG. 35 is a schematic exploded perspective view of a bar-type illumination apparatus including a LED device according to some example embodiments.

FIG. 35 is a schematic exploded perspective view of a bar-type illumination apparatus including a LED device according to some example embodiments.

In detail, a difference between an illumination apparatus 4500 according to the present embodiment and the illumination apparatus 4200 described above is that, in the illumination apparatus 4500, a reflective plate 4310 and a communication module 4320 are disposed above the light source module 4240. The reflective plate 4310 may reduce glare by uniformly dispersing light from a light source sideways and backwards.

The communication module 4320 may be disposed on the reflective plate 4310, where a home network communication may be established via the communication module 4320. For example, the communication module 4320 may be a wireless communication module using Zigbee, Wi-Fi, or LiFi, where an illumination apparatus installed inside or outside a house may be controlled by using a smart phone or a wireless controller (e.g., brightness control). Furthermore, via a LiFi communication module utilizing visible ray wavelengths of the illumination apparatus installed inside or outside a house, electronic devices and automobile system, e.g., a TV, a refrigerator, an air conditioner, a door lock, an automobile, etc., may be controlled. The reflective plate 4310 and the communication module 4320 may be covered by a cover 4330.

Figure 36:
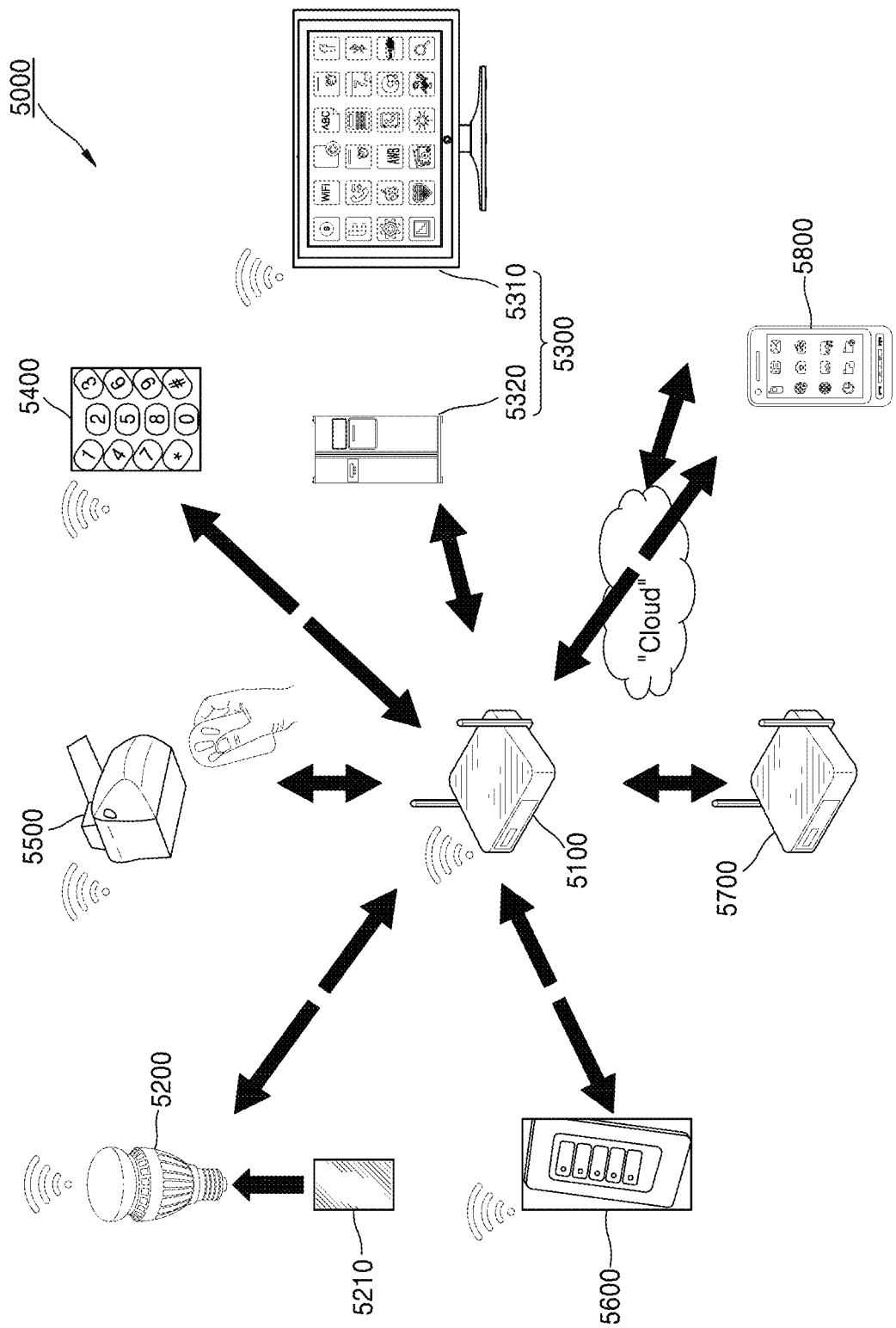
FIG. 36 is a schematic diagram for describing an indoor illumination controlling network system including a LED device according to some example embodiments.

FIG. 36 is a schematic diagram for describing an indoor illumination controlling network system including a LED device according to some example embodiments.

In detail, a network system 5000 may be a composite smart illumination-network system employing an illumination technique using a light-emitting device, such as a LED, an Internet-of-Things (IoT) technique, and wireless communication technique. The network system 5000 may include various illumination apparatuses and wire/wireless communication devices and may be embodied with sensors, controllers, communication devices, and software for controlling and maintaining a network.

The network system 5000 may be used not only in a closed space in a building, such as a home or an office, but also in an open space, such as a park or a street. The network system 5000 may be embodied based on an IoT environment in order to collect and process various pieces of information and provide the information to a user.

A LED lamp 5200 included in the network system 5000 may not only receive information regarding a surrounding environment from a gateway 5100 and adjust brightness of the LED lamp 5200, but also check operation states of other devices 5300 through 5800 included in an IoT environment and control the devices 5300 through 5800. The LED lamp 5200 may include at least any one of the LED devices 100 through 600 according to the above embodiments.

The network system 5000 may include a gateway 5100 for processing data transmitted and received via different communication protocols, the LED lamp 5200 that is communicably connected to the gateway 5100 and includes a LED device, and the plurality of devices 5300 through 5800 that are communicably connected to the gateway 5100 via various wireless communication protocols. To embody the network system 5000 based on an IoT environment, each of the LED lamp 5200 and the devices 5300 through 5800 may include at least one communication module. For example, the LED lamp 5200 may be communicably connected to the gateway 5100 via a wireless communication protocol, such as WiFi, Zigbee, and LiFi. To this end, the LED lamp 5200 may include at least one lamp communication module 5210.

The network system 5000 may be applied not only to a closed space, such as a home or an office, but also to an open space, such as a park or a street. If and/or when the network system 5000 is applied to a home, the plurality of devices 5300 through 5800 that are included in the network system 5000 and are communicably connected to the gateway 5100 based on an IoT technique may include a household appliance 5300, a digital door lock 5400, a garage door lock 5500, an illumination switch 5600 installed on a location like a wall, a router 5700 for routing wireless communications, and a mobile device 5800, such as a smart phone, a tablet PC, and a laptop computer.

In the network system 5000, the LED lamp 5200 may check operation states of the various devices 5300 through 5800 or automatically adjust brightness of the LED lamp 5200 based on a surrounding environment/circumstance, via a wireless communication network (e.g., Zigbee, WiFi, LiFi, etc.) installed in a home. Furthermore, the LED lamp 5200 may control the devices 5300 through 5800 included in the network system 5000 via a LiFi communication using visible rays emitted by the LED lamp 5200.

First. The LED lamp 5200 may automatically adjust brightness of the LED lamp 5200 based on information regarding a surrounding environment that is transmitted from the gateway 5100 via the lamp communication module 5210 or collected by a sensor included in the LED lamp 5200. For example, brightness of the LED lamp 5200 may be automatically adjusted based on type of a program displayed on a television 5310 or screen brightness of the television 5310. To this end, the LED lamp 5200 may receive operation information regarding the television 5310 from the lamp communication module 5210 connected to the gateway 5100. The lamp communication module 5210 may be combined with a sensor and/or a controller included in the LED lamp 5200.

For example, when a program displayed by the television 5310 is a human drama, brightness of illumination may be adjusted based on a pre-set value. For example, the color temperature of the illumination may be lowered to a color temperature below or equal to 12000K (e.g., 5000K) and color balance may be adjusted, and thus a cozy atmosphere may be created. Meanwhile, when a program displayed by the television 5310 is a comedy program, the color temperature of the illumination may be increased to above 5000K and color balance may be adjusted to bluish white illumination, based on a pre-set value.

Furthermore, when there is no person at home and a certain time is elapsed after the digital door lock 5400 is locked, the turned ON LED lamp 5200 may be turned OFF to prevent electricity waste. Alternatively, when there is no person at home, a security mode is set via the mobile device 5800, and the digital door lock 5400 is locked, the LED lamp 5200 may be maintained ON.

An operation of the LED lamp 5200 may be controlled based on information regarding surrounding environments collected by various sensors connected to the network system 5000. For example, if the network system 5000 is established in a building, illuminations, location sensors, and communication modules may be combined with one another inside the building, information regarding locations of people inside the building may be collected, and illuminations may be turned ON or OFF or the collected information may be provided in real time for efficient facility management or efficient utilization of unused spaces. Since illumination apparatuses, such as the LED lamp 5200, are disposed in almost all spaces of floors of a building, various information inside the building may be collected via sensors combined with the LED lamps 5200 and utilized for facility management or utilization of unused spaces.

Meanwhile, an image sensor, a storage device, and the lamp communication module 5210 may be combined with the LED lamp 5200 and may be utilized as a device for maintaining security of a building or detecting and handling an emergency situation. For example, when a smoke detector or a temperature sensor is attached to the LED lamp 5200, an event like outbreak of fire may be quickly detected to minimize damages. Furthermore, brightness of illumination may be adjusted by taking outside weather or an amount of sunshine into account, thereby reducing energy consumption and providing a comfortable illumination environment.

As described above, the network system 5000 may be applied not only to a closed space, such as a home or an office, but also to an open space, such as a park or a street. In case of applying the network system 5000 to an open space without a physical limit, it may be relatively difficult to embody the network system 5000 due to factors including a distance limit of a wireless communication and communication interference due to obstacles. By attaching a sensor and a communication module to each of the illumination apparatuses and utilizing each of the illumination apparatuses as an information collecting unit and a communication relaying unit, the network system 5000 may be efficiently established in an open environment as described above.

Figure 37:
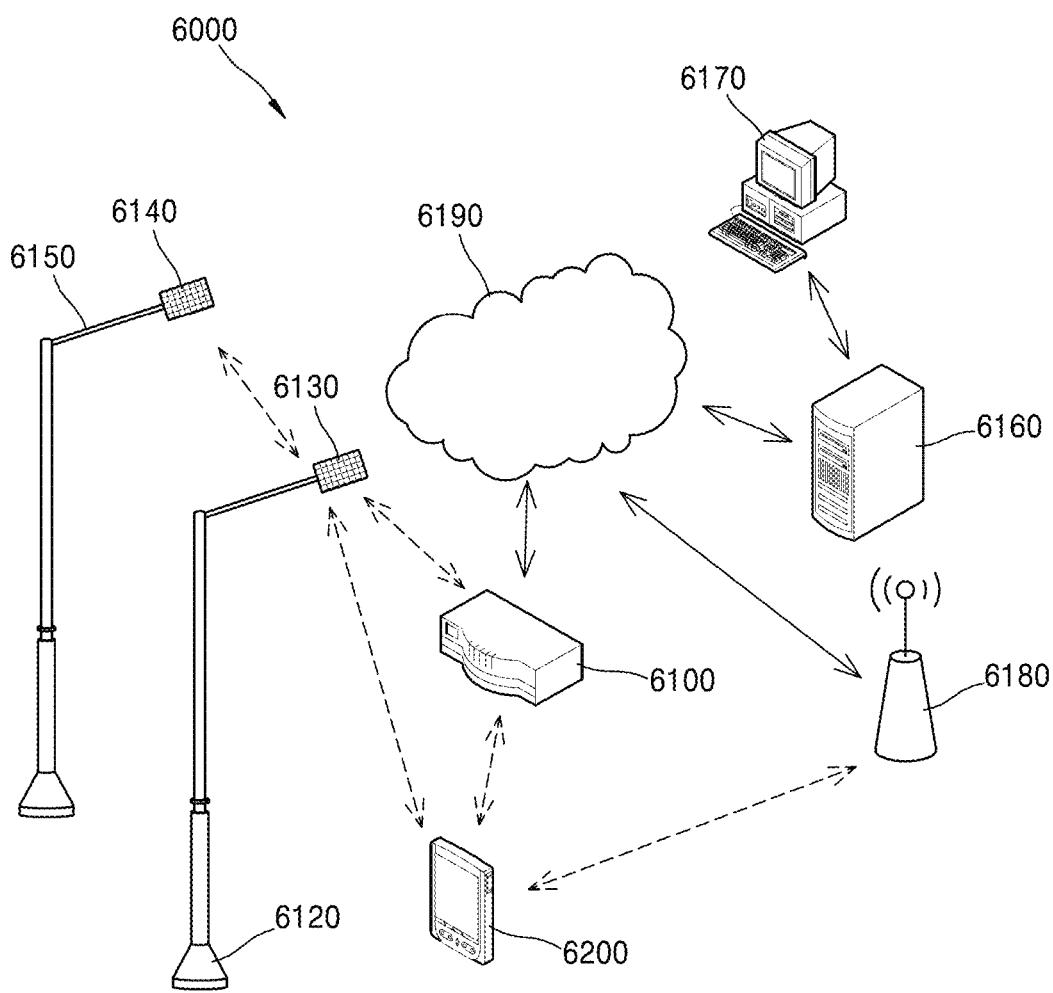
FIG. 37 is a schematic diagram for describing a network system including a LED device according to some example embodiments.

FIG. 37 is a schematic diagram for describing a network system including a LED device according to some example embodiments.

In detail, FIG. 37 shows a network system 6000 applied to an open space. The network system 6000 may include a communication connecting device 6100, a plurality of illumination apparatuses 6120 and 6150 that are installed at a certain interval and are communicably connected to the communication connecting device 6100, a server 6160, a computer 6170 for managing the server 6160, a communication station 6180, a communication network 6190 for interconnecting communicable devices, and a mobile device 6200.

The plurality of illumination apparatuses 6120 and 6150 installed at an open outdoor space, such as a street or a park, may include smart engines 6130 and 6140, respectively.

Each of the smart engines 6130 and 6140 may include not only a LED device for emitting light and a driver for driving the LED device, but also a sensor for collecting information regarding a surrounding environment and a communication module. A LED device included in a smart engine may include at least any one of the LED devices 100 through 600 according to the above embodiments.

Via the communication module, the smart engines 6130 and 6140 may communicate with other equipment via a communication protocol, such as Wi-Fi, Zigbee, LiFi, etc.

For example, the smart engine 6130 may be communicably connected to the smart engine 6140. Here, a Wi-Fi Mesh technique may be applied to a communication between the smart engines 6130 and 6140. The at least one smart engine 6130 may be connected to the communication connecting device 6100, which is connected to the communication network 6190, via a wire/wireless communication. For improved communication efficiency, the plurality of smart engines 6130 and 6140 may be grouped into a single group and connected to the single communication connecting device 6100.

The communication connecting device 6100 is an access point capable of performing wire/wireless communications and may relay a communication between the communication network 6190 and other equipment. The communication connecting device 6100 may be connected to the communication network 6190 via at least one of a wire communication and a wireless communication. For example, the communication connecting device 6100 may be accommodated inside either one of the illumination apparatuses 6120 and 6150.

The communication connecting device 6100 may be connected to the mobile device 6200 via a communication protocol, such as Wi-Fi. A user of the mobile device 6200 may receive information regarding a surrounding environment collected by the plurality of smart engines 6130 and 6140 via the communication connecting device 6100 connected to the smart engine 6130 of the adjacent illumination apparatus 6120. The information regarding a surrounding environment may include local traffic information and weather information, for example. The mobile device 6200 may also be connected to the communication network 6190 via the communication station 6180 according to a wireless cellular communication protocol (e.g., a 3G communication or a 4G communication).

Meanwhile, the server 6160 connected to the communication network 6190 receives information collected by the smart engines 6130 and 6140 respectively attached to the illumination apparatuses 6120 and 6150 and monitor operation states of the respective illumination apparatuses 6120 and 6150 simultaneously. To manage the illumination apparatuses 6120 and 6150 based on a result of monitoring operating states of the illumination apparatuses 6120 and 6150, the server 6160 may be connected to the computer 6170 providing a management system. The server 6160 may execute software for monitoring operation states of the respective illumination apparatuses 6120 and 6150 (particularly, the smart engines 6130 and 6140) and managing the same.

Figure 38:
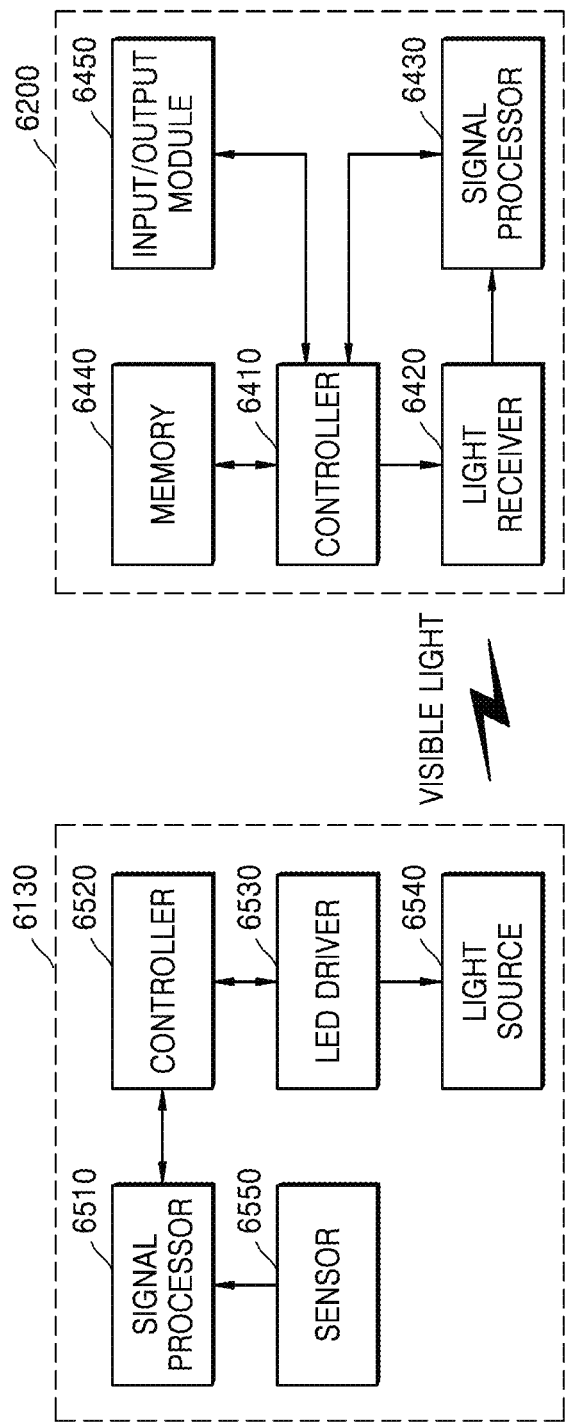
FIG. 38 is a block diagram for describing a communication operation between a smart engine of an illumination apparatus including a LED device according to some example embodiments and a mobile device.

FIG. 38 is a block diagram for describing a communication operation between a smart engine of an illumination apparatus including a LED device according to some example embodiments and a mobile device.

In detail, FIG. 38 is a block diagram for describing a communication operation between the smart engine 6130 of the illumination apparatus 6120 (FIG. 41) and the mobile device 6200 via a visible ray wireless communication. Various communication protocols may be applied for transferring information collected by the smart engine 6130 to the mobile device 6200 of a user.

Via the communication connecting device 6100 (FIG. 40) connected to the smart engine 6130, information collected by the smart engine 6130 may be transmitted to the mobile device 6200 or the smart engine 6130 and the mobile device 6200 may be directly and communicably connected to each other. The smart engine 6130 and the mobile device 6200 may communicate with each other via a visible ray wireless communication (LiFi).

The smart engine 6130 may include a signal processor 6510, a controller 6520, a LED driver 6530, a light source 6540, and a sensor 6550. The mobile device 6200 connected to the smart engine 6130 via a visible ray wireless communication may include a controller 6410, a light receiver 6420, a signal processor 6430, a memory 6440, and an input/output unit 6450.

The visible ray wireless communication (LiFi) is a wireless communication technique for wirelessly transmitting data by using light of a wavelength band corresponding to visible rays that may be recognized by the human eyes. Unlike a wire optical communication technique and an infrared ray wireless communication technique in the related art, the visible ray wireless communication uses light of a wavelength band corresponding to visible rays, that is, particular visible ray frequencies from a light-emitting package according to the above-stated embodiment, and thus the visible ray wireless communication is distinguished from the wire optical communication technique. Furthermore, unlike a RF wireless communication technique, the visible ray wireless communication may be freely used without a restriction or an authorization for using frequencies, exhibits excellent physical security, and allows a user to visibly recognize a communication link. Furthermore, the original function as a light source and a communication function may be achieved at the same time.

The signal processor 6510 of the smart engine 6130 may process data to be transmitted or received via a visible ray wireless communication. According to some example embodiments, the signal processor 6510 may process information collected by the sensor 6550 to data and transmit the data to the controller 6520. The controller 6520 may control operations of the signal processor 6510 and the LED driver 6530. In particular, the controller 6520 may control an operation of the LED driver 6530 based on data transmitted by the signal processor 6510. The LED driver 6530 makes the light source 6540 to emit light according to a control signal received from the controller 6520, thereby transmitting data to the mobile device 6200.

The mobile device 6200 may further include the light receiver 6420 for recognizing a visible ray including data, other than the controller 6410, the memory 6440 that stores data, the input/output unit 6450 that includes a display, a touch screen, and an audio output unit, the signal processor 6430. The light receiver 6420 may detect a visible ray and transform the visible ray to an electric signal, where the signal processor 6430 may decode data included in the electric signal transformed by the light receiver 6420. The controller 6410 may store data decoded by the signal processor 6430 in the memory 6440 or output data via the input/output unit 6450 to be recognized by a user.

Figure 39:
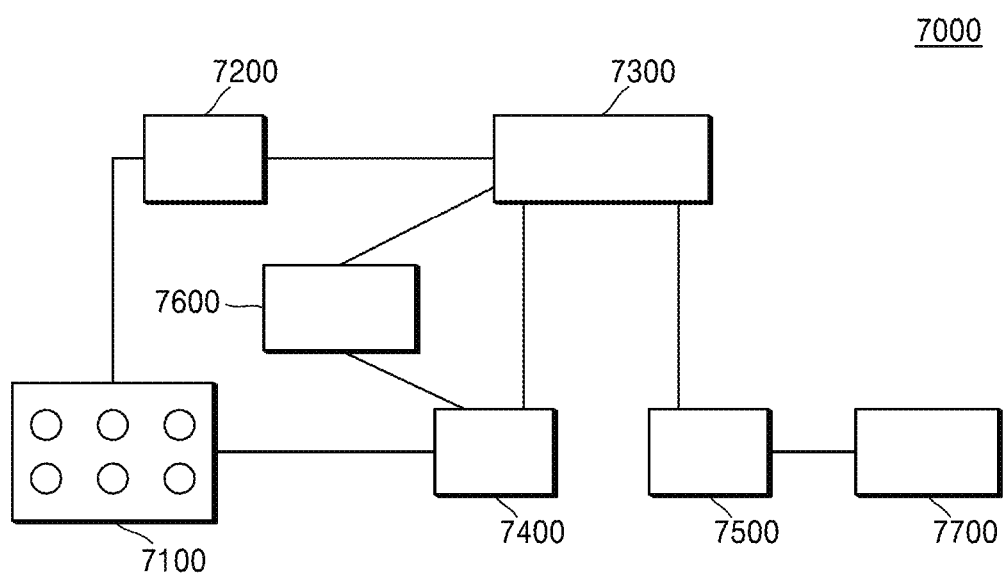
FIG. 39 is a schematic diagram of a smart illumination system including a LED device according to some example embodiments.

FIG. 39 is a schematic view of a smart illumination system including a LED device according to some example embodiments.

In detail, the smart illumination system 7000 may include an illumination unit 7100, a sensor 7200, a server 7300, a wireless communicator 7400, a controller 7500, and a data storage 7600. The illumination unit 7100 includes one or a plurality of illumination apparatuses inside a building, where types of the illumination apparatuses are not limited. For example, the illumination unit 7100 may include a basic illumination apparatus, a mood illumination apparatus, a stand-type illumination apparatus, and a decorative illumination apparatus for a living room, a room, a balcony, a kitchen, a bathroom, a stairway, and an entrance door. The illumination apparatus may include at least any one of the LED devices 100 through 600 according to the above embodiments.

The sensor 7200 is a unit that detects illumination state including turn-ON, turn-OFF, and light intensity of each illumination apparatus, outputs a signal based on the illumination state, and transmits the signal to the server 7300. The sensor 7200 may be disposed inside a building in which illumination apparatuses are installed, where one or plurality of sensors 7200 may be disposed at a location where illumination states of all illumination apparatuses controlled under the smart illumination system 7000 may be detected or each illumination apparatus may include the sensor 7200.

The information regarding illumination states may be transmitted to the server 7300 in real time or may be transmitted to the server 7300 at a certain time interval, e.g., minutes, hours, etc. The server 7300 may be installed inside and/or outside the building, receive a signal from the sensor 7200, collect information regarding illumination states including turn-ON and turn-OFF of the illumination unit 7100 inside the building, group collected information, defines an illumination pattern based on the grouped information, and provide information regarding the defined pattern to the wireless communicator 7400. Furthermore, the server 7300 may transmit a command received from the wireless communicator 7400 to the controller 7500.

In detail, the server 7300 may receive a signal transmitted by the sensor 7200 based on detected illumination states inside a building, collect information regarding the illumination states, and analyze the information. For example, the server 7300 may categorize collected information into various time period groups corresponding to hours, days, days of the week, weekdays and weekends, particular dates, weeks, months, etc. Next, based on information categorized into a plurality of groups, the server 7300 programs a 'defined illumination pattern' that is defined as an average daily, weekly, weekday, weekend, or monthly illumination pattern. The 'defined illumination pattern' may be periodically provided to the wireless communicator 7400 or may be provided when a user requests information regarding an illumination pattern.

Furthermore, the server 7300 may not only define an illumination pattern based on information regarding illumination states provided by the sensor 7200, but also provide a 'normal illumination pattern' that is programmed in advance by reflecting normal illumination states at home to the wireless communicator 7400. Same as the 'defined illumination pattern,' the 'normal illumination pattern' may be periodically provided by the server 7300 or may be provided per user request. Although FIG. 43 shows the number of the server 7300 is one, two or more servers may be provided as an occasion demands. Optionally, the 'normal illumination pattern' and/or the 'defined illumination pattern' may be stored in the data storage 7600. The data storage 7600 may be a so-called cloud storage device, which is a storage device that may be accessed via a network.

The wireless communicator 7400 is a unit that selects one of a plurality of illumination patterns provided by the server 7300 and/or the data storage 7600 and transmits a command for executing and stopping an 'automatic illumination mode' to the server 7300 and may be one of various wireless-communicable devices that may be carried by a user using a smart illumination system, e.g., a smart phone, a table PC, a PDA, a laptop PC, a netbook, etc.

In detail, the wireless communicator 7400 may receive various defined illumination patterns from the server 7300 and/or the data storage 7600, select a desired illumination pattern from the received illumination patterns, and transmit a command signal to the server 7300 in order to execute an 'automatic illumination mode' for operating the illumination unit 7100 according to the selected illumination pattern. The command signal may be transmitted with a set execution time. Alternatively, the command signal may be transmitted without a set end time and, when it is necessary, a stop signal may be transmitted to stop execution of the 'automatic illumination mode.'

Furthermore, the wireless communicator 7400 may further include a function enabling a user to partially modify an illumination pattern provided by the server 7300 and/or the data storage 7600 or to define a new illumination pattern. A modified or newly defined 'user set illumination pattern' may be first stored in the wireless communicator 7400 and may be transmitted to the server 7300 and/or the data storage 7600 automatically or per user request. Furthermore, the wireless communicator 7400 may receive a 'defined illumination pattern' defined by the server 7300 and a 'normal illumination pattern' from the server 7300 and/or the data storage 7600 automatically or by transmitting a request signal to the server 7300.

As described above, the wireless communicator 7400 may exchange necessary commands or necessary data signals with the server 7300 and/or the data storage 7600, and the server 7300 may intervene in the exchange of commands and data signals among the wireless communicator 7400, the sensor 7200, and the controller 7500, thereby operating a smart illumination system according to some example embodiments.

The wireless communicator 7400 may be operated in conjunction with the server 7300 may be performed via an application, which is an application program for a smart phone, for example. In other words, a user may instruct a server to execute an 'automatic illumination mode' or provide information regarding a 'user set illumination pattern' defined or modified by the user to the server, via an application downloaded to a smart phone.

Information may be provided to the server 7300 and/or the data storage 7600 automatically as a stored 'user set illumination pattern' or according to an operation for storing information. The transmission rule may be set as the default rule of an application or may be selected by a user.

The controller 7500 is a unit that controls one or a plurality of illumination apparatuses by receiving a command signal for executing and stopping an 'automatic illumination mode' from the server 7300 and operating the illumination unit 7100 according to the command signal. In other words, the controller 7500 may turn ON/OFF or control otherwise each illumination apparatus included in the illumination unit 7100 according to a command from the server 7300.

Furthermore, the smart illumination system 7000 may further include an alarm device 7700 inside a building. The alarm device 7700 is a device for provide a warning when there is an intruder in the building.

In detail, when a user is not available, if an 'automatic illumination mode' is being executed in a building and a set illumination pattern is disrupted by an intruder inside the building, the sensor 7200 may detect the disruption and transmits a warning signal to the server 7300, and the server 7300 may notify the wireless communicator 7400 and transmit a signal to the controller 7500 to operate the alarm device 7700 inside the building.

Furthermore, a system in which the server 7300 directly notifying an emergency to a security agency via the wireless communicator 7400 or a TCP/IP network when the warning signal is transmitted to the server 7300 may be further included.

According to some example embodiments of the inventive concepts, a LED device may include a plurality of light-emitting cells and a partition layer that defines the light-emitting cells. Therefore, a LED device according to some example embodiments may include a plurality of light-emitting cells for embodying multi-colors and may include a partition layer to suppress optical interferences between the light-emitting cells.

If and/or when a plurality of light-emitting cells of a LED device according to some example embodiments are used as independent pixels in a display apparatus and a partition layer is disposed between the pixels, the display apparatus may easily embody higher resolution with a reduced size and it is easy to suppress optical interferences between the pixels.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:
1. A light-emitting diode (LED) device comprising:
a plurality of light-emitting structures spaced apart from each other, each light-emitting structure including a first surface and a second surface;
a plurality of electrode layers on first surfaces of separate, respective light-emitting structures of the plurality of light-emitting structures;
a separation layer configured to isolate the plurality of light-emitting structures from each other;
a plurality of wavelength transformers on second surfaces of separate, respective light-emitting structures of the plurality of light-emitting structures; and
a partition layer between the wavelength transformers, such that the partition layer separates the wavelength transformers from each other.

2. The LED device of claim 1, further comprising:
a reflective layer between an electrode layer, of the plurality of electrode layers, and a light-emitting structure, of the plurality of light-emitting structures.

3. The LED device of claim 1, further comprising:
an uneven structure on a surface of a light-emitting structure, of the plurality of light-emitting structures.

4. The LED device of claim 1, wherein the partition layer includes one or more sidewalls associated with a slope, such that the one or more sidewalls define a space having a distal end and proximate end in relation to at least one light-emitting structure of the plurality of light-emitting structures, the distal end having a greater diameter than the proximate end.

5. The LED device of claim 1, wherein the partition layer includes a single body structure.

6. The LED device of claim 1, further comprising:
a light reflecting layer on a sidewall of the partition layer.

7. The LED device of claim 1, wherein the separation layer includes,
a separating insulation layer on first sidewalls and bottom surfaces of the light-emitting structures, and
a mold insulation layer configured to insulate the electrode layers from each other, respectively, and
insulate the light-emitting structures from each other, respectively.

8. The LED device of claim 7, wherein a bottom surface of the mold insulation layer is flush with the bottom surfaces of the electrode layers.

9. The LED device of claim 1, wherein the separation layer includes,
a separating insulation layer on first sidewalls and bottom surfaces of the light-emitting structures,
a metal layer insulated from the light-emitting structures by the separating insulation layer, and
a mold insulation layer configured to insulate the electrode layers from the metal layer.

10. The LED device of claim 1, wherein,
the separation layer includes,
a first separating insulation layer on first sidewalls and bottom surfaces of the light-emitting structures,
a first metal layer insulated from the light-emitting structures by the first separating insulation layer, and
a mold insulation layer insulating the electrode layers from one another; and
the partition layer includes,
a second separating insulation layer on first sidewalls of the plurality of wavelength transformers, the second separating insulation layer extending from the first separating insulation layer, and
a second metal layer on the first sidewalls of the plurality of wavelength transformers, the second metal layer extending from the first metal layer.

11. The LED device of claim 1, wherein the partition layer overlaps at least a portion of the plurality of light-emitting structures.

12. The LED device of claim 1, wherein the separation layer covers the first surface of each of the plurality of light-emitting structures.

13. The LED device of claim 1, wherein the partition layer includes at least one of a substrate structure, an insulation structure, and a light reflecting structure.

14. A light-emitting diode (LED) device comprising:
a plurality of light-emitting structures spaced apart from each other, each light-emitting structure including a first surface and a second surface;
a plurality of electrode layers on first surfaces of the plurality of light-emitting structures;
a separation layer configured to isolate the plurality of light-emitting structures from each other;
a plurality of wavelength transformers including quantum dots on second surfaces of separate, respective light-emitting structures of the plurality of light-emitting structures, the quantum dots including a group III-V compound semiconductor or a group II-VI compound semiconductor having a core-shell structure comprising a core and a shell, the core having a diameter between 1 nm and 30 nm, the shell having a thickness between 0.1 nm and 20 nm; and
a partition layer between the wavelength transformers, such that the partition layer separates the wavelength transformers from each other.

15. The LED device of claim 14, wherein
the core includes CdSe or InP, and
the shell includes ZnS or ZnSe.

16. The LED device of claim 14, wherein the core has a diameter between 3 nm and 10 nm.

17. The LED device of claim 14, wherein the shell has a thickness between 0.5 nm and 2 nm.

18. The LED device of claim 14, wherein the wavelength transformers include quantum dots mixed with phosphor.

19. The LED device of claim 14, further comprising:
a reflective layer between an electrode layer, of the plurality of electrode layers, and a light-emitting structure, of the plurality of light-emitting structures, and
an uneven structure on a surface of the light-emitting structure, of the plurality of light-emitting structures.

20. A light-emitting diode (LED) device comprising:
a plurality of light-emitting structures spaced apart from each other, each light-emitting structure including a first surface and a second surface;
a plurality of electrode layers on first surfaces of the plurality of light-emitting structures;
a separation layer configured to isolate the plurality of light-emitting structures from each other;
a plurality of wavelength transformers including quantum dots on second surfaces of separate, respective light-emitting structures of the plurality of light-emitting structures; and
a partition layer between the wavelength transformers, such that the partition layer separates the wavelength transformers from each other.

* * * * *